United States Patent
Wada

(10) Patent No.: US 7,691,558 B2
(45) Date of Patent: Apr. 6, 2010

(54) PHOTOSENSITIVE COMPOSITION, COMPOUND FOR USE IN THE PHOTOSENSITIVE COMPOSITION AND PATTERN FORMING METHOD USING THE PHOTOSENSITIVE COMPOSITION

(75) Inventor: Kenji Wada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 263 days.

(21) Appl. No.: 11/335,679

(22) Filed: Jan. 20, 2006

(65) Prior Publication Data

US 2006/0166135 A1 Jul. 27, 2006

(30) Foreign Application Priority Data

Jan. 24, 2005 (JP) ............... P. 2005-015965

(51) Int. Cl.
G03F 7/00 (2006.01)
G03F 7/004 (2006.01)
(52) U.S. Cl. ............... 430/270.1; 430/281.1; 430/311
(58) Field of Classification Search ............ 430/270.1, 430/311, 281.1
See application file for complete search history.

(56) References Cited

U.S. PATENT DOCUMENTS

| | | | | |
|---|---|---|---|---|
| 5,101,053 | A * | 3/1992 | Boettcher | 556/64 |
| 6,007,819 | A | 12/1999 | Taub et al. | |
| 6,159,657 | A | 12/2000 | Fleming et al. | |
| 6,395,451 | B1 | 5/2002 | Jung et al. | |
| 6,849,374 | B2 | 2/2005 | Cameron et al. | |
| 6,855,476 | B2 | 2/2005 | Ferreira et al. | |
| 6,908,722 | B2 | 6/2005 | Ebata et al. | |
| 7,001,706 | B2 * | 2/2006 | Yamaguchi et al. | 430/270.1 |
| 7,094,515 | B2 * | 8/2006 | Kodama et al. | 430/270.1 |
| 2004/0087690 | A1 | 5/2004 | Lamanna et al. | |
| 2004/0152024 | A1 * | 8/2004 | Livesay et al. | 430/394 |
| 2004/0185378 | A1 * | 9/2004 | Kodama et al. | 430/311 |
| 2005/0014095 | A1 | 1/2005 | Yamaguchi et al. | |
| 2005/0100819 | A1 * | 5/2005 | Fuji et al. | 430/270.1 |
| 2007/0088131 | A1 * | 4/2007 | Toishi et al. | 525/326.2 |

FOREIGN PATENT DOCUMENTS

| | | |
|---|---|---|
| DE | 10259057 A1 * | 7/2004 |
| EP | 1 158 363 A1 | 11/2001 |
| EP | 1199603 A1 * | 4/2002 |
| EP | 1 517 179 A1 | 3/2005 |
| JP | 6-242606 A | 9/1994 |
| JP | 09-258435 A | 10/1997 |
| JP | 11-501909 A | 2/1999 |
| JP | 11-160861 A | 6/1999 |
| JP | 2001-130159 A | 5/2001 |
| JP | 2001-133980 A | 5/2001 |
| JP | 2002-131897 A | 5/2002 |
| JP | 2003-149812 A | 5/2003 |
| JP | 2005-097254 A | 4/2005 |

\* cited by examiner

*Primary Examiner*—Amanda C. Walke
(74) *Attorney, Agent, or Firm*—Sughrue Mion, PLLC

(57) ABSTRACT

A photosensitive composition for use in the production process of a semiconductor such as IC, in the production of a circuit substrate of liquid crystal, thermal head and the like or in other photofabrication processes, a compound for use in the photosensitive composition, and a pattern forming method using the photosensitive composition, are provided, which are a photosensitive composition excellent in the sensitivity, resolution and pattern profile, assured of large exposure latitude and small pitch dependency, and improved in the sensitivity and dissolution contrast at the exposure with EUV light, a pattern forming method using the photosensitive composition, and a compound useful for the photosensitive composition.

27 Claims, 1 Drawing Sheet

PHOTOSENSITIVE COMPOSITION, COMPOUND FOR USE IN THE PHOTOSENSITIVE COMPOSITION AND PATTERN FORMING METHOD USING THE PHOTOSENSITIVE COMPOSITION

BACKGROUND OF THE INVENTION

1. Field of the Invention

The present invention relates to a photosensitive composition capable of changing its properties by undergoing a reaction upon irradiation with actinic rays or radiation, a compound for use in the photosensitive composition, and a pattern forming method using the photosensitive composition. More specifically, the present invention relates to a photosensitive composition for use in the production process of a semiconductor such as IC, in the production of a circuit substrate of liquid crystal, thermal head and the like, in other photofabrication processes or in the lithographic printing plate or acid-curable composition, and also relates to a compound for use in the photosensitive composition and a pattern forming method using the photosensitive composition.

2. Background Art

The chemical amplification resist composition is a pattern forming material capable of forming a pattern on a substrate by producing an acid in the exposed area upon irradiation with actinic rays or radiation such as far ultraviolet light, and through a reaction using this acid as the catalyst, causing the area irradiated with actinic rays or radiation and the area not irradiated therewith to change in the solubility in a developer.

In the case of using a KrF excimer laser as the exposure light source, a resin having small absorption in the region of 248 nm and having a basic skeleton of poly(hydroxystyrene) is primarily used as the main component and this is an excellent system capable of forming a good pattern with high sensitivity and high resolution as compared with conventional naphthoquinonediazide/novolak resin systems.

In the case of using a light source of emitting light at wavelengths shorter than that, for example, in using an ArF excimer laser (193 nm) as the light source, a satisfactory pattern cannot be formed even by the above-described chemical amplification system because the compound having an aromatic group substantially has large absorption in the region of 193 nm.

In order to solve this problem, a resist containing a resin having an alicyclic hydrocarbon structure with high transparency has been developed for use with an ArF excimer laser. However, the alicyclic structure generally has low polarity, and the reactivity for deprotection in the resin is greatly decreased as compared with that in poly(hydroxystyrene). Therefore, an acid having high acidity is necessary for the image formation and a specific organic sulfonic acid is used, for example, in Patent Document 1 (JP-A-2002-131897 (the term "JP-A" as used herein means an "unexamined published Japanese patent application")), Patent Document 2 (JP-A-2003-149812), Patent Document 3 (JP-T-11-501909 (the term (the term "JP-T" as used herein means a "published Japanese translation of a PCT patent application")), Patent Document 4 (JP-A-6-242606), Patent Document 5 (JP-A-11-160861) and Patent Document 6 (U.S. Patent Application 2004/0087690A1).

However, many points still remain unsatisfied, and more improvement is demanded with respect to the sensitivity, exposure latitude, pattern profile, pitch dependency, and the like.

SUMMARY OF THE INVENTION

An object of the present invention is to provide a photosensitive composition excellent in the sensitivity and resolution and improved in the exposure latitude, pattern profile and pitch dependency, a compound for use in the photosensitive composition, and a pattern forming method using the photosensitive composition.

The present invention is as follows.

1. A photosensitive composition comprising (A) a compound capable of generating an organic acid having a bond which is cleaved by an acid, upon irradiation with actinic rays or radiation.

2. The photosensitive composition as described in the item 1, which comprises (A) a compound capable of generating an organic acid having a structure represented by the following formula (I) upon irradiation with actinic rays or radiation:

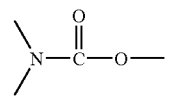

3. The photosensitive composition as described in the item 1 or 2, which comprises (A) a compound capable of generating an organic acid represented by the following formula (II) upon irradiation with actinic rays or radiation:

wherein
A represents a divalent linking group,
X represents a single bond or —SO$_2$—,
B represents a single bond, an oxygen atom or —N(Rx)-,
Rx represents a hydrogen atom or a monovalent organic group,
R represents a monovalent organic group containing a nitrogen atom, said nitrogen atom being substituted by the following formula (III):

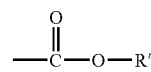

R' represents a monovalent organic group, and
when B is —N(Rx)-, R and Rx may combine to form a ring.

4. The photosensitive composition as described in the item 3, wherein the compound (A) capable of generating an organic acid represented by formula (II) upon irradiation with actinic rays or radiation is a sulfonium salt compound of the organic acid represented by formula (II) or an iodonium salt compound of the organic acid represented by formula (II).

5. The photosensitive composition as described in any one of the items 1 to 4, which further comprises (A') a compound capable of generating an acid compound other than the organic acid, upon irradiation with actinic rays or radiation.

6. The photosensitive composition as described in the item 5, wherein the compound (A') is a sulfonium salt of fluorine-substituted alkanesulfonic acid, fluorine-substituted benzenesulfonic acid or a fluorine-substituted imide acid.

7. The photosensitive composition (positive photosensitive composition) as described in any one of the items 1 to 6, which further comprises (B) a resin capable of decomposing under the action of an acid to increase the solubility in an alkali developer.

8. The photosensitive composition as described in the item 7, wherein the resin (B) has a fluorine atom in the main or side chain.

9. The photosensitive composition as described in the item 8, wherein the resin (B) has a hexafluoroisopropanol structure.

10. The photosensitive composition as described in any one of the items 7 to 9, wherein the resin (B) has a hydroxystyrene structural unit.

11. The photosensitive composition as described in any one of the items 7 to 10, wherein the resin (B) has at least one repeating unit selected from 2-alkyl-2-adamantyl(meth)acrylate and dialkyl(1-adamantyl)methyl(meth)acrylate.

12. The photosensitive composition as described in the item 7, wherein the resin (B) has a monocyclic or polycyclic alicyclic hydrocarbon structure.

13. The photosensitive composition as described in the item 12, wherein the resin (13) has at least one repeating unit selected from 2-alkyl-2-adamantyl(meth)acrylate and dialkyl (1-adamantyl)methyl(meth)acrylate, at least one repeating unit having a lactone structure, and at least one repeating unit having a hydroxyl group.

14. The photosensitive composition as described in the item 12 or 13, wherein the resin (B) further has a repeating unit having a carboxyl group.

15. The photosensitive composition as described in the item 7, wherein the resin (B) has a silicon atom in the main or side chain.

16. The photosensitive composition as described in the item 7, wherein the resin (B) has a repeating unit having a lactone structure.

17. The photosensitive composition as described in any one of the items 1 to 16, which further comprises (C) a dissolution inhibiting compound capable of decomposing under the action of an acid to increase the solubility in an alkali developer and having a molecular weight of 3,000 or less.

18. The photosensitive composition as described in the item 17, which further comprises (D) a resin soluble in an alkali developer.

19. The photosensitive composition (negative photosensitive composition) as described in any one of the items 1 to 4, which further comprises (D) a resin soluble in an alkali developer, and (E) an acid crosslinking agent capable of crosslinking with the resin soluble in an alkali developer under the action of an acid.

20. The photosensitive composition as described in any one of the items 1 to 19, which further comprises at least one of (F) a basic compound and (G) a fluorine- and/or silicon-containing surfactant.

21. The photosensitive composition as described in the item 20, wherein the basic compound (F) is a compound having a structure selected from an imidazole structure, a diazabicyclo structure, an onium hydroxide structure, an onium carboxylate structure, a trialkylamine structure, an aniline structure and a pyridine structure, an alkylamine derivative having a hydroxyl group and/or an ether bond, or an aniline derivative having a hydroxyl group and/or an ether bond.

22. A pattern forming method comprising: forming a resist film from the photosensitive composition described in any one of the items 1 to 21; and exposing and developing said resist film.

23. An organic acid having a structure represented by the following formula (I) and a salt thereof:

24. An organic acid represented by the following formula (II) and a salt thereof:

wherein

A represents a divalent linking group,

X represents a single bond or —SO$_2$—,

B represents a single bond, an oxygen atom or —N(Rx)-,

Rx represents a hydrogen atom or a monovalent organic group,

R represents a monovalent organic group containing a nitrogen atom, said nitrogen atom being substituted by the following formula (III):

R' represents a monovalent organic group, and when B is —N(Rx)-, R and Rx may combine to form a ring.

25. A sulfonium salt compound of an organic acid represented by the following formula (II) or an iodonium salt compound of an organic acid represented by the following formula (II):

wherein

A represents a divalent linking group,

X represents a single bond or —SO$_2$—,

B represents a single bond, an oxygen atom or —N(Rx)-,

Rx represents a hydrogen atom or a monovalent organic group,

R represents a monovalent organic group containing a nitrogen atom, said nitrogen atom being substituted by the following formula (III):

R' represents a monovalent organic group, and when B is —N(Rx)-, R and Rx may combine to form a ring.

According to the present invention, a photosensitive composition excellent in the sensitivity, resolution and pattern profile, assured of large exposure latitude and small pitch dependency, and improved in the sensitivity and dissolution contrast at the exposure with EUV light, a pattern forming method using the photosensitive composition, and a compound useful for the photosensitive composition can be provided.

Figure 1:
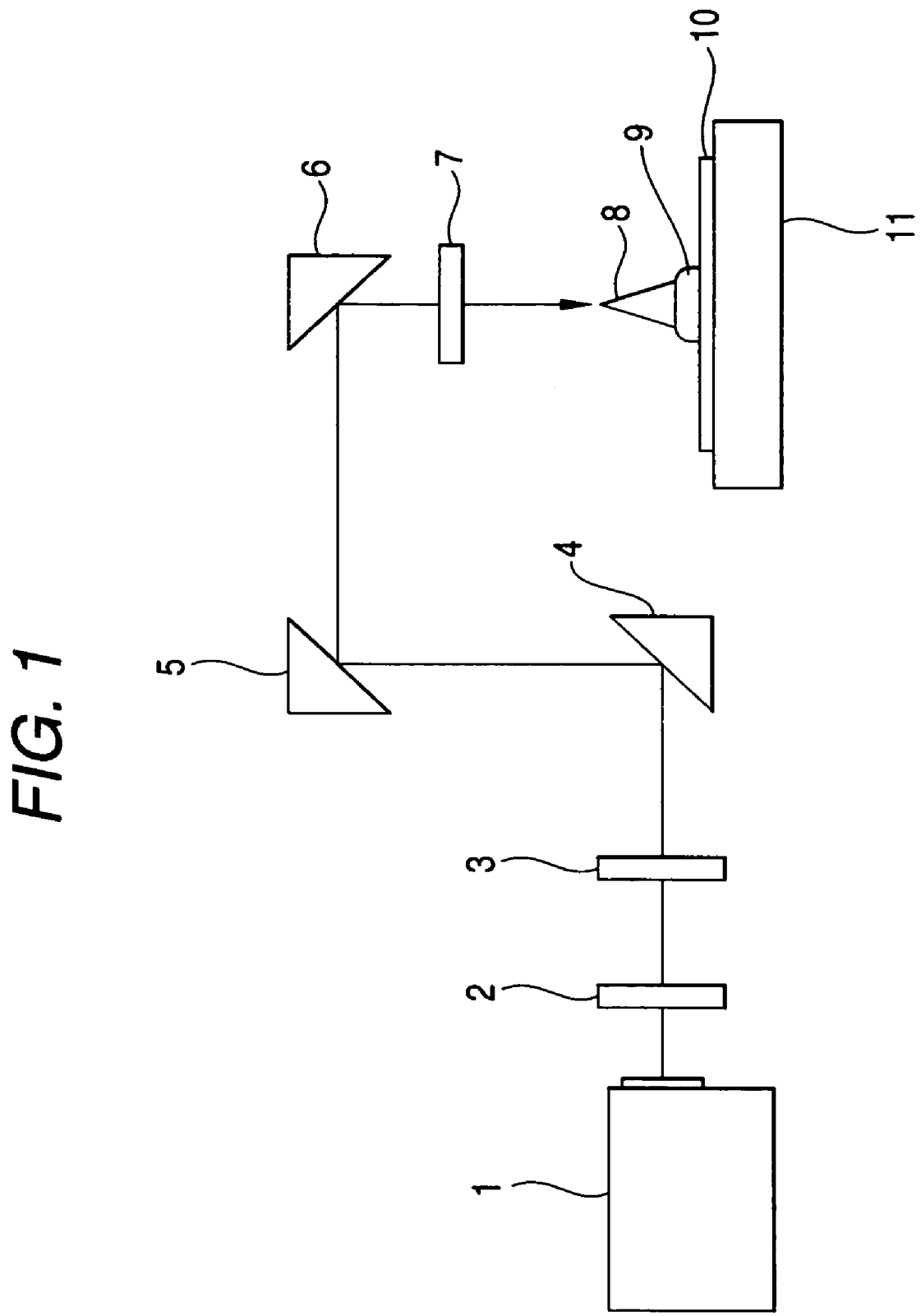
FIG. 1 is a schematic view of the two-beam interference exposure testing apparatus

| | Description of Numerical References |
|---|---|
| 1 | Laser |
| 2 | Diaphragm |
| 3 | Shutter |
| 4, 5, 6 | Reflecting mirrors |
| 7 | Condenser lens |
| 8 | Prism |
| 9 | Immersion solution |
| 10 | Wafer with antireflection film and resist film |
| 11 | Wafer stage |

DETAILED DESCRIPTION OF THE INVENTION

The present invention is described in detail below.

In the present invention, when a group (atomic group) is denoted without specifying whether substituted or unsubstituted, the group includes both a group having no substituent and a group having a substituent. For example, an "alkyl group", includes not only an alkyl group having no substituent (unsubstituted alkyl group) but also an alkyl group having a substituent (substituted alkyl group).

The positive photosensitive composition, preferably positive resist composition, of the present invention comprises (A) a compound capable of generating an organic acid represented by formula (I) upon irradiation with actinic rays or radiation and (B) a resin capable of decomposing under the action of an acid to increase the solubility in an alkali developer and if desired, further comprises (C) a dissolution inhibiting compound capable of decomposing under the action of an acid to increase the solubility in an alkali developer and having a molecular weight of 3,000 or less. Alternatively, the positive photosensitive composition comprises (A) a compound capable of generating an organic acid represented by formula (I) upon irradiation with actinic rays or radiation, (D) a resin soluble in an alkali developer and (C) a dissolution inhibiting compound capable of decomposing under the action of an acid to increase the solubility in an alkali developer and having a molecular weight of 3,000 or less.

The negative photosensitive composition, preferably negative resist composition, of the present invention comprises (A) a compound capable of generating an organic acid represented by formula (I) upon irradiation with actinic rays or radiation, (D) a resin soluble in an alkali developer and (E) an acid crosslinking agent capable of crosslinking with the alkali developer-soluble resin under the action of an acid.

(A) Compound Capable of Generating an Organic Acid Having a Bond which is Cleaved by an Acid, Upon Irradiation with Actinic Rays or Radiation The photosensitive composition of the present invention comprises (A) a compound capable of generating an organic acid having a bond which is cleaved by an acid, upon irradiation with actinic rays or radiation.

The compound (A) generates an organic acid by receiving actinic rays or radiation from, for example, an excimer laser such as KrF and ArF. This organic acid has, within the molecule, a bond which is cleaved by an acid. At this time, the acid for decomposing the organic acid may be the organic acid itself generated from the compound (A) or may be other acid. The other acid includes (A') a compound capable of generating an acid compound other than that described above. By using such a compound (A) in the photosensitive composition, the resolution is enhanced.

Examples of the bond which is contained in the organic acid generated from the compound (A) and which is cleaved by the effect of an acid include an amide bond, an ester bond, an acetal bond, a carbamoyl bond and a carbonate bond.

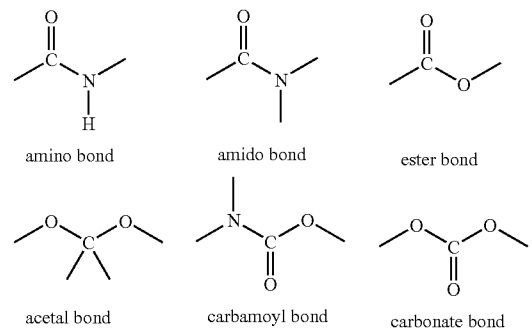

The structure having such a bond which is cleaved by an acid is preferably a carbamoyl structure represented by the following formula (I):

The organic acid generated from the compound (A) is more preferably an organic acid represented by the following formula (II). By applying such a compound to the photosensitive composition, the exposure latitude, pattern profile and pitch dependency are improved.

$$HO_3S\text{-A-X-B-R} \qquad (II)$$

In formula (II),

A represents a divalent linking group,

X represents a single bond or —$SO_2$—,

B represents a single bond, an oxygen atom or —N(Rx)-,

Rx represents a hydrogen atom or a monovalent organic group,

R represents a monovalent organic group containing a nitrogen atom, the nitrogen atom being substituted by the following formula (III):

R' represents a monovalent organic group, and when B is —N(Rx)-, R and Rx may combine to form a ring.

The divalent linking group as A is preferably a divalent organic group having a carbon number of 1 to 8, and examples thereof include an alkylene group and a phenylene group. The divalent linking group as A is more preferably an alkylene group (preferably having a carbon number of 2 to 6, more preferably from 2 to 4). The alkylene group may contain, in the alkylene chain, a linking group such as oxygen atom and sulfur atom. The alkylene group may be substituted by a fluorine atom and in this case, the alkylene group is preferably an alkylene group where from 30 to 100% by number of the hydrogen atom is replaced by a fluorine atom, more preferably an alkylene group where the carbon atom bonded to the $HO_3S$— site has a fluorine atom, still more preferably a perfluoroalkylene group, and most preferably a perfluoroethylene group, a perfluoropropylene group or a perfluorobutylene group, because the sensitivity is enhanced.

The monovalent organic group as Rx and Rx' is preferably a monovalent organic group having a carbon number of 4 to 20, and examples thereof include an alkyl group, a cycloalkyl group, an aryl group, an aralkyl group and an alkenyl group.

The alkyl group as Rx, which may have a substituent, is preferably a linear or branched alkyl group having a carbon number of 1 to 20 and may contain, in the alkyl chain, an oxygen atom, a sulfur atom or a nitrogen atom. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The alkyl group having a substituent particularly includes a group where a cycloalkyl group is substituted to a linear or branched alkyl group, such as adamantylmethyl group, adamantylethyl group, cyclohexylethyl group and camphor residue.

The cycloalkyl group as Rx, which may have a substituent, is preferably a cycloalkyl group having a carbon number of 3 to 20 and may contain, in the ring, an oxygen atom. Specific examples thereof include a cyclopropyl group, a cyclopentyl group, a cyclohexyl group, a norbornyl group and an adamantyl group.

The aryl group as Rx, which may have a substituent, is preferably an aryl group having a carbon number of 6 to 14, and examples thereof include a phenyl group and a naphthyl group.

The aralkyl group as Rx is preferably an aralkyl group having a carbon number of 7 to 20, and examples thereof include a benzyl group, a phenethyl group, a naphthylmethyl group and a naphthylethyl group.

The alkenyl group as Rx includes a group having a double bond at an arbitrary position of the alkyl group described for Rx.

R is a monovalent organic group containing at least one nitrogen atom, the nitrogen atom being substituted by a substituent of formula (M), and the monovalent organic group as R preferably has a carbon number of 5 to 20. Examples thereof include an alkyl group, a cycloalkyl group, an aryl group, an aralkyl group and an alkenyl group, each having a nitrogen atom substituted by formula (III), and these are the same as those described for Rx.

R' is a monovalent organic group preferably having a carbon number of 4 to 15, and examples thereof include an alkyl group, a cycloalkyl group, an aryl group, an aralkyl group and an alkenyl group. These are the same as those described for Rx. In particular, R' is preferably an alkyl group or an aralkyl group.

The organic acid having a structure represented by formula (I), the organic acid represented by formula (II) and salts thereof are novel compounds.

The organic acid of the present invention can be synthesized by using a general sulfonic acid esterification reaction or sulfonamidation reaction. For example, in the case of an organic acid having a structure represented by formula (I), a method of selectively reacting one sulfonyl halide moiety of a bis-sulfonyl halide compound with an amine, alcohol or the like containing a partial structure represented by formula (I) to form a sulfonamide bond or a sulfonic acid ester bond, and then hydrolyzing the other sulfonyl halide moiety, or a method of ring-opening a cyclic sulfonic anhydride by an amine or alcohol containing a partial structure represented by formula (I) may be used. The amine or alcohol containing a partial structure represented by formula (I) can be synthesized by reacting an amine or alcohol with an anhydride (e.g., $(R'O_2C)_2O$, $R'O_2CCl$) or an acid chloride compound under basic condition.

Specific preferred examples of the organic acid of the present invention, namely, the organic acid being generated by the irradiation of actinic rays or radiation on the compound (A) and having a bond which is cleaved by an acid, are set forth below, but the present invention is not limited thereto.

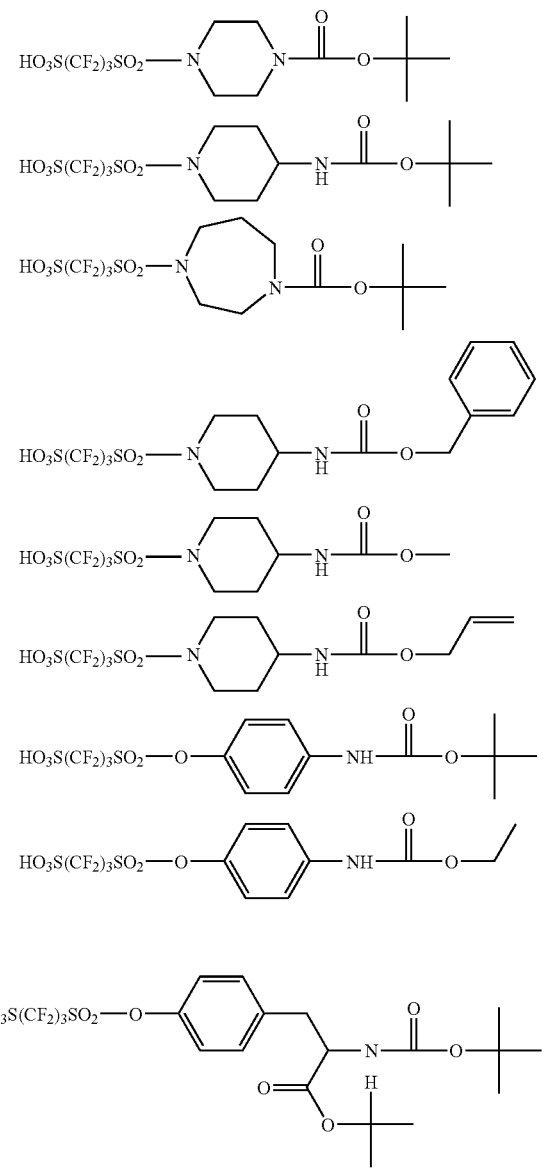

-continued

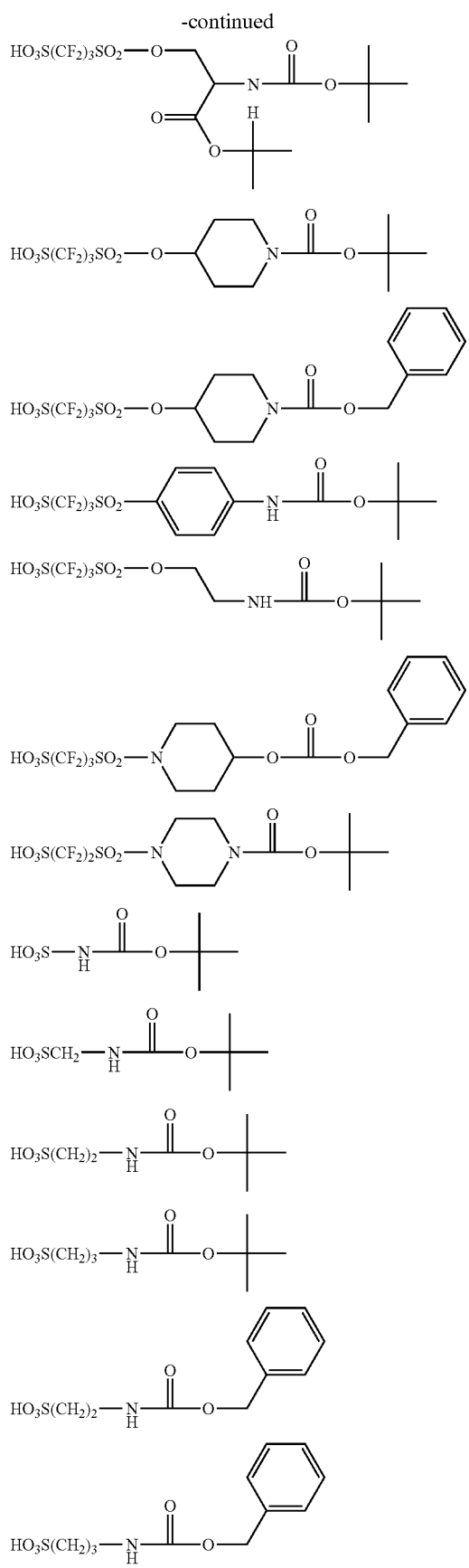

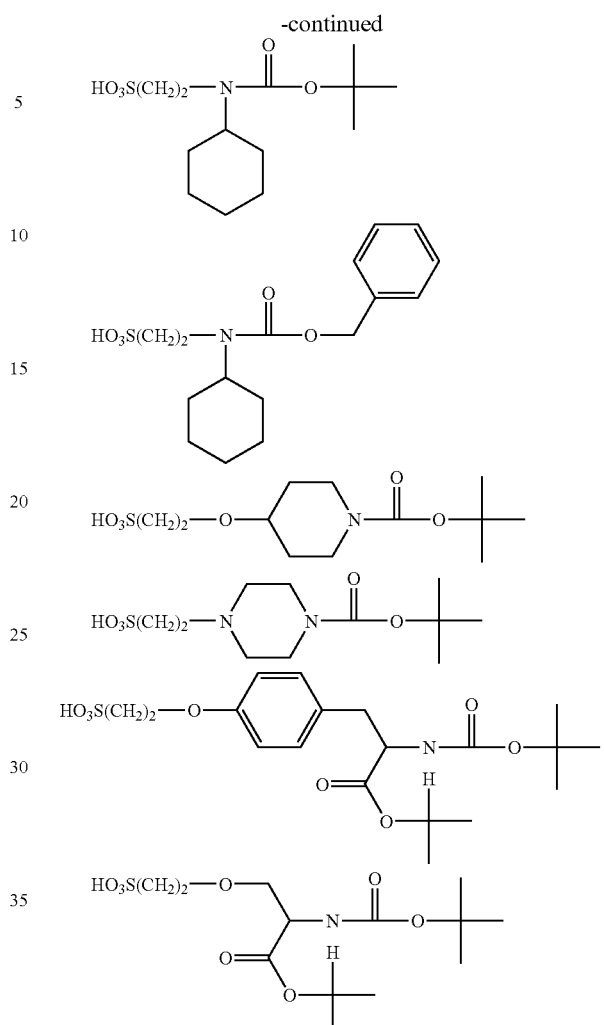

The compound (A) is preferably a sulfonium salt compound or iodonium salt compound of an organic acid having a bond which is cleaved by an acid, more preferably a compound represented by the following formula (A1) or (A2):

$$R_{202}-\overset{R_{201}}{\underset{R_{203}}{S^+}} \ X^- \quad (A1)$$

$$\overset{R_{205}}{\underset{R_{204}}{I^+}} \ X^- \quad (A2)$$

In formula (A1), $R_{201}$, $R_{202}$ and $R_{203}$ each independently represents an organic group.

$X^-$ represents an anion of an organic acid having a bond which is cleaved by an acid.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include the corresponding groups in the compounds (A1a), (A1b) and (A1c) described later.

The compound may be a compound having a plurality of structures represented by formula (A1). For example, the compound may be a compound having a structure that at least one of $R_{201}$ to $R_{203}$ in the compound represented by formula (A1) is bonded to at least one of $R_{201}$ to $R_{203}$ in another compound represented by formula (A1).

The component (A1) is more preferably a compound (A1a), (A1b) or (A1c) described below.

The compound (A1a) is an arylsulfonium compound where at least one of $R_{201}$ to $R_{203}$ in formula (A1) is an aryl group, that is, a compound having arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include, a triarylsulfonium compound, a diarylalkylsulfonium compound, a diarylcycloakylsulfonium compound, an aryldialkylsulfonium compound, an aryldicycloalkylsulfonium compound and an arylalkylcycloalkylsulfonium compound.

The aryl group in the arylsulfonium compound is preferably a phenyl group or a naphthyl group, more preferably a phenyl group. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, such as methyl group, ethyl group, propyl group, n-butyl group, sec-butyl group and tert-butyl group.

The cycloalkyl group which is present, if desired, in the arylsulfonium compound is preferably a cycloalkyl group having a carbon number of 3 to 15, such as cyclopropyl group, cyclobutyl group and cyclohexyl group.

The aryl group, alkyl group and cycloalkyl group of $R_{201}$ to $R_{203}$ each may have, as the substituent, an alkyl group (for example, an alkyl group having a carbon number of 1 to 0.15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, and most preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (A1b) is described below.

The compound (A1b) is a compound when $R_{201}$ to $R_{203}$ in formula (A1) each independently represents an organic group not containing an aromatic ring. The aromatic ring as used herein includes an aromatic ring having a heteroatom.

The organic group as $R_{201}$ to $R_{203}$ not containing an aromatic ring has a carbon number of generally from 1 to 30, preferably from 1 to 20.

$R_{201}$ to $R_{203}$ each independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group as $R_{201}$ to $R_{203}$ may be either linear or branched and is preferably a linear or branched alkyl group having a carbon number of 1 to 20 (e.g., methyl, ethyl, propyl, butyl, pentyl), more preferably a linear or branched 2-oxoalkyl group or an alkoxycarbonylmethyl group.

The cycloalkyl group as $R_{200}$ to $R_{203}$ is preferably a cycloalkyl group having a carbon number of 3 to 10 (e.g., cyclopentyl, cyclohexyl, norbornyl), more preferably a 2-oxocycloalkyl group.

The linear or branched 2-oxoalkyl group as $R_{201}$ to $R_{203}$ may have a double bond in the chain, and preferred examples thereof include a group having >C=O at the 2-position of the above-described alkyl group.

The 2-oxocycloalkyl group as $R_{201}$ to $R_{203}$ may have a double bond in the chain, and preferred examples thereof include a group having >C=O at the 2-position of the above-described cycloalkyl group.

Preferred examples of the alkoxy group in the alkoxycarbonylmethyl group as $R_{201}$ to $R_{203}$ include an alkyl group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), an alkoxycarbonyl group (for example, an alkoxycarbonyl group having a carbon number of 1 to 5), a hydroxyl group, a cyano group or a nitro group.

The compound (A1c) is a compound represented by the following formula (A1c), and this is a compound having an arylacylsulfonium salt structure.

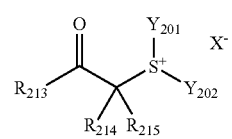

(A1c)

In formula (A1c), $R_{213}$ represents an aryl group which may be substituted, and is preferably a phenyl group or a naphthyl group.

Preferred examples of the substituent on $R_{213}$ include an alkyl group, an alkoxy group, an acyl group, a nitro group, a hydroxyl group, an alkoxycarbonyl group and a carboxy group.

$R_{214}$ and $R_{215}$ each independently represents a hydrogen atom, an alkyl group or a cycloalkyl group.

$Y_{201}$ and $Y_{202}$ each independently represents an alkyl group, a cycloalkyl group, an aryl group or a vinyl group.

$X^-$ represents an anion of an organic acid having a bond which is cleaved by an acid.

$R_{213}$ and $R_{214}$ may combine with each other to form a ring structure, $R_{214}$ and $R_{215}$ may combine with each other to form a ring structure, and $Y_{201}$ and $Y_{202}$ may combine with each other to form a ring structure. The ring structure formed may contain an oxygen atom, a sulfur atom, an ester bond or an amide bond. Examples of the group formed by combining each pair of $R_{213}$ and $R_{214}$, $R_{214}$ and $R_{215}$, or $Y_{201}$ and $Y_{202}$ include a butylene group and a pentylene group.

The alkyl group as $R_{214}$, $R_{215}$, $Y_{201}$ and $Y_{202}$ is preferably a linear or branched alkyl group having a carbon number of 1 to 20. The alkyl group as $Y_{200}$ and $Y_{202}$ is more preferably a 2-oxoalkyl group having >C=O at the 2 position of the alkyl group, an alkoxycarbonylalkyl group (preferably with the alkoxy group having a carbon number of 2 to 20), or a carboxyalkyl group.

The cycloalkyl group as $R_{214}$, $R_{215}$, $Y_{201}$ and $Y_{202}$ is preferably a cycloalkyl group having a carbon number of 3 to 20.

$Y_{201}$ and $Y_{202}$ each is preferably an alkyl group having a carbon number of 4 or more, more preferably from 4 to 6, still more preferably from 4 to 12.

At least either one of $R_{214}$ and $R_{215}$ is preferably an alkyl group, and more preferably, $R_{214}$ and $R_{215}$ both are an alkyl group.

In formula (A2), $R_{204}$ and $R_{205}$ each independently represents an aryl group, an alkyl group or a cycloalkyl group.

$X^-$ represents an anion of an organic acid having a bond which is cleaved by an acid.

The aryl group of $R_{204}$ and $R_{205}$ is preferably a phenyl group or a naphthyl group, more preferably a phenyl group.

The alkyl group as $R_{204}$ and $R_{205}$ may be either linear or branched and is preferably a linear or branched alkyl group having a carbon number of 1 to 10 (e.g., methyl, ethyl, propyl, butyl, pentyl).

The cycloalkyl group as $R_{204}$ and $R_{205}$ is preferably a cycloalkyl group having a carbon number of 3 to 10 (e.g., cyclopentyl, cyclohexyl, norbornyl).

$R_{204}$ and $R_{205}$ may have a substituent, and examples of the substituent which $R_{204}$ and $R_{205}$ may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

The compound (A) is preferably a compound represented by formula (A1), more preferably a compound represented by any one of formulae (A1) to (A1c).

Specific examples of the compound (A) are set forth below, but the present invention is not limited thereto.

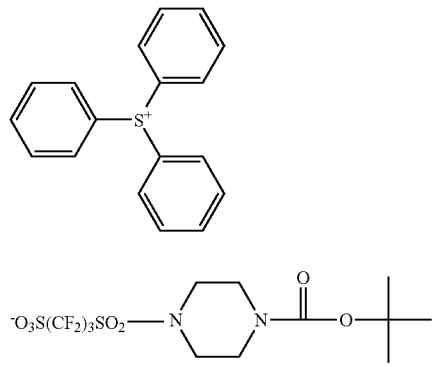

(A-1)

-continued

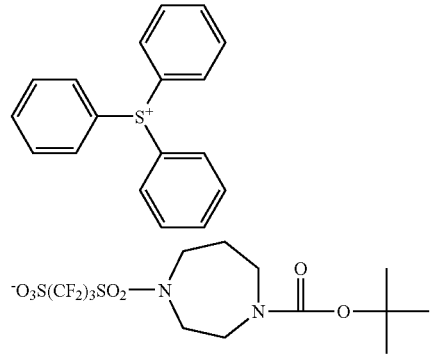

(A-2)

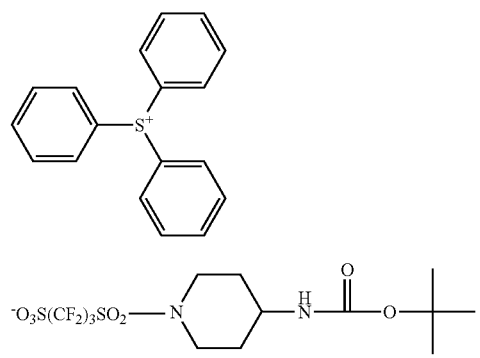

(A-3)

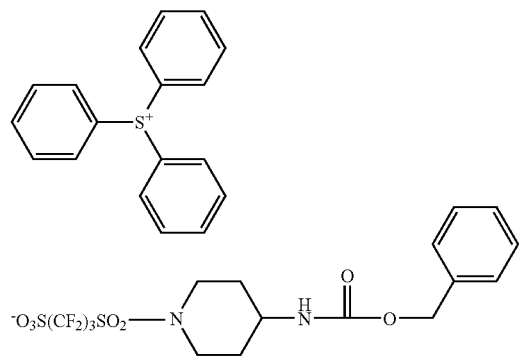

(A-4)

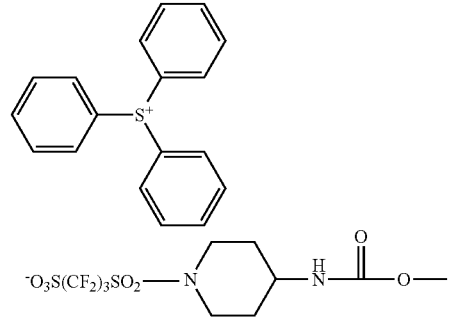

(A-5)

(A-6)
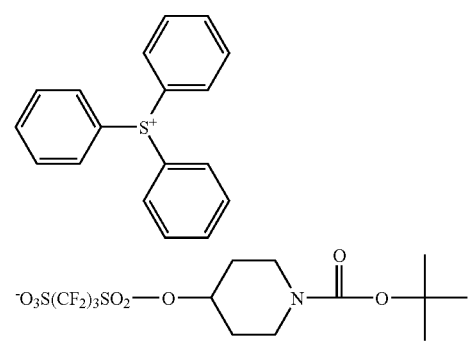
(A-7)
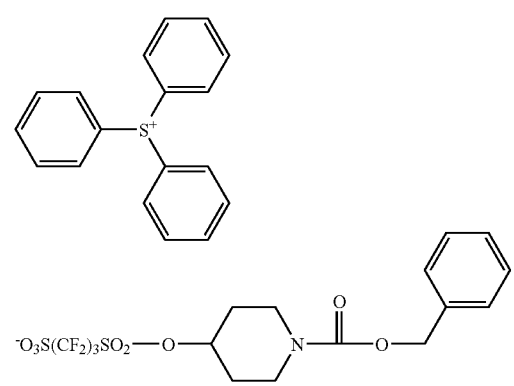
(A-8)
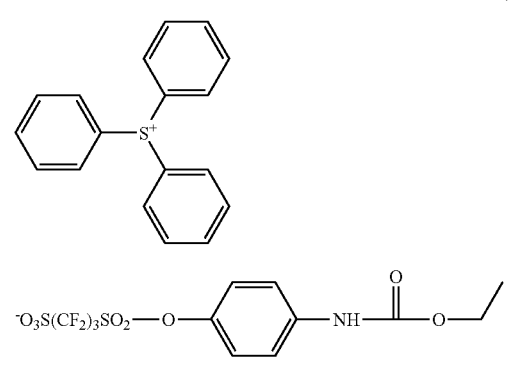
(A-9)
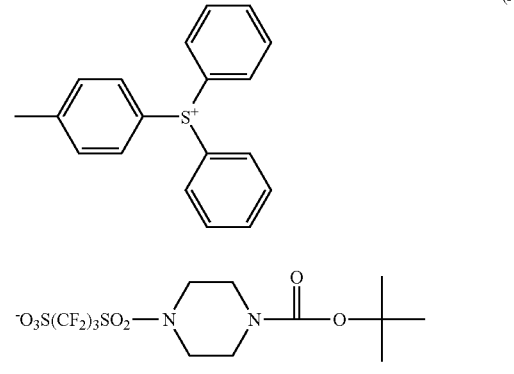
(A-10)
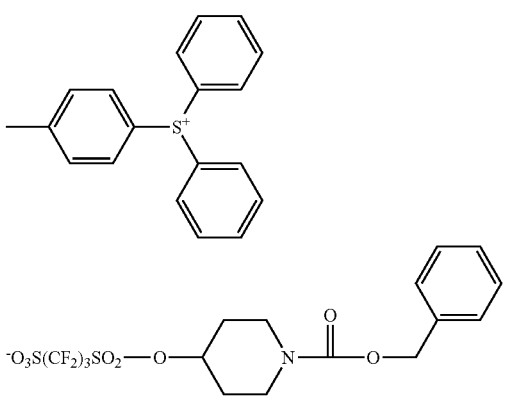
(A-11)
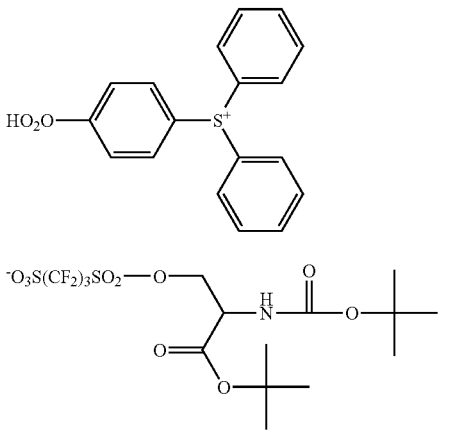
(A-12)
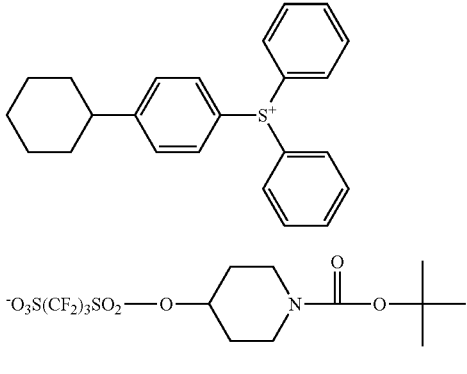
(A-13)

-continued
(A-14)
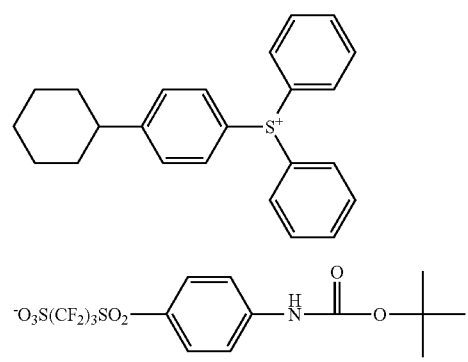
(A-15)
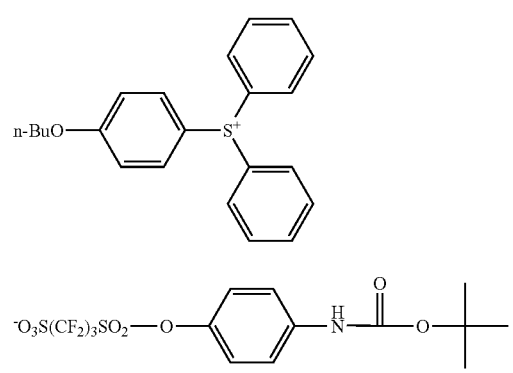
(A-16)
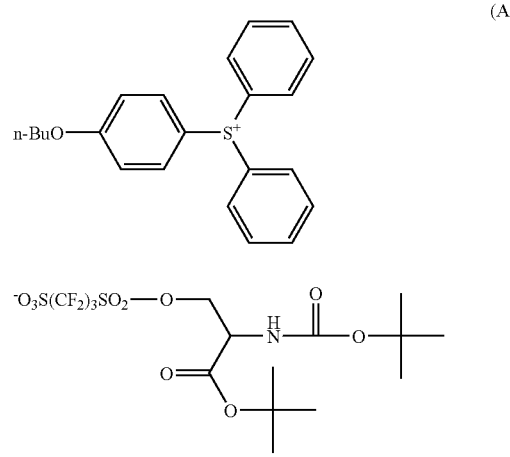
(A-17)
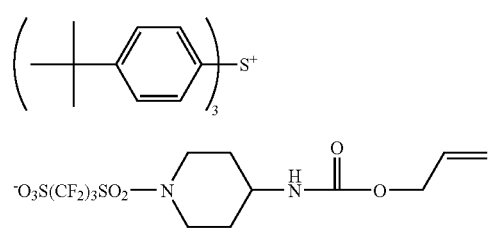
-continued
(A-18)
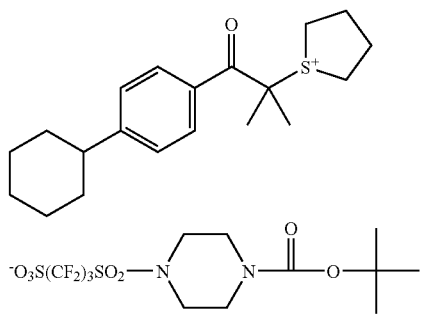
(A-19)
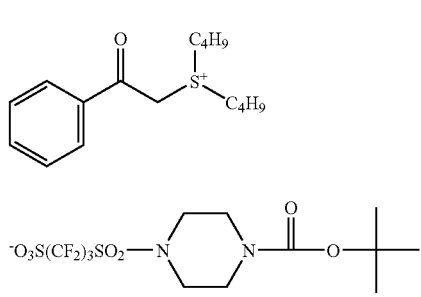
(A-20)
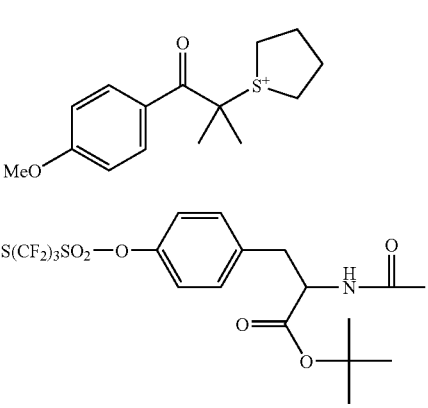
(A-21)
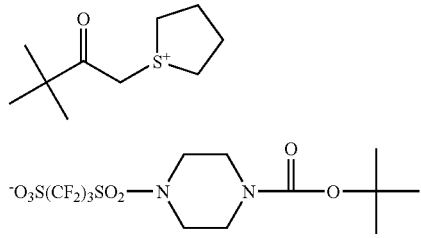
(A-22)
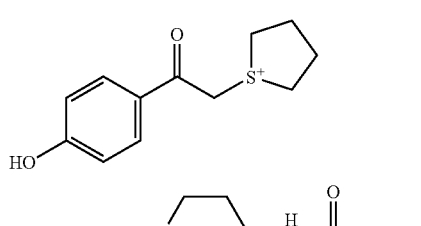

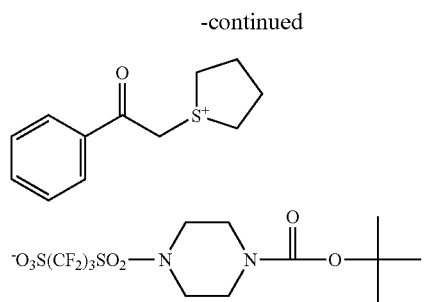

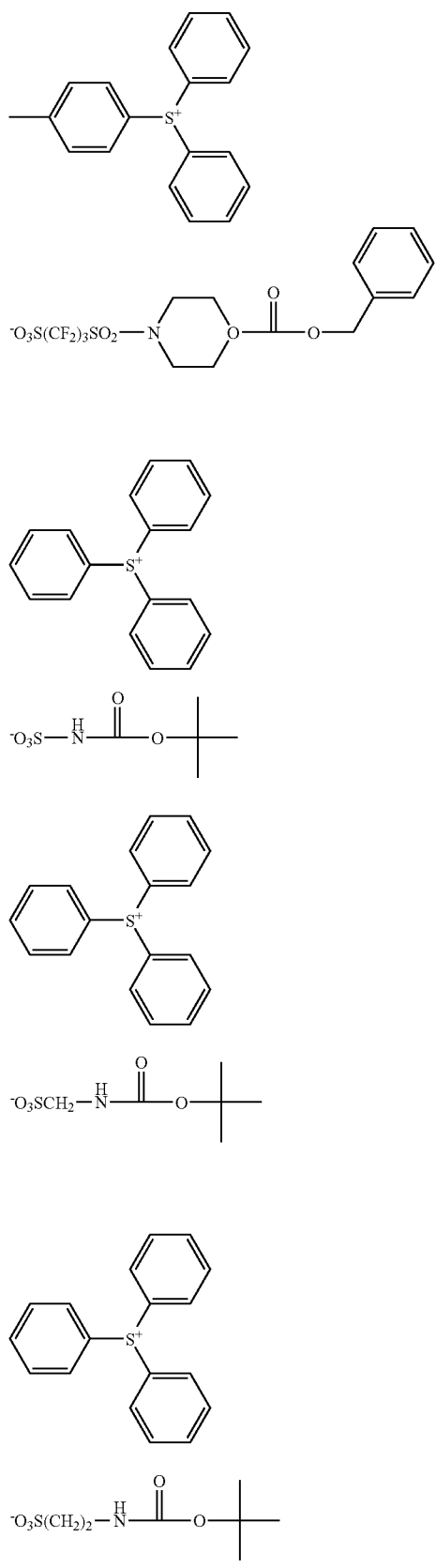
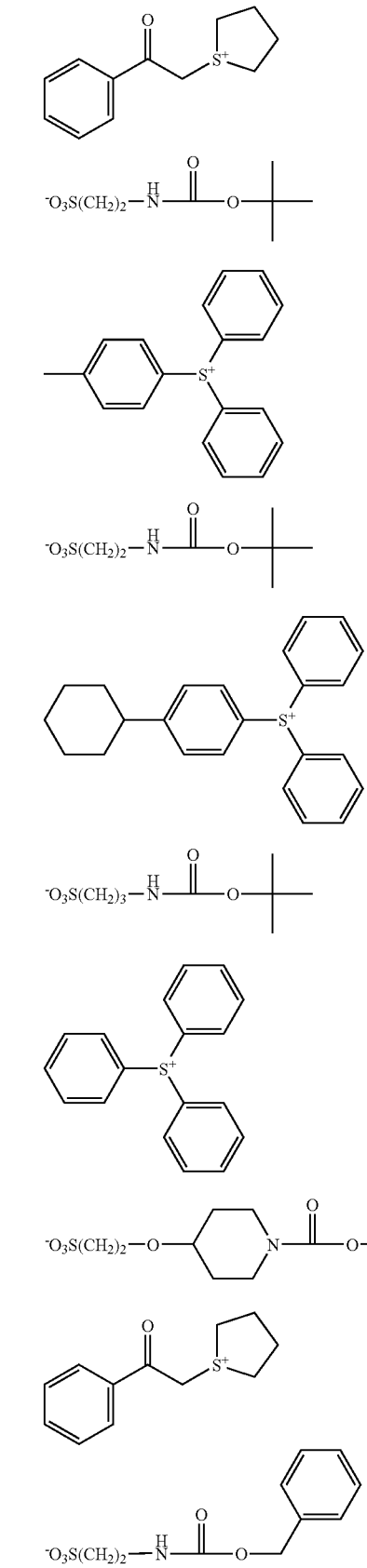

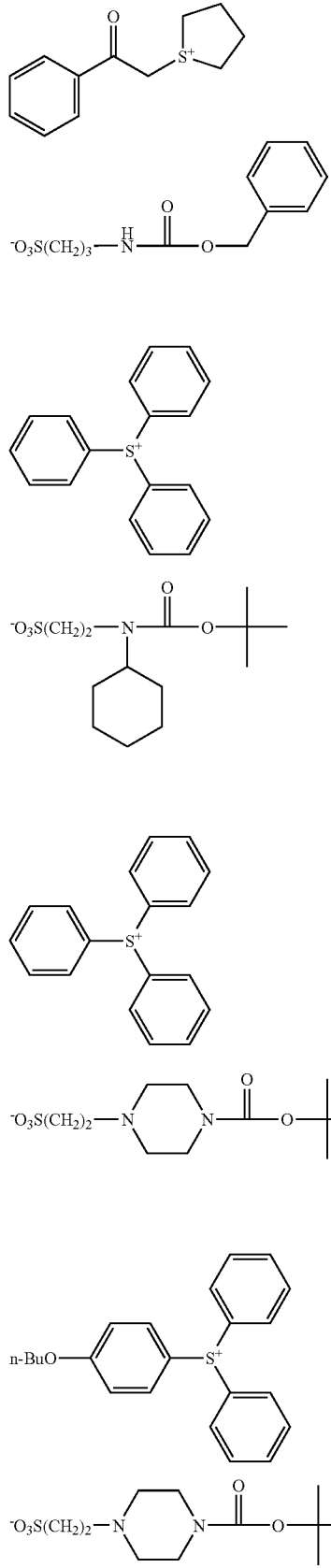
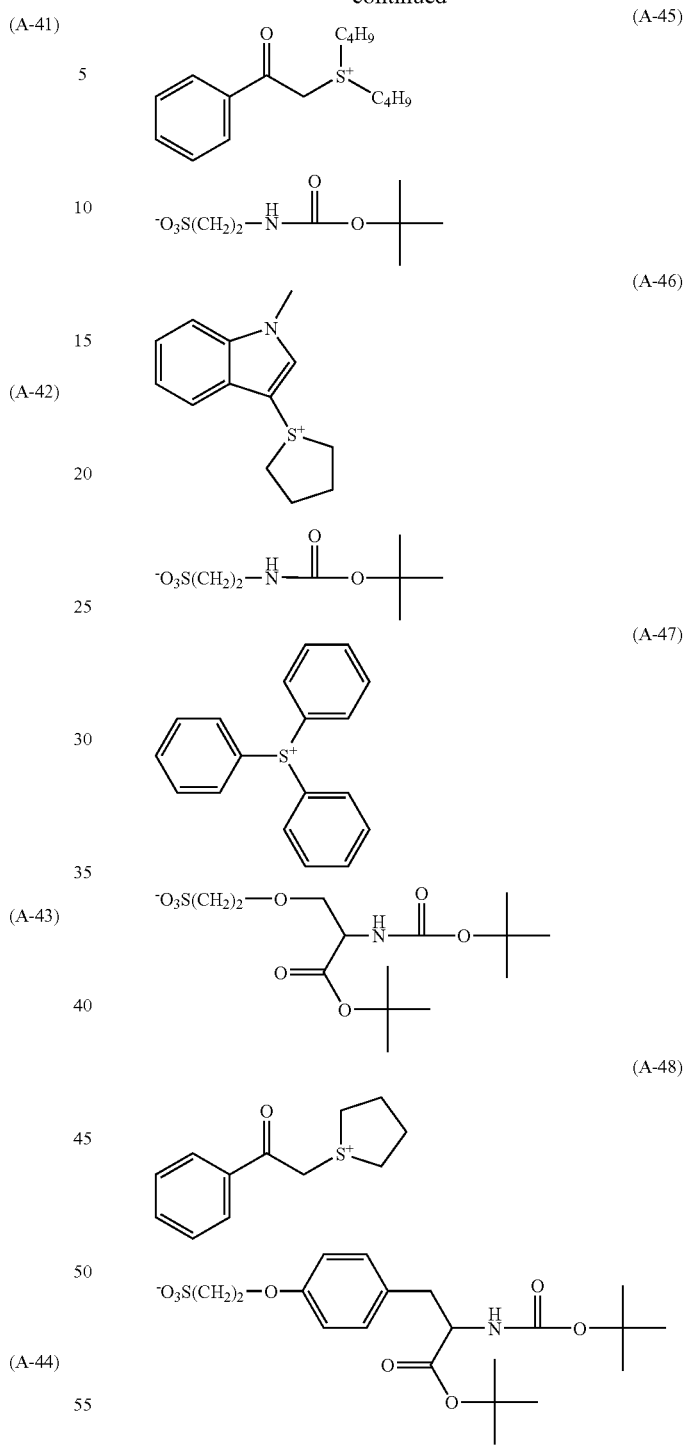

The sulfonic salt compound and iodonium salt compound of the organic acid represented by formula (I) or (II) are novel compounds.

The compound (A) can be easily synthesized from the organic acid of the present invention or a lithium, sodium or potassium salt thereof and a hydroxide, bromide, chloride or the like of iodonium or sulfonium, by utilizing the salt-exchange method described in JP-T-11-501909 or JP-A-2003-246786.

The content of the compound (A) in the photosensitive composition of the present invention is preferably from 0.1 to 20 mass %, more preferably from 0.5 to 10 mass %, still more preferably from 1 to 7 mass %, based on the solid content of the composition.

(Acid Generator Used in Combination)

In the present invention, a compound (acid generator) capable of generating an acid upon irradiation with actinic rays or radiation may also be used in addition to the compound (A).

The amount added of the acid generator which can be used in combination is, in terms of the molar ratio (compound (A)/another acid generator), usually from 90/10 to 5/95, preferably from 60/40 to 5/95, more preferably from 50/50 to 5/95.

This photo-acid generator which can be used in combination may be appropriately selected from a photoinitiator for photocationic polymerization, a photoinitiator for photoradical polymerization, a photo-decoloring agent for dyes, a photo-discoloring agent, a known compound capable of generating an acid upon irradiation with actinic rays or radiation, which is used for microresist and the like, and a mixture thereof.

Examples thereof include diazonium salt, phosphonium salt, sulfonium salt, iodonium salt, imidosulfonate, oxime sulfonate, diazodisulfone, disulfone and o-nitrobenzyl sulfonate.

Also, a compound where the above-described group or compound capable of generating an acid upon irradiation with actinic rays or radiation is introduced into the polymer main or side chain, such as compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, a compound capable of generating an acid by the effect of light described, for example, in U.S. Pat. No. 3,779,778 and European Patent 126,712 may also be used.

Among the compounds capable of decomposing upon irradiation with actinic rays or radiation to generate an acid, which can be used in combination, preferred are the compounds represented by the following formulae (ZI), (ZII) and (ZIII):

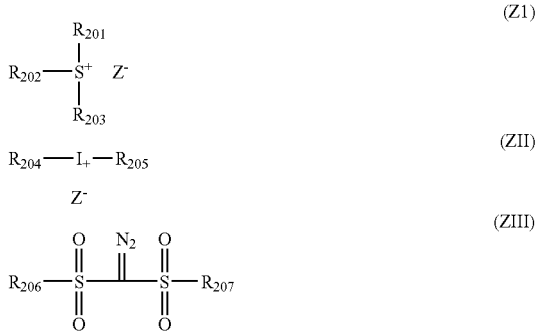

In formula (ZI), $R_{201}$, $R_{202}$ and $R_{203}$ each independently represents an organic group.

The number of carbons in the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion represented by $Z^-$ include sulfonate anion, carboxylate anion, sulfonylimide anion, bis(alkylsulfonyl)imide anion and tris(alkylsulfonyl) methyl anion.

The non-nucleophilic anion is an anion having an extremely low ability of causing a nucleophilic reaction and this anion can prevent the decomposition in aging due to intramolecular nucleophilic reaction. By this anion, the aging stability of resist is enhanced.

Examples of the sulfonate anion include aliphatic sulfonate anion, aromatic sulfonate anion and camphorsulfonate anion.

Examples of the carboxylate anion include aliphatic carboxylate anion, aromatic carboxylate anion and aralkylcarboxylate anion.

The aliphatic moiety in the aliphatic sulfonate anion may be an alkyl group or a cycloalkyl group but is preferably an alkyl group having from 1 to 30 carbon atoms or a cycloalkyl group having from 3 to 30 carbon atoms, such as methyl group, ethyl group, propyl group, isopropyl group, n-butyl group, isobutyl group, sec-butyl group, pentyl group, neopentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, eicosyl group, cyclopropyl group, cyclopentyl group, cyclohexyl group, adamantyl group, norbornyl group and boronyl group.

The aromatic group in the aromatic sulfonate anion is preferably an aryl group having a carbon number of 6 to 14, such as phenyl group, tolyl group and naphthyl group.

The alkyl group, cycloalkyl group and aryl group in the aliphatic sulfonate anion and aromatic sulfonate anion each may have a substituent. Examples of the substituent for the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 5), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12) and an alkoxycarbonyloxy group (preferably having a carbon number of 2 to 7). As for the aryl group and ring structure in each group, examples of the substituent further include an alkyl group (preferably having a carbon number of 1 to 15).

Examples of the aliphatic moiety in the aliphatic carboxylate anion include the same alkyl group and cycloalkyl group as in the aliphatic sulfonate anion.

Examples of the aromatic group in the aromatic carboxylate anion include the same aryl group as in the aromatic sulfonate anion.

The aralkyl group in the aralkylcarboxylate anion is preferably an aralkyl group having a carbon number of 6 to 12, such as benzyl group, phenethyl group, naphthylmethyl group, naphthylethyl group and naphthylmethyl group.

The alkyl group, cycloalkyl group, aryl group and aralkyl group in the aliphatic carboxylate anion, aromatic carboxylate anion and aralkylcarboxylate anion each may have a substituent. Examples of the substituent for the alkyl group, cycloalkyl group, aryl group and aralkyl group in the aliphatic carboxylate anion, aromatic carboxylate anion and aralkylcarboxylate-anion include the same halogen atom, alkyl group, cycloalkyl group, alkoxy group and alkylthio group as in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, such as methyl group, ethyl group, propyl group, isopropyl group, n-butyl group, isobutyl group, sec-butyl group, pentyl group and neopentyl group. Examples of the substituent for such an alkyl group include a halogen atom, a halogen atom-substituted alkyl 'group,' an alkoxy group and an alkylthio group. Among these, an alkyl group substituted by a fluorine atom is preferred.

Other examples of the non-nucleophilic anion include fluorinated phosphorus, fluorinated boron and fluorinated antimony.

The non-nucleophilic anion of $Z^-$ is preferably an aliphatic sulfonate anion with the α-position of sulfonic acid being substituted by a fluorine atom, an aromatic sulfonate anion substituted by a fluorine atom or a group having a fluorine atom, a bis(alkylsulfonyl)imide anion with the alkyl group being substituted by a fluorine atom, or a tris(alkylsulfonyl)methide anion with the alkyl group being substituted by a fluorine atom, more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (Z1), for example, a compound having a structure that at least one of $R_{201}$ to $R_{203}$ in the compound represented by formula (Z1) is bonded to at least one of $R_{201}$ to $R_{203}$ in another compound represented by formula (Z1).

The component (Z1) is more preferably a compound (ZI-1), (ZI-2) or (ZI-3) described below.

The compound (ZI-1) is an arylsulfonium compound where at least one of $R_{201}$ to $R_{203}$ in formula (Z1) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. In the case where the arylsulfonium compound has two or more aryl groups, these two or more aryl groups may be the same of different.

The alkyl group or cycloalkyl group which is present, if desired, in the arylsulfonium compound is preferably a linear or branched alkyl group having a carbon number of 1 to 15 or a cycloalkyl group having a carbon number of 3 to 15, such as methyl group, ethyl group, propyl group, n-butyl group, sec-butyl group, tert-butyl group, cyclopropyl group, cyclobutyl group and cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ each is an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, and most preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkyl group having a carbon number of 1 to 5 (e.g., methoxy, ethoxy, propoxy, butoxy, pentyloxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

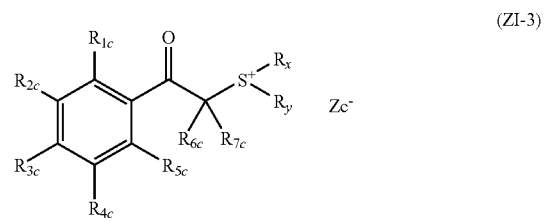

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$ or each pair of $R_{6c}$ and $R_{7c}$, and $R_x$ and $R_y$ may combine with each other to form a ring structure, and the ring structure may contain an oxygen atom, a sulfur atom, an ester bond or an amide bond. Examples of the group formed by combining any two or more members out of $R_{1c}$ to $R_{5c}$ or combining each pair of $R_{6c}$ and $R_{7c}$, and $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and this is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl), and the cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and this is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon atoms of $R_{1c}$ to $R_{5c}$ is from 2 to 15 is more preferred. In this case, the solubility in solvent is more enhanced and the generation of particles during storage is suppressed.

Examples of the alkyl group and cycloalkyl group as $R_x$ and $R_y$ include the same alkyl group and cycloalkyl group as in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group include the same alkoxy group as in $R_{1c}$ to $R_{5c}$.

$R_x$ and $R_y$ each is preferably an alkyl or cycloalkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group as $R_{204}$ to $R_{207}$ is preferably a phenyl group or a naphthyl group, more preferably a phenyl group.

The alkyl group and cycloalkyl group in $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

The aryl group, alkyl group and cycloalkyl group of $R_{204}$ to $R_{207}$ may have a substituent. Examples of the substituent which the aryl group, alkyl group and cycloalkyl group of $R_{204}$ to $R_{207}$ may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$Z^-$ represents a non-nucleophilic anion and examples thereof include the same as those of the non-nucleophilic anion of $Z^-$ in formula (ZI).

Other examples of the compound capable of decomposing upon irradiation with actinic rays or radiation to generate an acid, which can be used in combination, include the compounds represented by the following formulae (ZIV), (ZV) and (ZVI):

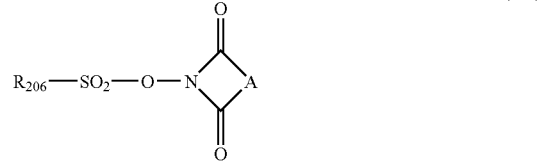

In formulae (ZIV) to (ZVI), $Ar_3$ and $Ar_4$ each independently represents an aryl group, $R_{206}$, $R_{207}$ and $R_{208}$ each independently represents an alkyl group, a cycloalkyl group or an aryl group, and A represents an alkylene group, an alkenylene group or an arylene group.

Among the compounds capable of decomposing upon irradiation with actinic rays or radiation to generate an acid, which can be used in combination, more preferred are the compounds represented by formulae (ZI) to (ZIII).

The compound of decomposing upon irradiation with actinic rays or radiation to generate an acid, which can be used in combination, is preferably a compound capable of generating an acid having one sulfonic acid group or imide group, more preferably a compound capable of generating a monovalent perfluoroalkanesulfonic acid, a compound capable of generating an aromatic sulfonic acid substituted by a fluorine atom or fluorine atom-containing group, or a compound capable of generating an imide acid substituted by a monovalent fluorine atom or fluorine atom-containing group. The acid generated by the acid generator usable in combination is most preferably a fluorinated substituted alkanesulfonic acid, fluorinated substituted benzenesulfonic acid or fluorinated substituted imide acid having a pKa of −1 or less, and in this case, the sensitivity is enhanced.

Particularly preferred examples of the compound capable of decomposing upon irradiation with actinic rays or radiation to generate an acid, which can be used in combination, are set forth below.

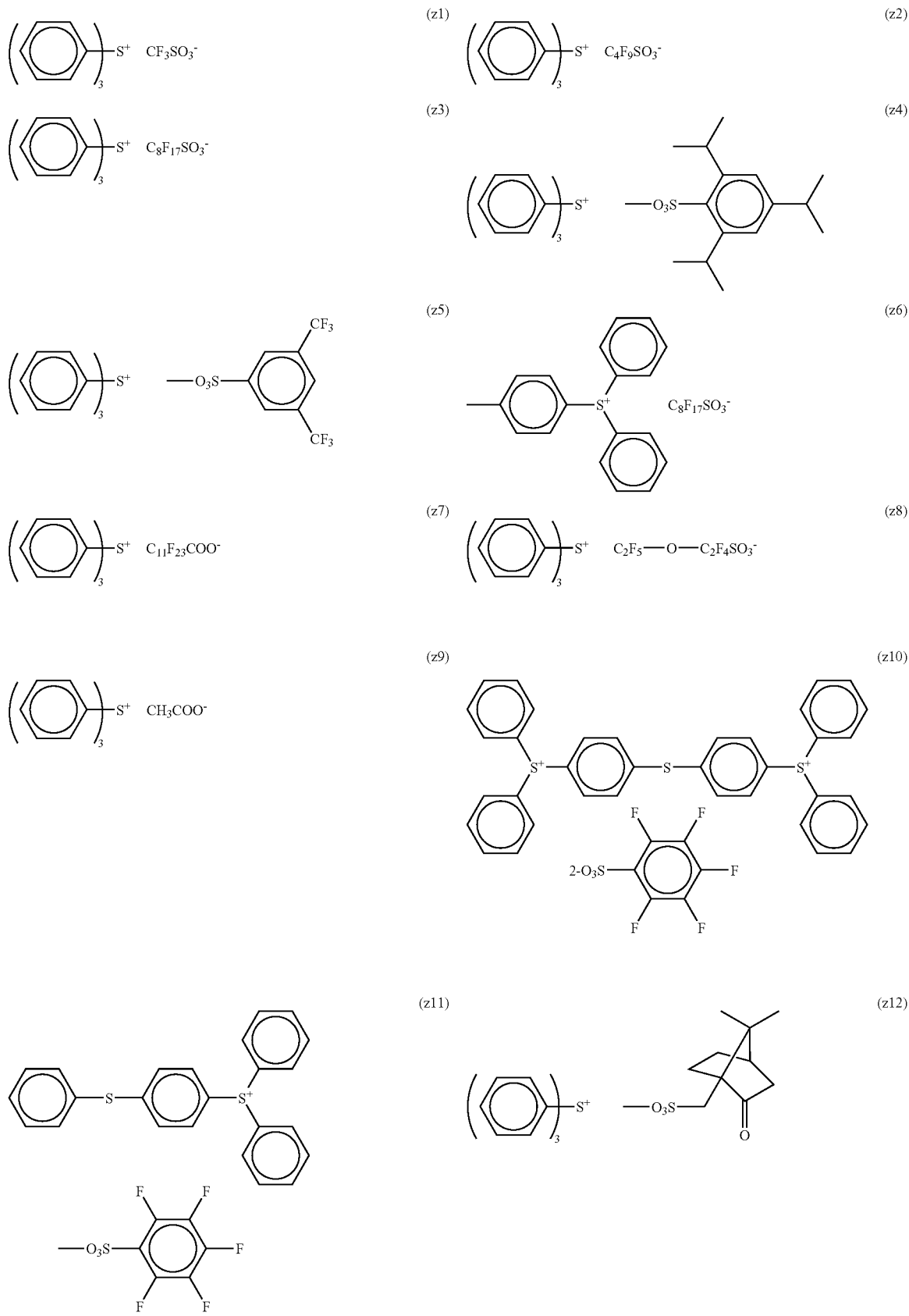

-continued

-continued
(z29) 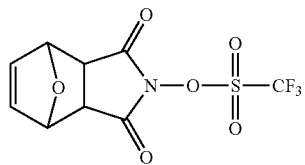
(z30) 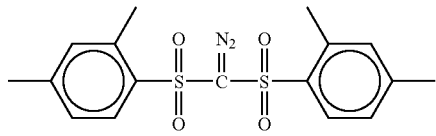
(z31) 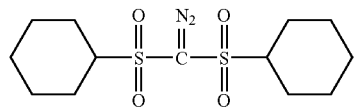
(z32) 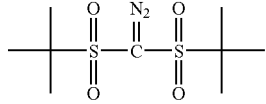
(z33) 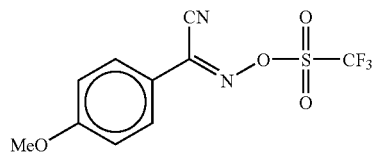
(z34) 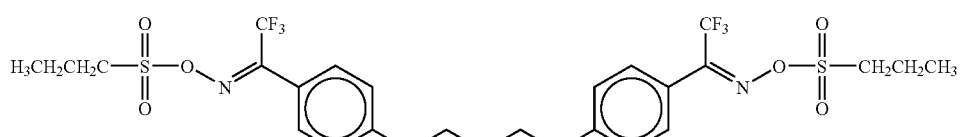
(z35) 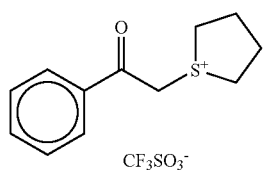
(z36) 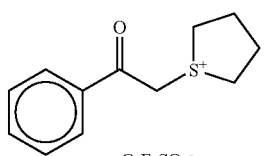
(z37) 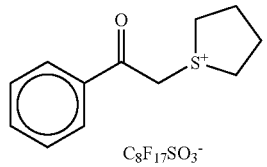
(z38) 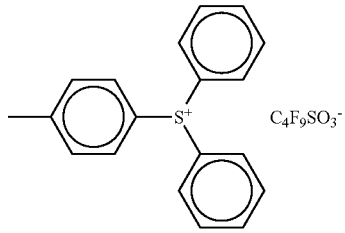
(z39) 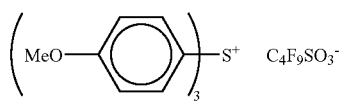
(z40) 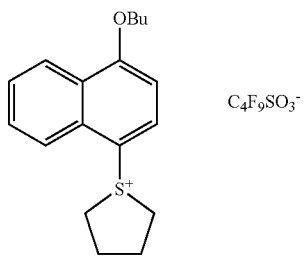
(z41) 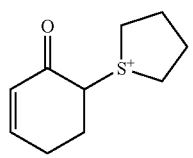
(z42) 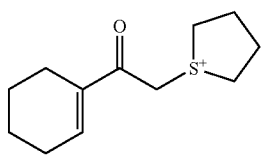

-continued
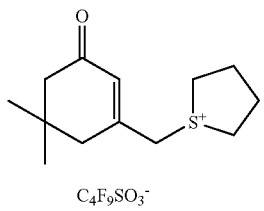
(z43)
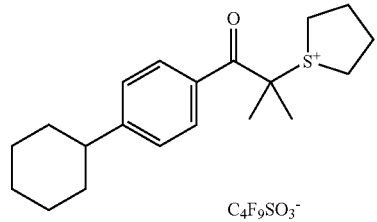
(z44)
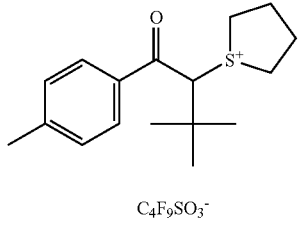
(z45)
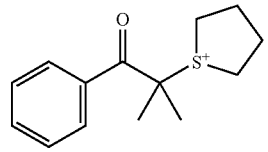
(z46)
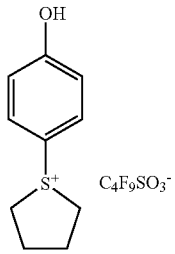
(z47)
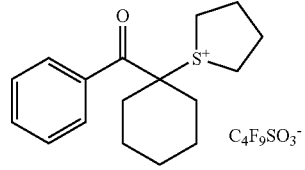
(z48)
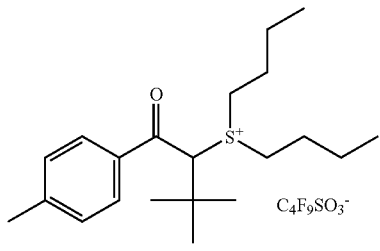
(z49)
(z50)
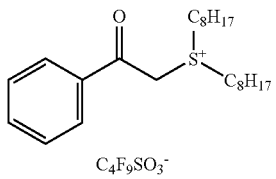
(z51)
(z52)
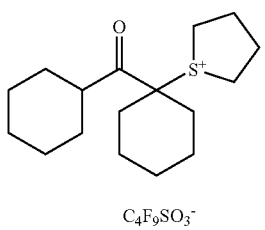
(z53)
(z54)
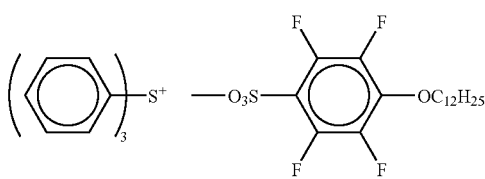
(z55)
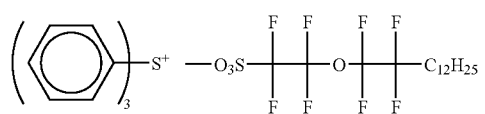
(z56)

-continued

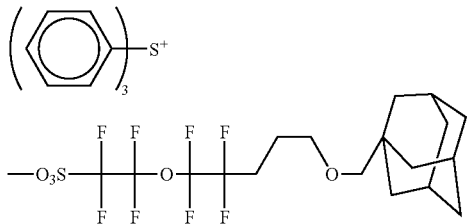 (z57)

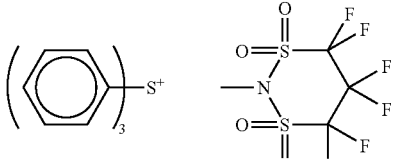 (z58)

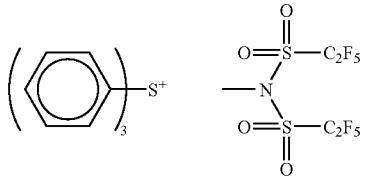 (z59)

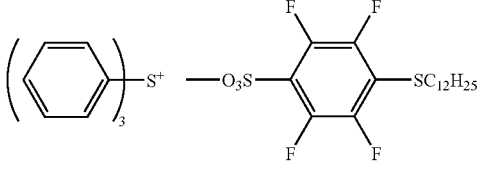 (Z60)

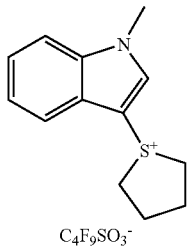 (Z61)

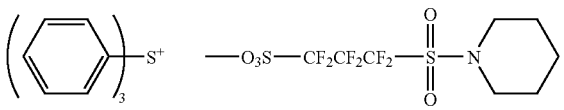 (Z62)

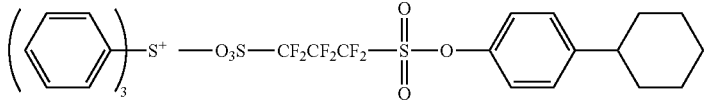 (Z63)

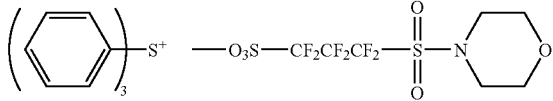 (Z64)

[2] (B) Resin Capable of Decomposing Under the Action of an Acid to Increase the Solubility in an Alkali Developer (Hereinafter Sometimes Referred to as a "Component (B)")

The resin capable of decomposing under the action of an acid to increase the solubility in an alkali developer, which is used in the positive photosensitive composition of the present invention, is a resin having, in ether one or both of the main chain and the side chain thereof, a group capable of decomposing under the action of an acid (hereinafter sometimes referred to as an "acid-decomposable group"). Of these, a resin having an acid-decomposable group in the side chain is preferred.

The group capable of decomposing under the action of an acid is preferably a group resulting from replacement of the hydrogen atom of a —COOH or —OH group with a group which splits off by the effect of an acid.

In the present invention, the acid-decomposable group is preferably an acetal group or a tertiary ester group.

In the case where the group capable of decomposing under the action of an acid is bonded as a side chain, the mother resin is an alkali-soluble resin having an —OH or —COOH group in the side chain. Examples thereof include an alkali-soluble resin described later.

The alkali dissolution rate of the alkali-soluble resin is preferably 170 A/sec or more, more preferably 330 A/sec or more (A is angstrom), as measured (at 23° C.) in 0.261N tetramethylammonium hydroxide (TMAH).

From this standpoint, the alkali-soluble resin is preferably an alkali-soluble resin having a hydroxystyrene structure unit, such as o-, m- or p-poly(hydroxystyrene) or copolymer thereof, hydrogenated poly(hydroxystyrene), halogen- or alkyl-substituted poly(hydroxystyrene), partially O-alkylated or O-acylated poly(hydroxystyrene), styrene-hydroxystyrene copolymer, α-methylstyrene-hydroxystyrene copolymer and hydrogenated novolak resin; or an alkali-soluble resin containing a repeating unit having a carboxyl group, such as (meth)acrylic acid and norbornene carboxylic acid.

Preferred examples of the repeating unit having an acid-decomposable group for use in the present invention include tert-butoxycarbonyloxystyrene, 1-alkoxyethoxystyrene and tertiary alkyl(meth)acrylate. Among these, 2-alkyl-2-adamantyl(meth)acrylate and dialkyl(1-adamantyl)methyl (meth)acrylate are preferred.

The component (B) for use in the present invention can be obtained by reacting an acid-decomposable group precursor with an alkali-soluble resin or copolymerizing an acid-decomposable group-bonded alkali-soluble resin monomer with various monomers, and this is disclosed in European Patent 254853, JP-A-2-25850, JP-A-3-223860 and JP-A-4-251259.

In the case of irradiation the positive photosensitive composition of the present invention with KrF excimer laser light, electron beam, X-ray or high-energy light at a wavelength of 50 nm or less (e.g., EUV), the resin as the component (B) preferably has a hydroxystyrene repeating unit, and the resin is more preferably a copolymer of hydroxystyrene/hydroxystyrene protected by an acid-decomposable group, or a tertiary alkyl ester of hydroxystyrene/methacrylic acid.

Specific examples of the component (B) for use in the present invention are set forth below, but the present invention is not limited thereto.

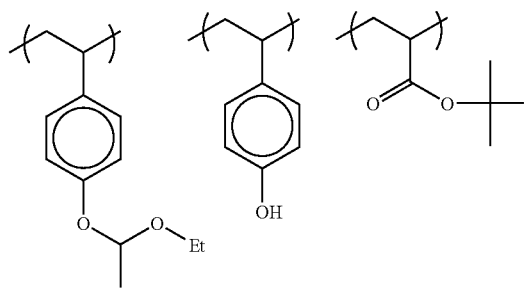

-continued

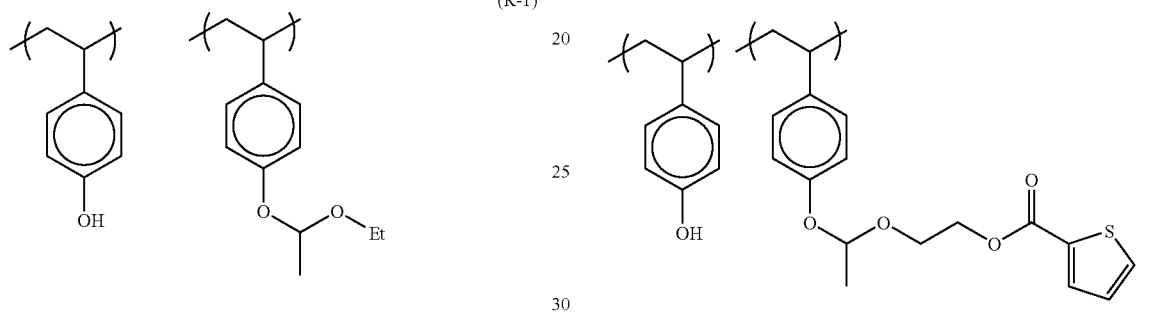

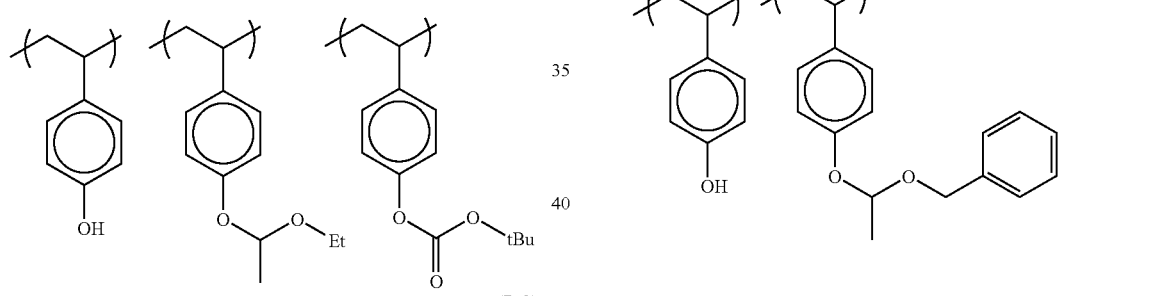

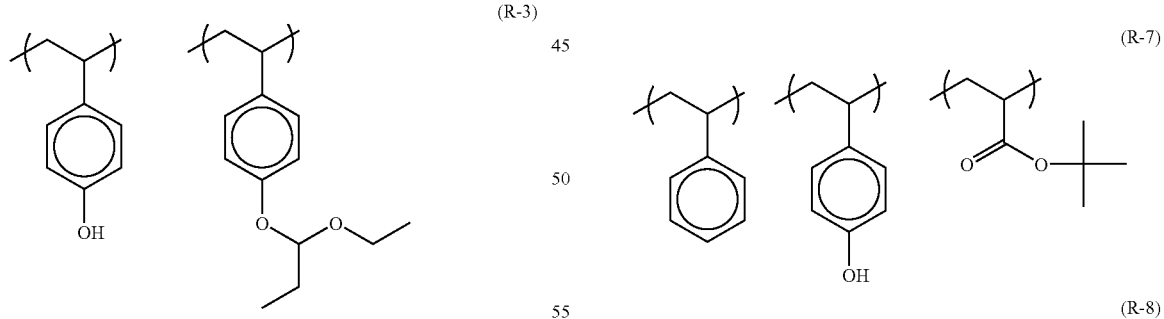

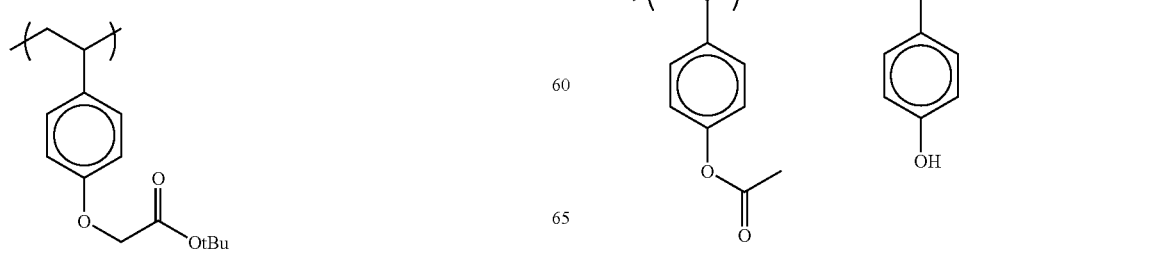

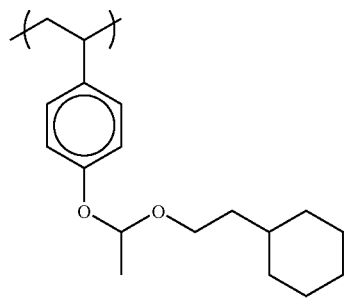
(R-9)
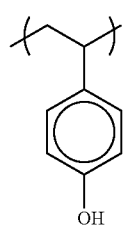 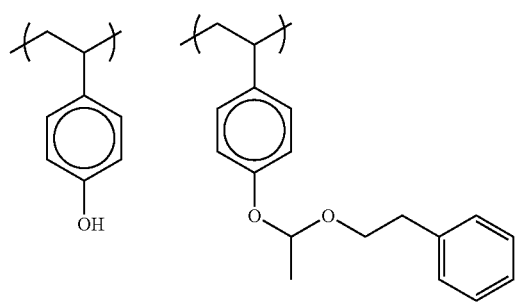
(R-10)
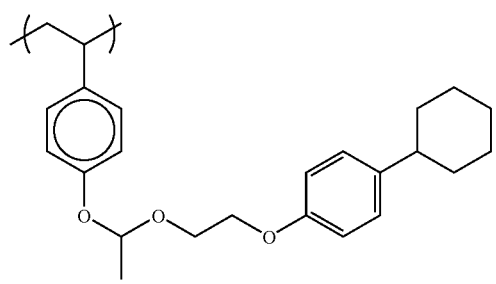
(R-11)
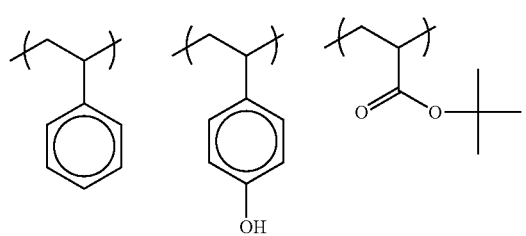
(R-12)
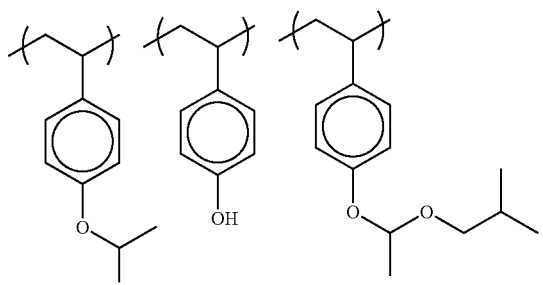
(R-13)
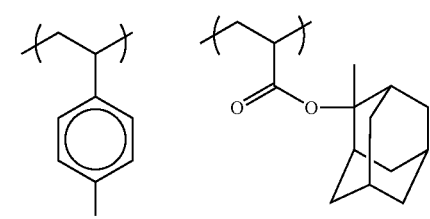
(R-14)
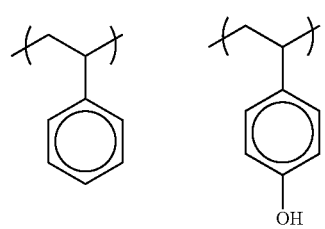
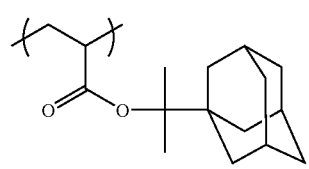

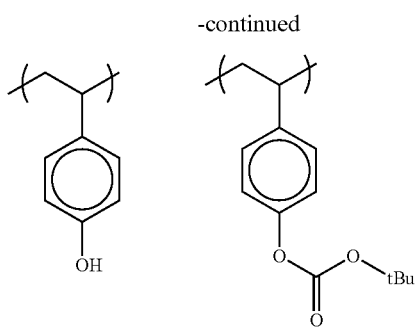

(R-15)

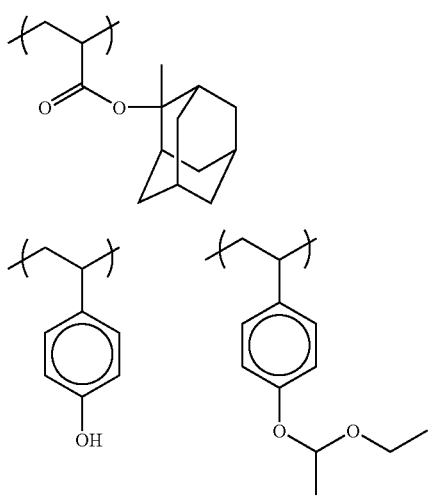

(R-16)

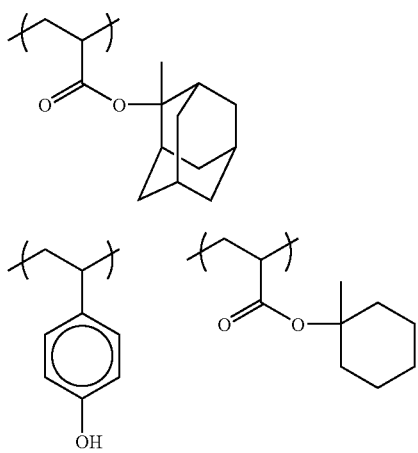

(R-17)

In these specific examples, "tBu" indicates a tert-butyl group.

The content of the group capable of decomposing under the action of an acid is expressed by B/(B+S) using the number (B) of acid-decomposable groups in the resin and the number (S) of alkali-soluble groups not protected by a group which splits off by the effect of an acid. The content is preferably from 0.01 to 0.7, more preferably from 0.05 to 0.50, still more preferably from 0.05 to 0.40.

In the case of irradiating the positive photosensitive composition of the present invention with ArF excimer laser light, the resin as the component (B) is preferably a resin having a monocyclic or polycyclic alicyclic hydrocarbon structure and undergoing decomposition under the action of an acid to increase the solubility in an alkali developer.

The resin having a monocyclic or polycyclic alicyclic hydrocarbon structure and undergoing decomposition under the action of an acid to increase the solubility in an alkali developer (hereinafter sometimes referred to as an "alicyclic hydrocarbon-based acid-decomposable resin") is preferably a resin containing at least one repeating unit selected from the group consisting of a repeating unit having a partial structure containing an alicyclic hydrocarbon represented by any one of the following formulae (pI) to (pV), and a repeating unit represented by the following formula (II-AB):

(pI)

(pII)

(pIII)

(pIV)

(pV)

wherein $R_{11}$ represents a methyl group, an ethyl group, an n-propyl group, an isopropyl group, an n-butyl group, an isobutyl group or a sec-butyl group, Z represents an atomic group necessary for forming a cycloalkyl group together with the carbon atom, $R_{12}$ to $R_{16}$ each independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group, $R_{17}$ to $R_2$, each independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group, $R_{22}$ to $R_{25}$ each independently represents a hydrogen atom, a linear or branched alkyl group having a carbon number of 1 to 4, or a cycloalkyl group, provided that at least one of $R_{22}$ to $R_{25}$ represents a cycloalkyl group, and $R_{23}$ and $R_{24}$ may combine with each other to form a ring.

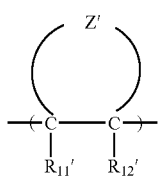
(II-AB)

wherein $R_{11}'$ and $R_{12}'$ each independently represents a hydrogen atom, a cyano group, a halogen atom or an alkyl group, and $Z'$ represents an atomic group for forming an alicyclic structure, containing two bonded carbon atoms (C—C).

Formula (II-AB) is preferably the following formula (II-AB1) or (II-AB2).

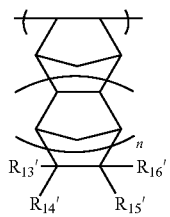
(II-AB1)

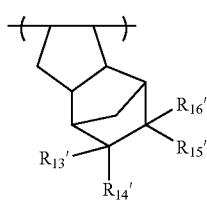
(II-AB2)

In formulae (II-AB1) and (II-AB2), $R_{13}'$ to $R_{16}'$ each independently represents a hydrogen atom, a halogen atom, a cyano group, a hydroxyl group, —COOH, —COOR$_5$, a group capable of decomposing under the action of an acid, —C(=O)—X-A'-R$_{17}'$, an alkyl group or a cycloalkyl group, and at least two members out of $R_{13}'$ to $R_{16}'$ may combine to form a ring, $R_5$ represents an alkyl group, a cycloalkyl group or a group having a lactone structure, X represents an oxygen atom, a sulfur atom, —NH—, —NHSO$_2$— or —NHSO$_2$NH—, A' represents a sing bond or a divalent linking group, $R_{17}'$ represents —COOH, —COOR$_5$, —CN, a hydroxyl group, an alkoxy group, —CO—NH—R$_6$, —CO—NH—SO$_2$—R$_6$ or a group having a lactone structure, $R_6$ represents an alkyl group or a cycloalkyl group, and n represents 0 or 1.

In formulae (pI) to (pV), the alkyl group of $R_{12}$ to $R_{25}$ is a linear or branched alkyl group having from 1 to 4 carbon atoms, and examples thereof include a methyl group, an ethyl group, a propyl group, an n-butyl group, a sec-butyl group and a tert-butyl group.

The cycloalkyl group of $R_{12}$ to $R_{25}$ and the cycloalkyl group formed by Z together with the carbon atom may be monocyclic or polycyclic. Specific examples thereof include a group having a monocyclic, bicyclic, tricyclic or tetracyclic structure with a carbon number of 5 or more. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

These alkyl group and cycloalkyl group each may further have a substituent. Examples of the substituent which the alkyl group and cycloalkyl group may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). These alkyl group, alkoxy group, alkoxycarbonyl group and the like each may further have a substituent. Examples of the substituent which the alkyl group, alkoxy group, alkoxycarbonyl group and the like may further have include a hydroxyl group, a halogen atom and an alkoxy group.

The structures represented by formulae (pI) to (pV) each can be used for the protection of an alkali-soluble group in the resin. Examples of the alkali-soluble group include various groups known in this technical field.

Specific examples thereof include a structure where the hydrogen atom of a carboxylic acid group, a sulfonic acid group, a phenol group or a thiol group is replaced by the structure represented by any one of formulae (pI) to (pV). A structure where the hydrogen atom of a carboxylic acid group or a sulfonic acid group is replaced by the structure represented by any one of formulae (pI) to (pV) is preferred.

The repeating unit having an alkali-soluble group protected by the structure represented by any one of formulae (pI) to (pV) is preferably a repeating unit represented by the following formula (pA):

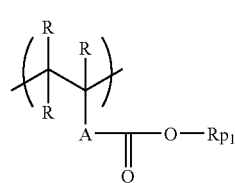
(pA)

In formula (pA), R represents a hydrogen atom, a halogen atom or a linear or branched alkyl group having a carbon number of 1 to 4, and a plurality of R's may be the same or different.

A represents a single bond, or one group or a combination of two or more groups, selected from the group consisting of an alkylene group, an ether group, a thioether group, a carbonyl group, an ester group, an amido group, a sulfonamido group, a urethane group and a urea group. A is preferably a single bond.

$Rp_1$ represents any one group of formulae (pI) to (pV).

The repeating unit represented by formula (pA) is most preferably a repeating unit comprising a 2-alkyl-2-adamantyl (meth)acrylate or a dialkyl(1-adamantyl)methyl (meth)acrylate.

Specific examples of the repeating unit represented by formula (pA) are set forth below.

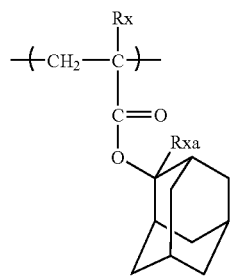
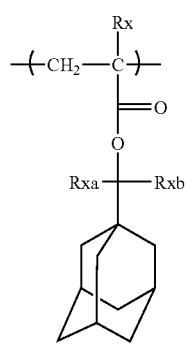
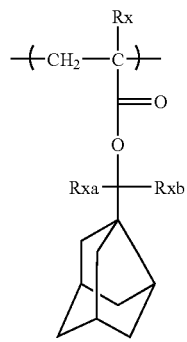
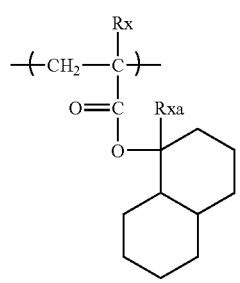
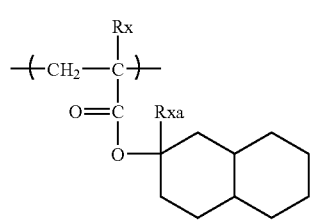
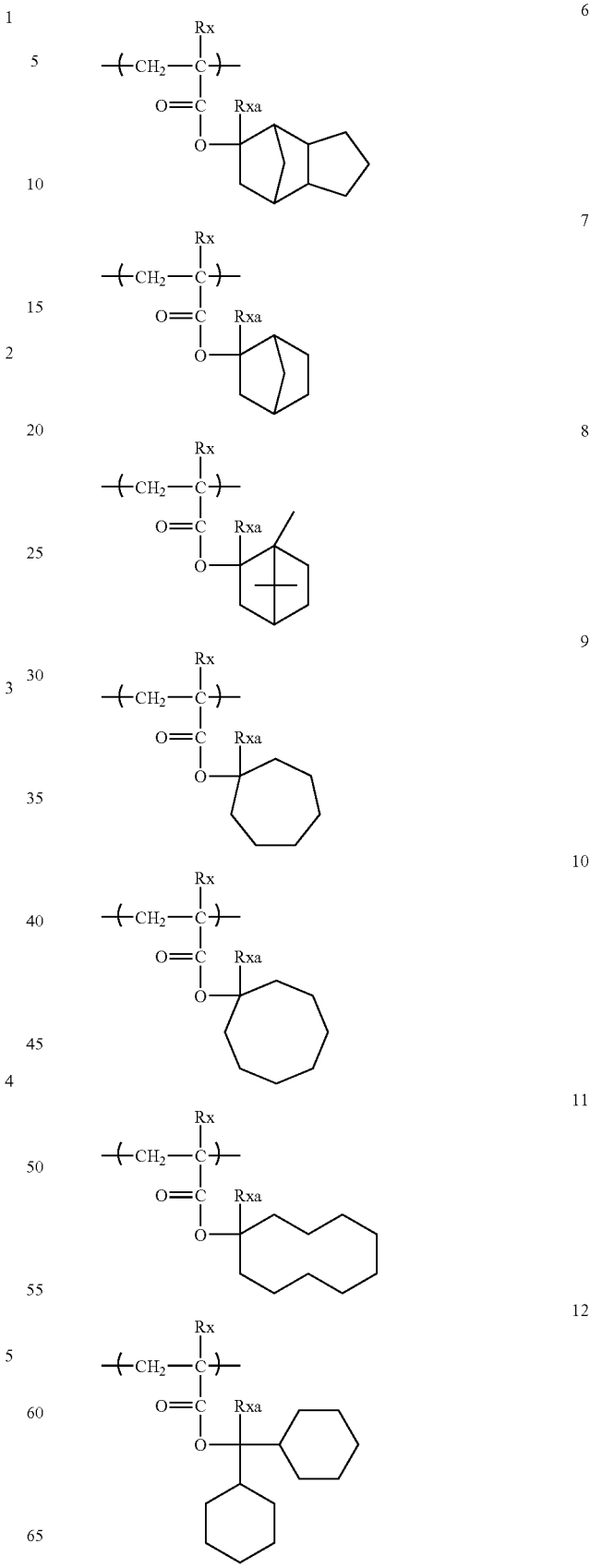

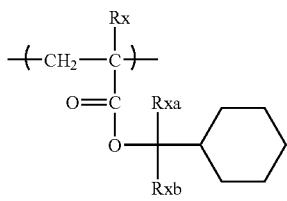

13

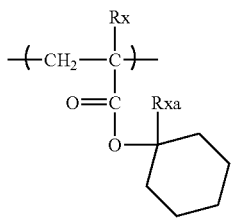

14

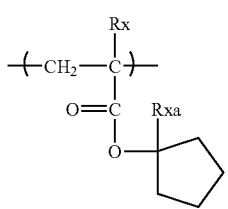

15

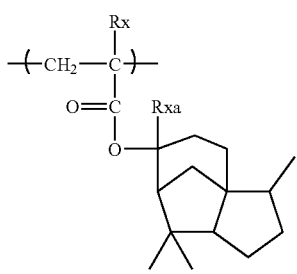

16

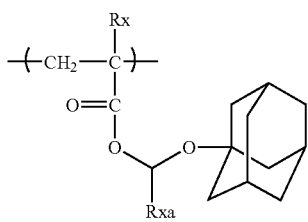

17

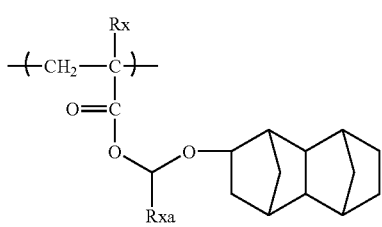

18

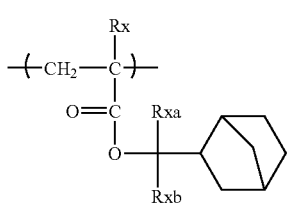

19

In the formulae above, Rx represents H, CH$_3$, CF$_3$ or CH$_2$OH, and Rxa and Rxb each independently represents an alkyl group having a carbon number of 1 to 4.

Examples of the halogen atom of R$_{11}'$ and R$_{12}'$ in formula (II-AB) include a chlorine atom, a bromine atom, a fluorine atom and an iodine atom.

The alkyl group of R$_{11}'$ and R$_{12}'$ is preferably a linear or branched alkyl group having a carbon number of 1 to 10, and examples thereof include a methyl group, an ethyl group, an n-propyl group, an isopropyl group and a linear or branched butyl, pentyl, hexyl or heptyl group.

The atomic group of Z' for forming an alicyclic structure is an atomic group for forming, in the resin, an alicyclic hydrocarbon repeating unit which may have a substituent, and among these atomic groups, an atomic group for forming a crosslinked alicyclic structure to form a crosslinked alicyclic hydrocarbon repeating unit is preferred.

Examples of the skeleton of the alicyclic hydrocarbon formed include the same as those of the cycloalkyl group of R$_{12}$ to R$_{25}$ in formulae (pI) to (pVI).

The alicyclic hydrocarbon skeleton may have a substituent, and examples of the substituent include R$_{13}'$ to R$_{16}'$ in formulae (II-AB1) and (II-AB2).

In the alicyclic hydrocarbon-based acid-decomposable resin for use in the present invention, the group capable of decomposing under the action of an acid may be contained in at least one repeating unit out of the repeating unit having a partial structure containing an alicyclic hydrocarbon represented by any one of formulae (pI) to (pV), the repeating unit represented by formula (II-AB), and the repeating unit comprising a copolymerization component which is described later.

Various substituents R$_{13}'$ to R$_{16}'$ in formulae (II-AB1) and (II-AB2) may work out to the substituents of an atomic group for forming an alicyclic structure in formula (II-AB) or an atomic group Z for forming a crosslinked alicyclic structure.

Specific examples of the repeating units represented by formulae (II-AB1) and (II-AB2) are set forth below, but the present invention is not limited thereto.

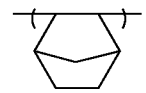

[II-1]

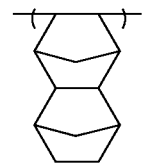

[II-2]

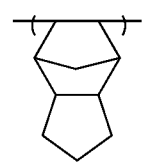

[II-3]

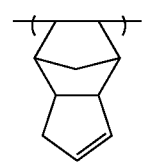

[II-4]

-continued
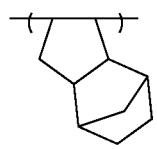 [II-5]
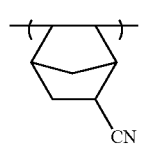 [II-6]
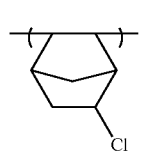 [II-7]
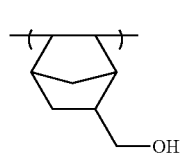 [II-8]
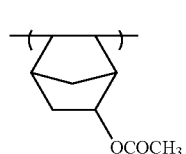 [II-9]
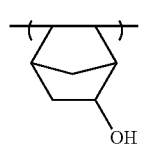 [II-10]
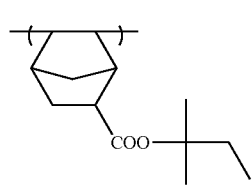 [II-11]
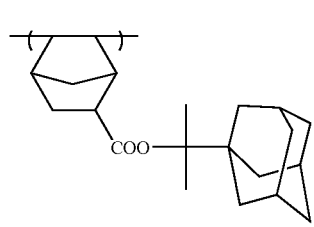 [II-12]
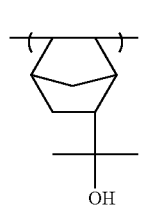 [II-13]
-continued
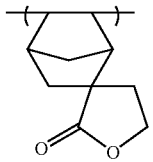 [II-14]
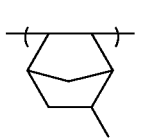 [II-15]
 [II-16]
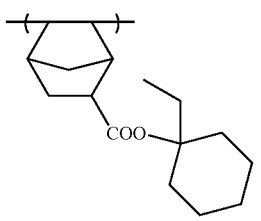 [II-17]
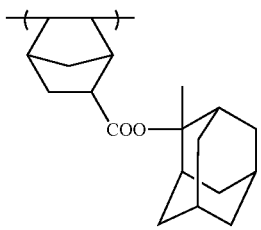 [II-18]
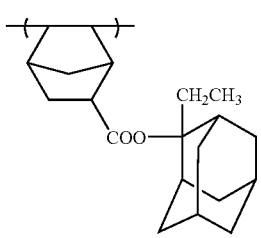 [II-19]
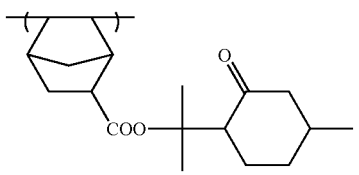 [II-19]
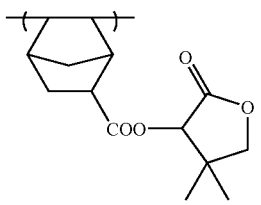 [II-20]

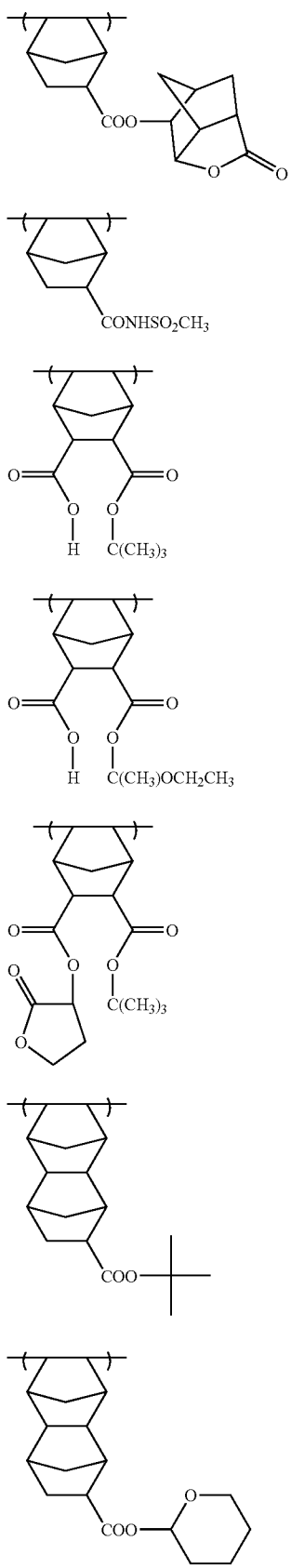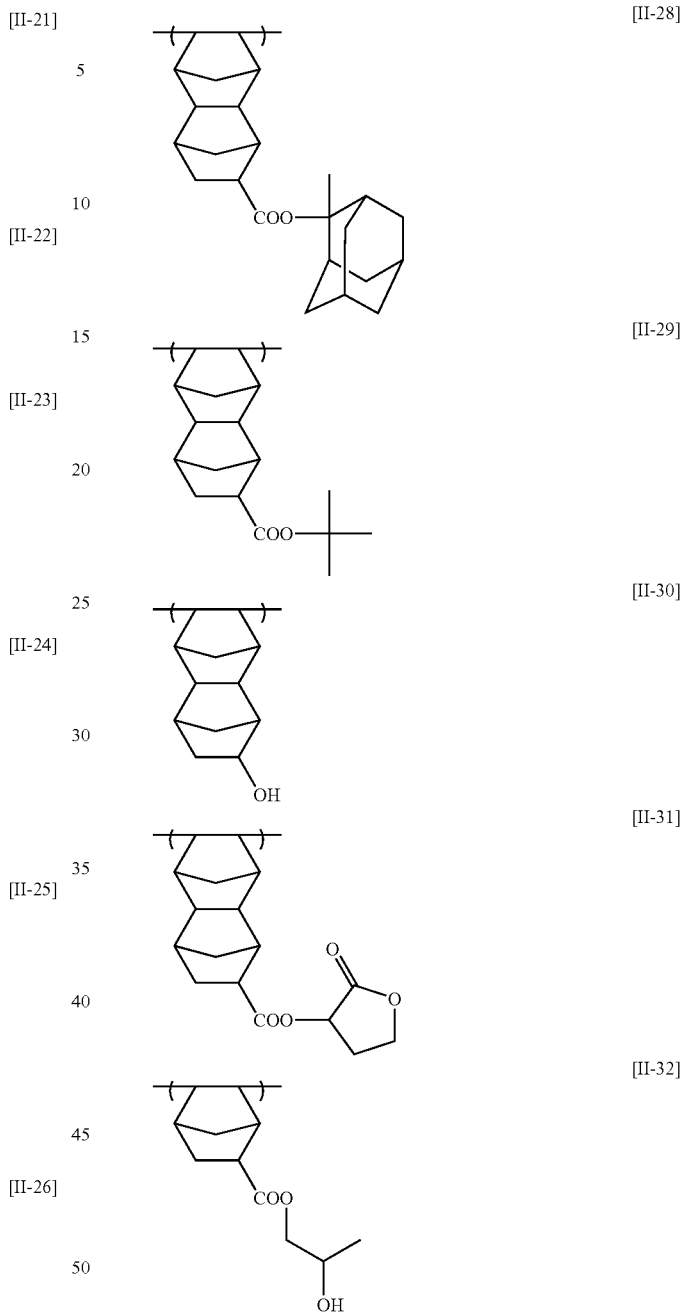

The alicyclic hydrocarbon-based acid-decomposable resin for use in the present invention preferably has a repeating unit having a lactone group. As for the lactone group, any group may be used as long as it has a lactone structure, but a group having a 5-, 6- or 7-membered ring lactone structure is preferred. The 5-, 6- or 7-membered ring structure is preferably condensed with another ring structure in the form of forming a bicyclo structure or a spiro structure. The alicyclic hydrocarbon-based acid-decomposable resin for use in the present invention more preferably has a repeating unit containing a group having a lactone structure represented by any one of the following formulae (LC1-1) to (LC1-16). The group having a lactone structure may be bonded directly to the main chain. Among these lactone structures, (LC1-1), (LC1-4), (LC1-5), (LC1-6), (LC1-13) and (LC1-14) are preferred. By using a specific lactone structure, the line edge roughness and the development defect are improved.
LC1-1
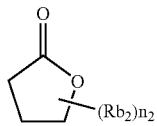
LC1-2
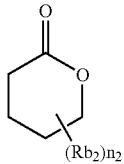
LC1-3
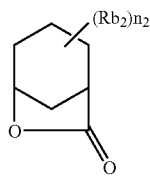
LC1-4
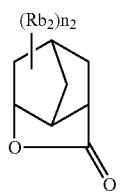
LC1-5
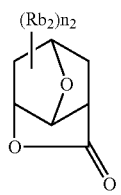
LC1-6
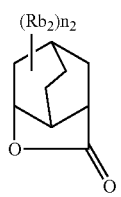
LC1-7
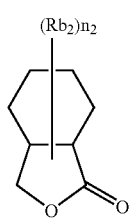
LC1-8
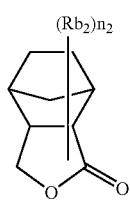
-continued
LC1-9
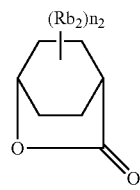
LC1-10
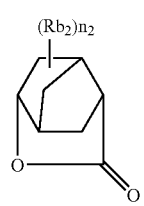
LC1-11
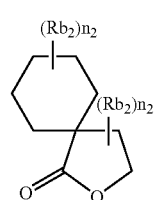
LC1-12
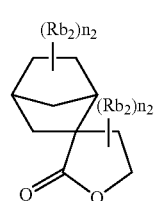
LC1-13
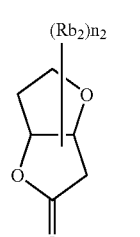
LC1-14
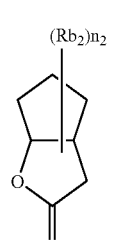
LC1-15
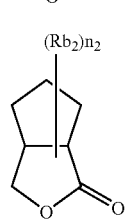

-continued

LC1-16

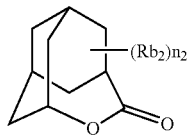

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. $n_2$ represents an integer of 0 to 4. When $n_2$ is an integer of 2 or more, the plurality of $Rb_2$'s may be the same or different, and $Rb_2$'s may combine with each other to form a ring.

Examples of the repeating unit having a lactone structure represented by any one of formulae (LC1-1) to (LC1-16) include a repeating unit where at least one of $R_{13}$' to $R_{16}$' in formula (II-AB1) or (II-AB2) has a group represented by any one of formulae (LC1-1) to (LC1-16) (for example, $R_5$ of —$COOR_5$ is a group represented by any one of formulae (LC1-1) to (LC1-16)), and a repeating unit represented by the following formula (AI):

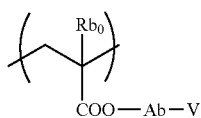

(AI)

In formula (AI), $Rb_0$ represents a hydrogen atom, a halogen atom or an alkyl group having a carbon number of 1 to 4.

Examples of the alkyl group of $Rb_0$ include a methyl group, an ethyl group, a propyl group, an n-butyl group, a sec-butyl group and a tert-butyl group. The alkyl group of $Rb_0$ may have a substituent. Preferred examples of the substituent which the alkyl group of $Rb_0$ may have include a hydroxyl group and a halogen atom.

Examples of the halogen atom of $Rb_0$ include a fluorine atom, a chlorine atom, a bromine atom and an iodine atom. $Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent group comprising a combination thereof, preferably a single bond or a linking group represented by -$Ab_1$-$CO_2$—.

$Ab_1$ is a linear or branched alkylene group or a monocyclic or polycyclic cycloalkylene group, preferably a methylene group, an ethylene group, a cyclohexyl residue, an adamantyl residue or a norbornyl residue.

V represents a group represented by any one of formulae (LC1-1) to (LC1-16).

The repeating unit having a lactone structure usually has an optical isomer, but any optical isomer may be used. One optical isomer may be used alone or a mixture of a plurality of isomers may be used. In the case of mainly using one optical isomer, the optical purity (ee) thereof is preferably 90 or more, more preferably 95 or more.

Specific examples of the repeating unit containing a group having a lactone structure are set forth below, but the present invention is not limited thereto.

(In formulae, Rx is H, $CH_3$, $CH_2OH$ or $CF_3$.)

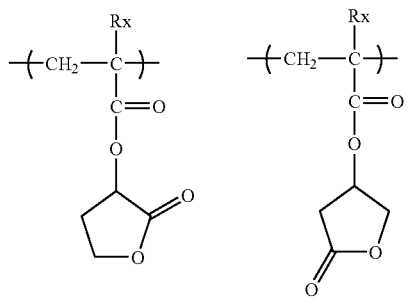

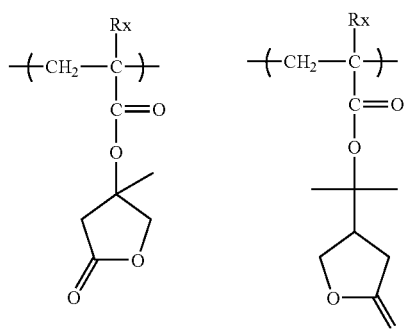

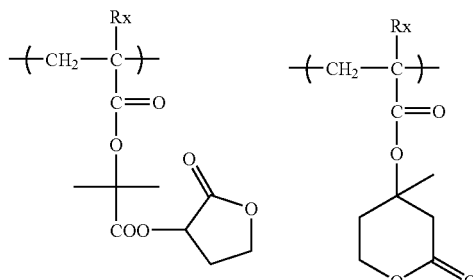

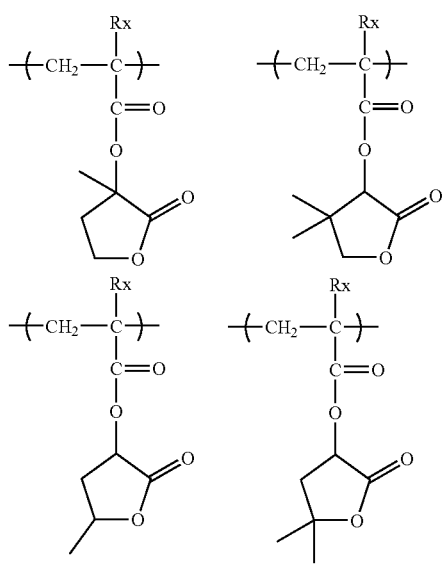

-continued
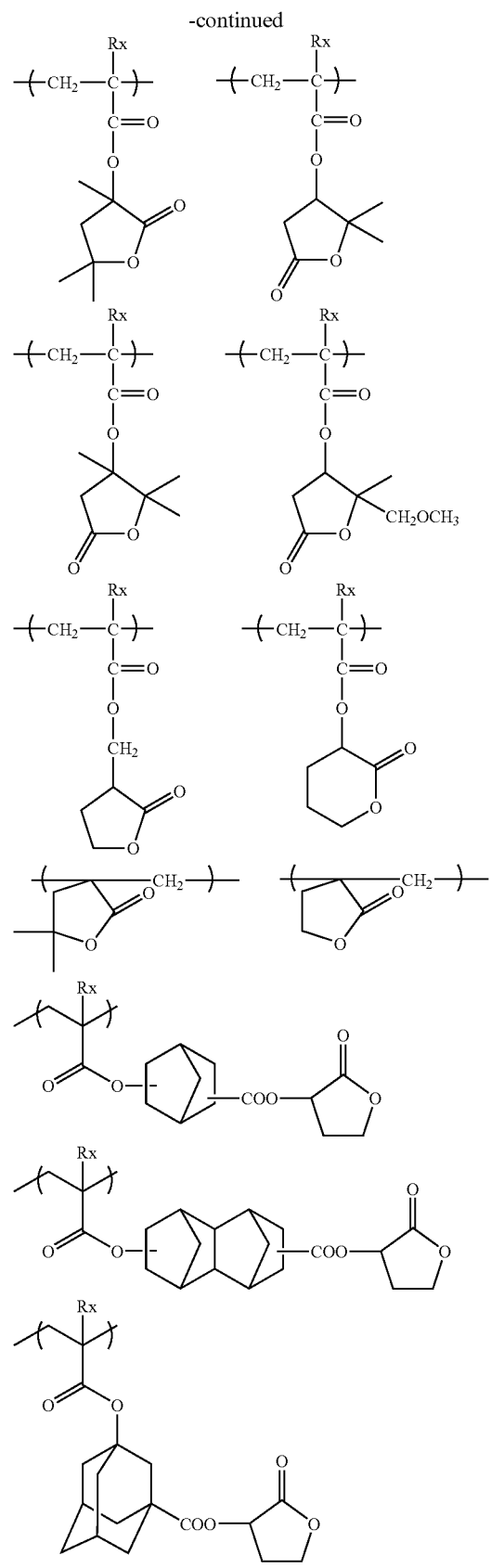
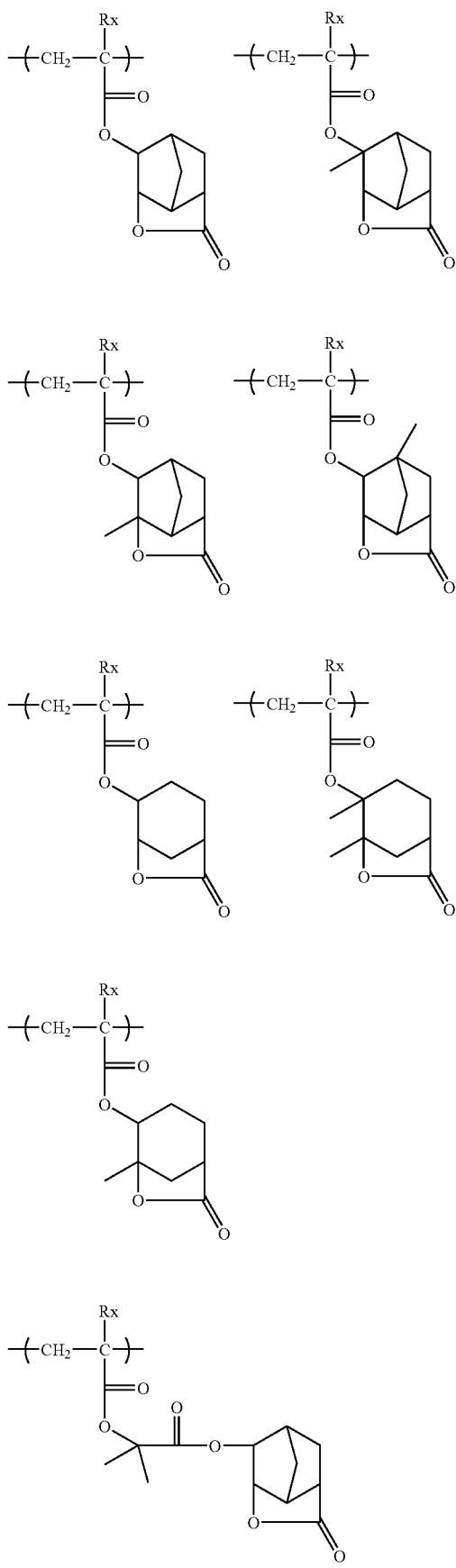
(In formulae, Rx is H, CH₃, CH₂OH or CF₃.)

-continued
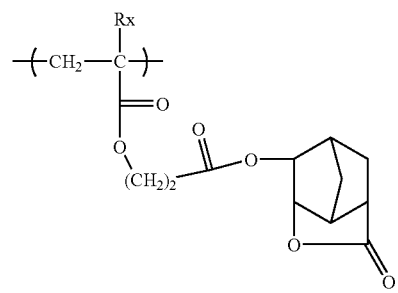
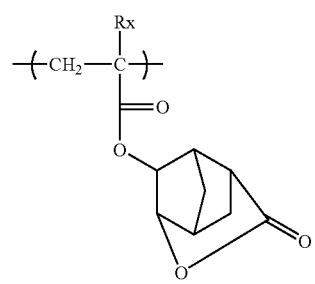
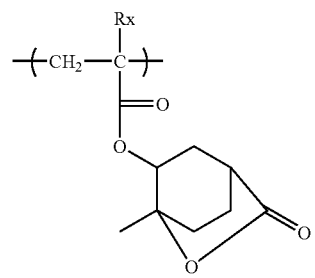
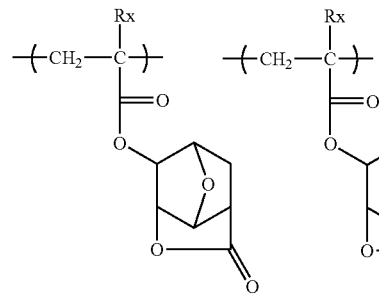
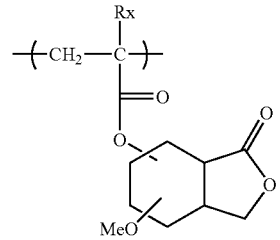
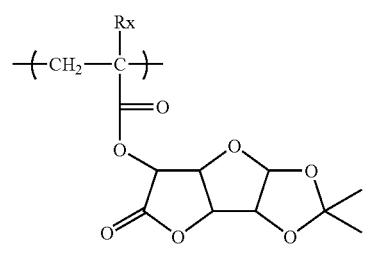
-continued
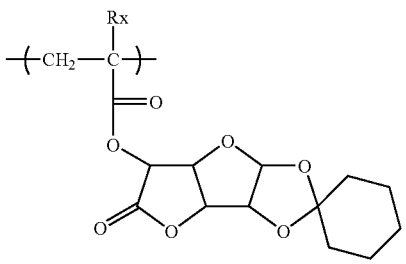
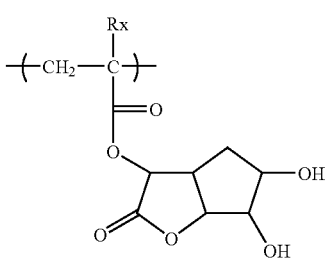
(In formulae, Rx is H, CH$_3$, CH$_2$OH or CF$_3$.)
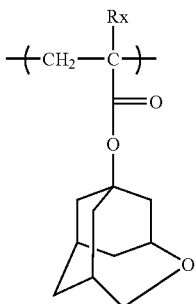 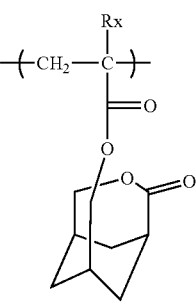
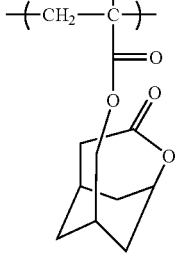
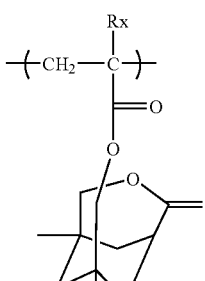
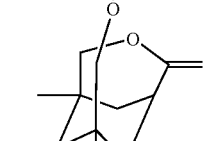
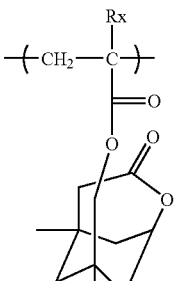

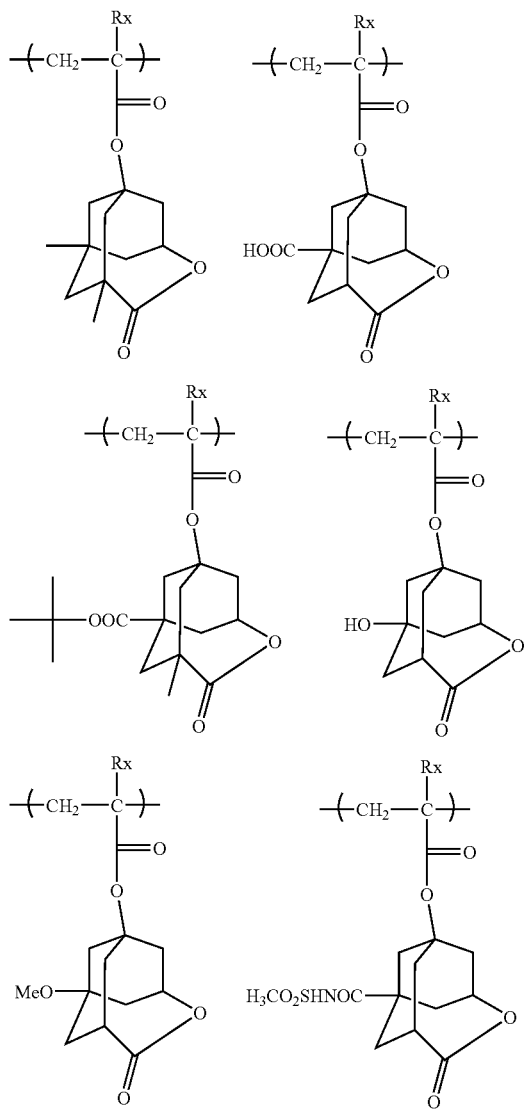

The alicyclic hydrocarbon-based acid-decomposable resin for use in the present invention preferably contains a repeating unit having an alicyclic hydrocarbon structure substituted by a polar group. By having this repeating unit, the adhesion to substrate and the affinity for developer are enhanced. The polar group is preferably a hydroxyl group or a cyano group.

Examples of the alicyclic hydrocarbon structure represented by a polar group include a structure represented by the following formula (VIIa) or (VIIb):

(VIIa)

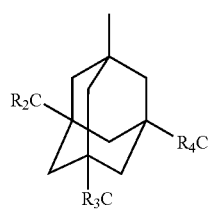

(VIIb)

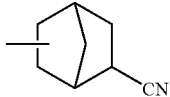

In formula (VIIa), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. Preferably, one or two members out of $R_{2c}$ to $R_{4c}$ is a hydroxyl group with the remaining being a hydrogen atom, and more preferably, two members out of $R_{2c}$ to $R_{4c}$ are a hydroxyl group with the remaining being a hydrogen atom.

The group represented by formula (VIIa) is preferably a dihydroxy form or a monohydroxy form, more preferably a dihydroxy form.

Examples of the repeating unit having a group represented by formula (VIIa) or (VIIb) include a repeating unit where at least one of $R_{13}'$ to $R_{16}'$ in formula (II-AB1) or (II-AB2) has a group represented by formula (VIIa) or (VIIb) (for example, where $R_5$ in —$COOR_5$ is a group represented by formula (VIIa) or (VIIb)), and a repeating unit represented by the following formula (AIIa) or (AIIb):

(AIIa)

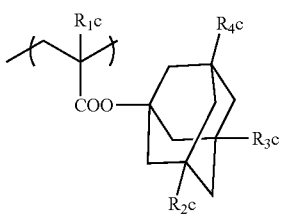

(AIIb)

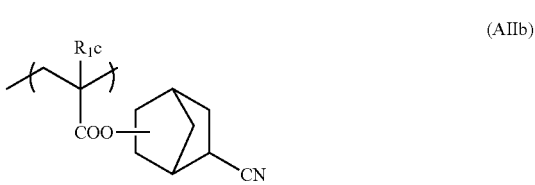

In formulae (AIIa) and (AIIb), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formula (VIIa).

Specific examples of the repeating unit having an alicyclic hydrocarbon structure substituted by a polar group, represented by formula (AIIa) or (AIIb), are set forth below, but the present invention is not limited thereto.

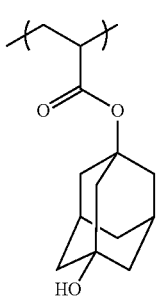 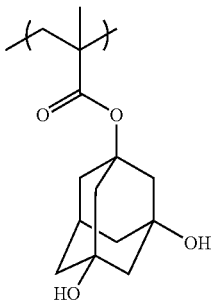

-continued

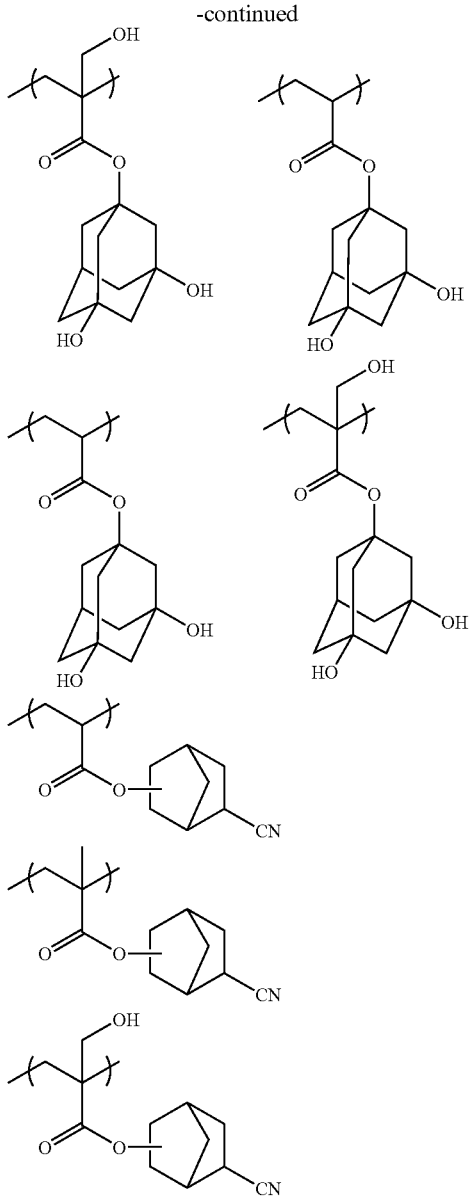

The alicyclic hydrocarbon-based acid-decomposable resin for use in the present invention may contain a repeating unit represented by the following formula (VIII):

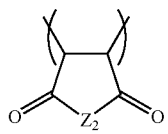
(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably a fluorine atom) or the like.

Specific examples of the repeating unit represented by formula (VIII) are set forth below, but the present invention is not limited thereto.

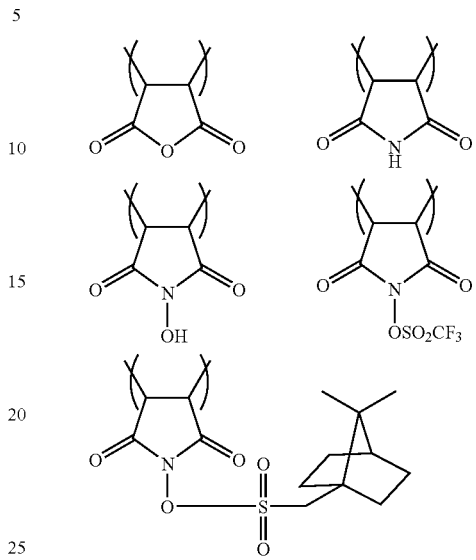

The alicyclic hydrocarbon-based acid-decomposable resin for use in the present invention preferably contains a repeating unit having an alkali-soluble group, more preferably a repeating unit having a carboxyl group. By containing such a repeating unit, the resolution increases in usage of forming contact holes. The repeating unit having a carboxyl group is preferably a repeating unit where a carboxyl group is directly bonded to the resin main chain, such as repeating unit by an acrylic acid or a methacrylic acid, or a repeating unit where a carboxyl group is bonded to the resin main chain through a linking group. The linking group may have a monocyclic or polycyclic hydrocarbon structure. An acrylic acid and a methacrylic acid are most preferred.

The alicyclic hydrocarbon-based acid-decomposable resin for use in the present invention may contain a repeating unit having from 1 to 3 groups represented by the following formula (F1). By containing this repeating unit, the line edge roughness performance is enhanced.

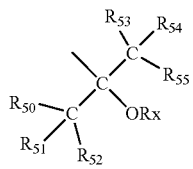
(F1)

In formula (F1), $R_{50}$ to $R_{55}$ each independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom.

Rx represents a hydrogen atom or an organic group (preferably an acid-decomposable protective group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like, and is preferably an alkyl group having a carbon number of 1 to 3, such as methyl group and trifluoromethyl group.

It is preferred that $R_{50}$ to $R_{55}$ all are a fluorine atom.

The organic group represented by Rx is preferably an acid-decomposable group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following formula (F2):

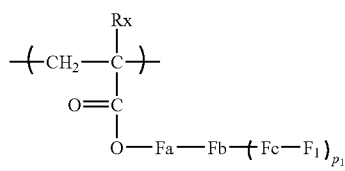

In formula (F2), Rx represents a hydrogen atom, a halogen atom or an alkyl group having a carbon number of 1 to 4. Preferred examples of the substituent which the alkyl group of Rx may have include a hydroxyl group and a halogen atom.

Fa represents a single bond or a linear or branched alkylene group and is preferably a single bond.

Fb represents a monocyclic or polycyclic hydrocarbon group.

Fc represents a single bond or a linear or branched alkylene group and is preferably a single bond or a methylene group.

$F_1$ represents a group represented by formula (F1).

$p_1$ represents a number of 1 to 3.

The cyclic hydrocarbon group in Fb is preferably a cyclopentyl group, a cyclohexyl group or a norbornyl group.

Specific examples of the repeating unit having a structure of formula (F1) are set forth below.

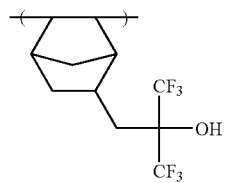

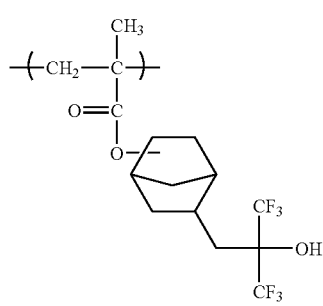

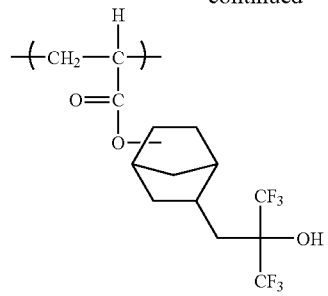

The alicyclic hydrocarbon-based acid-decomposable resin for use in the present invention may contain, in addition to the above-described repeating units, various repeating structural units for the purpose of controlling the dry etching resistance, suitability for standard developer, adhesion to substrate, resist profile and properties generally required of the resist, such as resolving power, heat resistance and sensitivity.

Examples of such a repeating structural unit include; but are not limited to, repeating structural units corresponding to the monomers described below.

By containing such a repeating structural unit, the performance required of the alicyclic hydrocarbon-based acid-decomposable resin, particularly, (1) solubility in the coating solvent,
(2) film-forming property (glass transition point),
(3) alkali developability,
(4) film loss (selection of hydrophilic, hydrophobic or alkali-soluble group),
(5) adhesion of unexposed part to substrate,
(6) dry etching resistance and the like, can be subtly controlled.

Examples of the monomer include a compound having one addition-polymerizable unsaturated bond, selected from acrylic acid esters, methacrylic acid esters, acrylamides, methacrylamides, allyl compounds, vinyl ethers and vinyl esters.

Other than these, an addition-polymerizable unsaturated compound copolymerizable with the monomer corresponding to the above-described various repeating structural units may be copolymerized.

In the alicyclic hydrocarbon-based acid-decomposable resin, the molar ratio of respective repeating structural units contained is appropriately determined to control the dry etching resistance of resist, suitability for standard developer, adhesion to substrate, resist profile and performances generally required of the resist, such as resolving power, heat resistance and sensitivity.

The preferred embodiment of the alicyclic hydrocarbon-based acid-decomposable resin for use in the present invention includes the followings:

(1) a resin containing a repeating unit having an alicyclic hydrocarbon-containing partial structure represented by any one of formulae (pI) to (pV) (side chain type), preferably containing a repeating unit by a (meth)acrylate having a structure represented by any one of formulae (pI) to (pV), and (2) a resin containing a repeating unit represented by formula (II-AB) (main chain type).

The resin of (2) further includes:

(3) a resin having a repeating unit represented by formula (II-AB), a maleic anhydride derivative structure and a (meth)acrylate structure (hybrid type).

In the alicyclic hydrocarbon-based acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the alicyclic hydrocarbon-based acid-decomposable resin, the content of the repeating unit having an alicyclic hydrocarbon-containing partial structure represented by any one of formulae (pI) to (pV) is preferably from 25 to 70 mol %, more preferably from 35 to 65 mol %, still more preferably from 40 to 60 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

In the resin, the content of the repeating unit based on the monomer as the further copolymerization component can also be appropriately selected according to the desired resist performance, but the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

When the composition of the present invention is used for exposure with ArF, the resin preferably has no aromatic group in view of the transparency to ArF light.

The alicyclic hydrocarbon-based acid-decomposable resin for use in the present invention is preferably a resin where all repeating units comprise a (meth)acrylate repeating unit. In this case, the repeating units may be all a methacrylate, all an acrylate, or a mixture of methacrylate/acrylate, but the content of the acrylate repeating unit is preferably 50 mol % or less based on all repeating units.

The alicyclic hydrocarbon-based acid-decomposable resin for use in the present invention is more preferably a ternary copolymerization polymer comprising from 25 to 50% of the repeating unit having an alicyclic hydrocarbon-containing partial structure represented by any one of formulae (pI) to (pV), from 25 to 50% of the repeating unit having a lactone structure and from 5 to 30% of the repeating unit having an alicyclic hydrocarbon structure substituted by a polar group, or a quaternary copolymerization polymer additionally comprising from 5 to 20% of the repeating unit having a carboxyl group or a structure represented by formula (F1).

The alicyclic hydrocarbon-based acid-decomposable resin for use in the present invention can be synthesized by an ordinary method (for example, radical polymerization). Examples of the synthesis method in general include a batch polymerization method of dissolving the monomer species and an initiator in a solvent and heating the solution, thereby effecting the polymerization, and a dropping polymerization method of adding dropwise a solution containing monomer species and an initiator in a heated solvent over 1 to 10 hours. A dropping polymerization method is preferred. Examples of the reaction solvent include tetrahydrofuran, 1,4-dioxane, ethers (e.g., diisopropyl ether), ketones (e.g., methyl ethyl ketone, methyl isobutyl ketone), an ester solvent (e.g., ethyl acetate), an amide solvent (e.g., dimethylformamide, diethylacetamide), and a solvent capable of dissolving the composition of the present invention, which is described later, such as propylene glycol monomethyl ether acetate, propylene glycol monomethyl ether and cyclohexanone. The polymerization is preferably performed by using the same solvent as the solvent used in the photosensitive composition of the present invention. By the use of this solvent, generation of particles during storage can be suppressed.

The polymerization reaction is preferably performed in an inert gas atmosphere such as nitrogen or argon. The polymerization is started by using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobis-dimethylvaleronitrile and dimethyl 2,2'-azobis(2-methylpropionate). The initiator is added additionally or in parts, if desired. After the completion of reaction, the reactant is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 50 to 100° C.

In the case of using the composition of the present invention for the upper resist of a multilayer resist, the resin of the component (B) preferably has a silicon atom.

As for the resin having a silicon atom and capable of decomposing under the action of an acid to increase the solubility in an alkali developer, a resin having a silicon atom in at least either main chain or side chain can be used. Examples of the resin having a siloxane structure in the side chain of resin include a copolymer of an olefin-based monomer having a silicon atom in the side chain and a (meth) acrylic acid-based monomer having a maleic anhydride and an acid-decomposable group in the side chain.

The resin having a silicon atom is preferably a resin having a trialkylsilyl structure or a monocyclic or polycyclic siloxane structure, more preferably a resin containing a repeating unit having a structure represented by any one of the following formulae (SS-1) to (SS-4), still more preferably a resin containing a (meth)acrylic acid ester-based, vinyl-based or acryl-based repeating unit having a structure represented by any one of formulae (SS-1) to (SS-4).

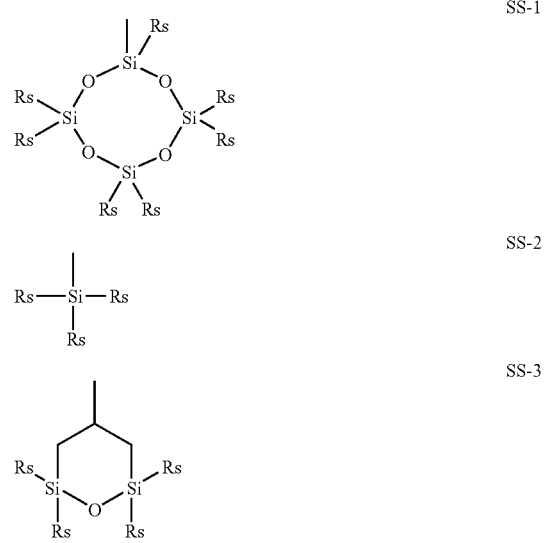

-continued

SS-4

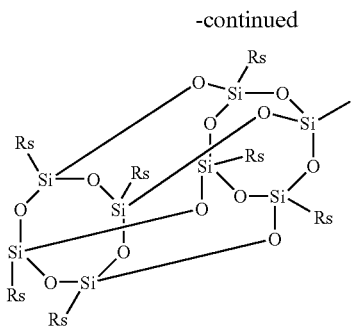

In formulae (SS-1) to (SS-4), Rs represents an alkyl group having a carbon number of 1 to 5 and is preferably a methyl group or an ethyl group.

The resin having a silicon atom preferably a resin containing two or more different repeating units having a silicon atom, more preferably a resin containing both (Sa) a repeating unit having from 1 to 4 silicon atoms and (Sb) a repeating unit having from 5 to 10 silicon atoms, still more preferably a resin containing at least one repeating unit having a structure represented by any one of formulae (SS-1) to (SS-3) and a repeating unit having a structure represented by formula (SS-4).

In the case of irradiating the positive photosensitive composition of the present invention with $F_2$ excimer laser light, the resin of the component (B) is preferably a resin having a structure that a fluorine atom is substituted to the main chain and/or the side chain of the polymer skeleton, and being capable of decomposing under the action of an acid to increase the solubility in an alkali developer (hereinafter sometimes referred to as a "fluorine group-containing resin"), more preferably a resin containing a hydroxyl group with the 1-position being substituted by a fluorine atom or a fluoroalkyl group or containing a group where the hydroxyl group with the 1-position being substituted by a fluorine atom or a fluoroalkyl group is protected by an acid-decomposable group, and still more preferably a resin having a hexafluoro-2-propanol structure or a structure that the hydroxyl group of hexafluoro-2-propanol is protected by an acid-decomposable group. By introducing a fluorine atom, the transparency to far ultraviolet light, particularly $F_2$ (157 nm) light, can be enhanced.

Preferred examples of the fluorine group-containing resin as the acid-decomposable resin (B) include a resin having at least one repeating unit represented by the following formulae (FA) to (FG):

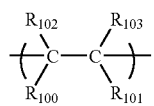
(FA)

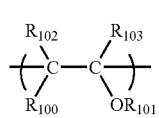
(FB)

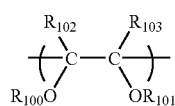
(FC)

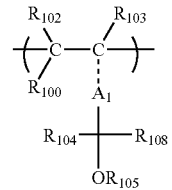
(FD)

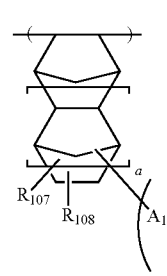
(FE)

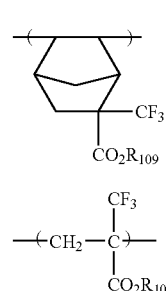
(FF)

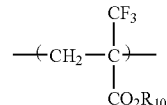
(FG)

In these formulae, $R_{100}$ to $R_{103}$ each independently represents a hydrogen atom, a fluorine atom, an alkyl group or an aryl group.

$R_{104}$ and $R_{106}$ each is a hydrogen atom, a fluorine atom or an alkyl group, and at least either one of $R_{104}$ and $R_{106}$ is a fluorine atom or a fluoroalkyl group. $R_{104}$ and $R_{106}$ are preferably both a trifluoromethyl group.

$R_{105}$ is a hydrogen atom, an alkyl group, a cycloalkyl group, an acyl group, an alkoxycarbonyl group or a group capable of decomposing under the action of an acid.

$A_1$ is a single bond, a divalent linking group such as alkylene group, cycloalkylene group, alkenylene group, arylene group, —OCO—, —COO— and —CON($R_{24}$)—, or a linking group containing a plurality of members out of these groups. $R_{24}$ is a hydrogen atom or an alkyl group.

$R_{107}$ and $R_{108}$ each is a hydrogen atom, a halogen atom, an alkyl group, an alkoxy group, an alkoxycarbonyl group or a group capable of decomposing under the action of an acid.

$R_{109}$ is a hydrogen atom, an alkyl group, a cycloalkyl group or a group capable of decomposing under the action of an acid.

b is 0, 1 or 2.

In formulae (FA) and (FC), $R_{100}$ and $R_{101}$ may form a ring through an alkylene group (having a carbon number of 1 to 5) which may be substituted by fluorine.

The repeating units represented by formulae (FA) to (FG) each contains at least one fluorine atom, preferably 3 or more fluorine atoms, per one repeating unit.

In formulae (FA) to (FG), the alkyl group is, for example, an alkyl group having a carbon number of 1 to 8, and specific preferred examples thereof include a methyl group, an ethyl group, a propyl group, an n-butyl group, a sec-butyl group, a hexyl group, a 2-ethylhexyl group and an octyl group.

The cycloalkyl group may be monocyclic or polycyclic. The monocyclic type is preferably a cycloalkyl group having a carbon number of 3 to 8, such as cyclopropyl group, cyclopentyl group, cyclohexyl group, cycloheptyl group and cyclooctyl group. The polycyclic type is preferably a cycloalkyl group having a carbon number of 6 to 20, such as adamantyl group, norbornyl group, isoboronyl group, camphanyl group, dicyclopentyl group, α-pinel group, tricyclodecanyl group, tetracyclododecyl group and androstanyl group. In these monocyclic or polycyclic cycloalkyl groups, the carbon atom may be substituted by a heteroatom such as oxygen atom.

The fluoroalkyl group is preferably a fluoroalkyl group having a carbon number of 1 to 12, and specific preferred examples thereof include a trifluoromethyl group, a perfluoroethyl group, a perfluoropropyl group, a perfluorobutyl group, a perfluorohexyl group, a perfluorooctyl group, a perfluorooctylethyl group and a perfluorododecyl group.

The aryl group is, for example, an aryl group having a carbon number of 6 to 15, and specific preferred examples thereof include a phenyl group, a tolyl group, a dimethylphenyl group, a 2,4,6-trimethylphenyl group, a naphthyl group, an anthryl group and a 9,10-dimethoxyanthryl group.

The alkoxy group is, for example, an alkoxy group having a carbon number of 1 to 8, and specific preferred examples thereof include a methoxy group, an ethoxy group, an n-propoxy group, an iso-propoxy group, a butoxy group, a pentoxy group, an allyloxy group and an octoxy group.

The acyl group is, for example, an acyl group having a carbon number of 1 to 10, and specific preferred examples thereof include a formyl group, an acetyl group, a propanoyl group, a butanoyl group, a pivaloyl group, an octanoyl group and a benzoyl group.

The alkoxycarbonyl group is preferably a secondary alkoxycarbonyl group, more preferably a tertiary alkoxycarbonyl group, such as i-propoxycarbonyl group, tert-butoxycarbonyl group, tert-amyloxycarbonyl group and 1-methyl-1-cyclohexyloxycarbonyl group.

The halogen atom includes, for example, a fluorine atom, a chlorine atom, a bromine atom and an iodine atom.

The alkylene group is preferably an alkylene group having a carbon number of 1 to 8, such as methylene group, ethylene group, propylene group, butylene group, hexylene group and octylene group.

The alkenylene group is preferably an alkenylene group having a carbon number of 2 to 6, such as ethenylene group, propenylene group and butenylene group.

The cycloalkylene group is preferably a cycloalkylene group having a carbon number of 5 to 8, such as cyclopentylene group and cyclohexylene group.

The arylene group is preferably an arylene group having a carbon number of 6 to 15, such as phenylene group, tolylene group and naphthylene group.

These groups each may have a substituent, and examples of the substituent include those having an active hydrogen, such as alkyl group, cycloalkyl group, aryl group, amino group, amido group, ureido group, urethane group, hydroxyl group and carboxyl group, a halogen atom (e.g., fluorine, chlorine, bromine, iodine), an alkoxy group (e.g., methoxy, ethoxy, propoxy, butoxy), a thioether group, an acyl group (e.g., acetyl, propanoyl, benzoyl), an acyloxy group (e.g., acetoxy, propanoyloxy, benzoyloxy), an alkoxycarbonyl group (e.g., methoxycarbonyl, ethoxycarbonyl, propoxycarbonyl), a cyano group and a nitro group.

The alkyl group, cycloalkyl group and aryl group include those described above, and the alkyl group may be further substituted by a fluorine atom or a cycloalkyl group.

Examples of the group capable of decomposing under the action of an acid, contained in the fluorine group-containing resin of the present invention, include —O—C($R_{36}$)($R_{37}$)($R_{38}$), —O—C($R_{36}$)($R_{37}$)(O$R_{39}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$), —COO—C($R_{36}$)($R_{37}$)(O$R_{39}$).

$R_{36}$ to $R_{39}$ each represents an alkyl group, a cycloalkyl group, an aryl group, an aralkyl group or an alkenyl group, and $R_{01}$ and $R_{02}$ each represents a hydrogen atom, an alkyl group, a cycloalkyl group, an alkenyl group (e.g., vinyl, allyl, butenyl, cyclohexenyl), an aralkyl group (e.g., benzyl, phenethyl, naphthylmethyl), or an aryl group.

Specific preferred examples include an ether or ester group of a tertiary alkyl group such as tert-butyl group, tert-amyl group, 1-alkyl-1-cyclohexyl group, 2-alkyl-2-adamantyl group, 2-adamantyl-2-propyl group and 2-(4-methylcyclohexyl)-2-propyl group, an acetal or acetal ester group such as 1-alkoxy-1-ethoxy group and tetrahydropyranyl group, a tert-alkylcarbonate group, and a tert-alkylcarbonylmethoxy group.

Specific examples of the repeating structural units represented by formulae (FA) to (FG) are set forth below, but the present invention is not limited thereto.

(F-1)

(F-2)

(F-3)

(F-4)

(F-5)

(F-6)

(F-7)

(F-8)

-continued
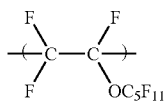 (F-9)
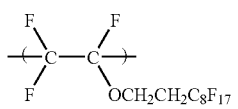 (F-10)
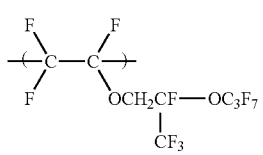 (F-11)
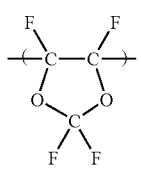 (F-12)
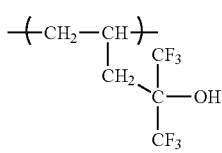 (F-13)
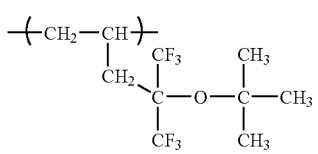 (F-14)
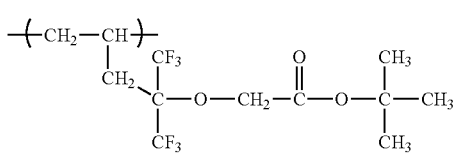 (F-15)
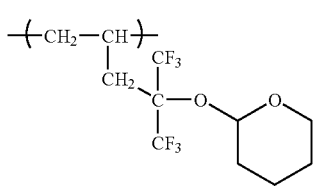 (F-16)
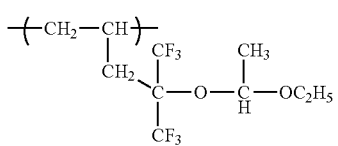 (F-17)
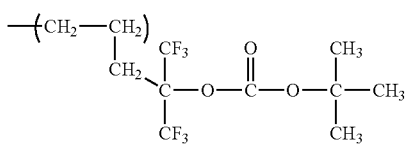 (F-18)
-continued
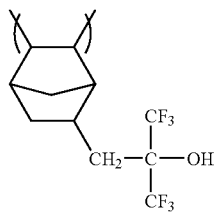 (F-19)
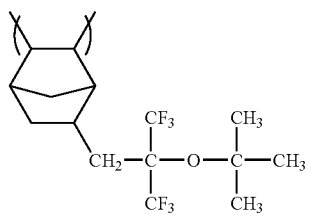 (F-20)
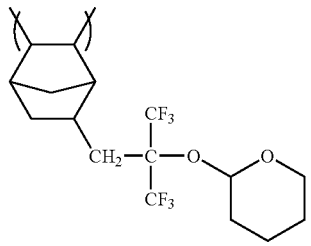 (F-21)
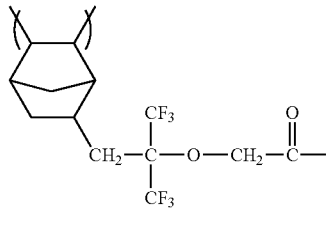 (F-22)
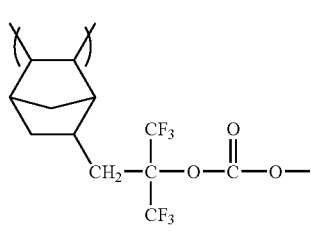 (F-23)
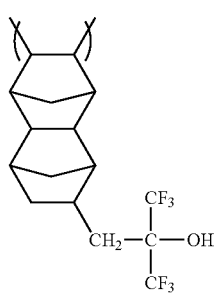 (F-24)

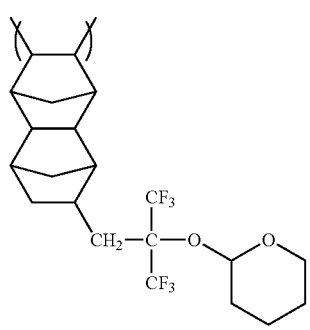
(F-25)
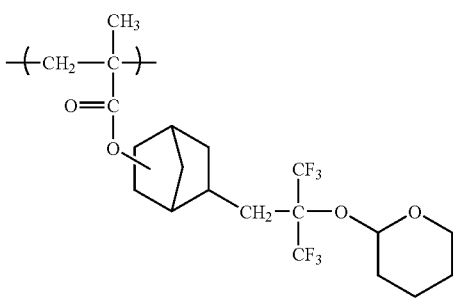
(F-30)
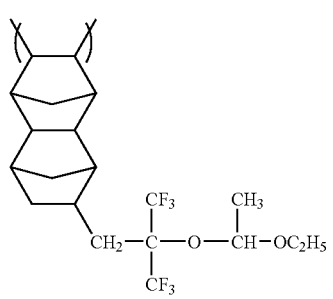
(F-26)
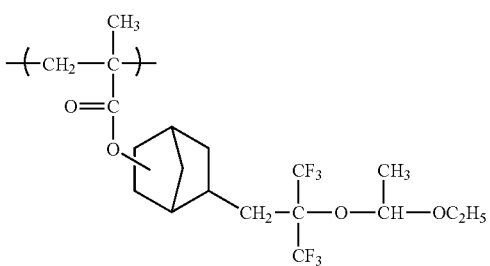
(F-31)
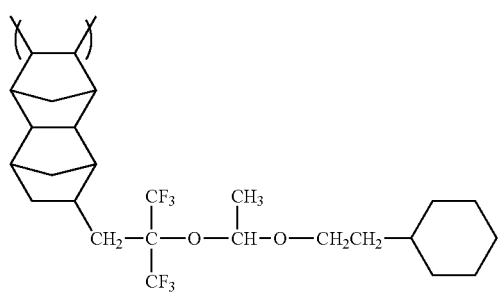
(F-27)
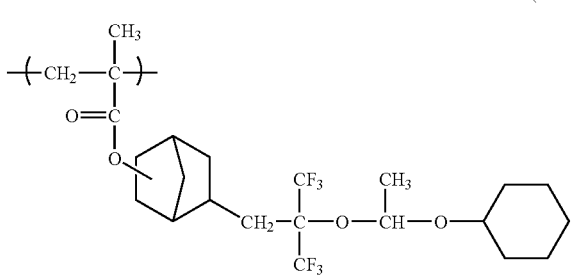
(F-32)
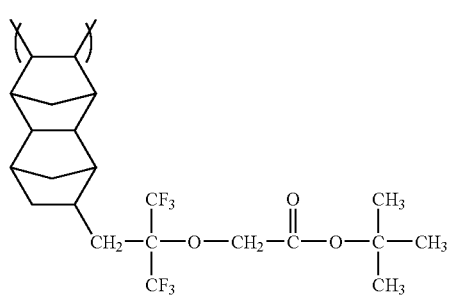
(F-28)
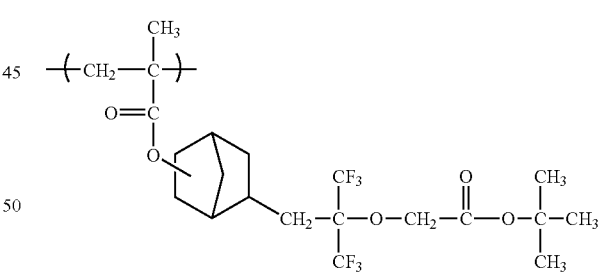
(F-33)
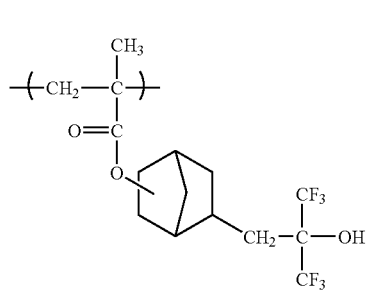
(F-29)
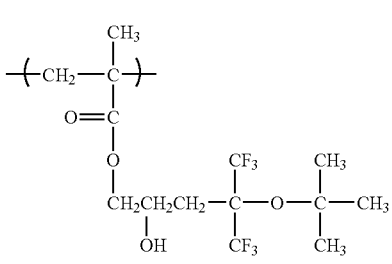
(F-34)

-continued
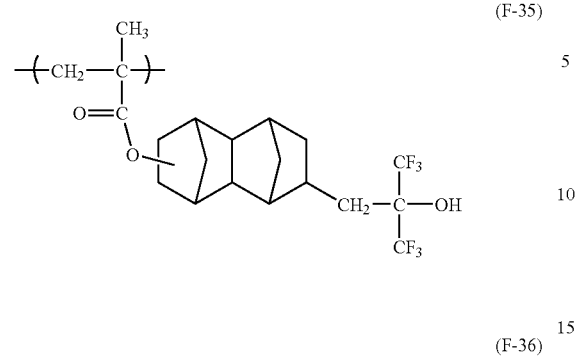 (F-35)
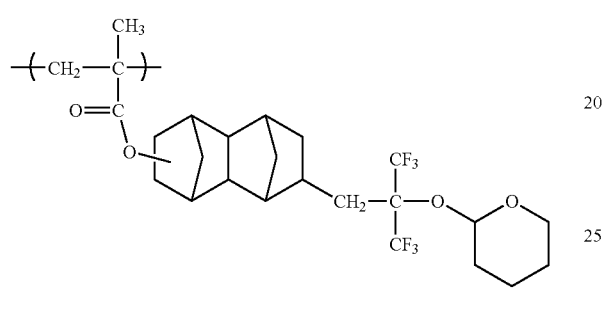 (F-36)
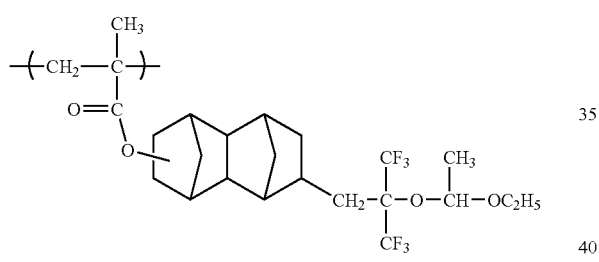 (F-37)
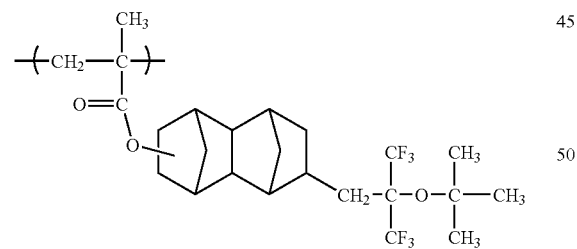 (F-38)
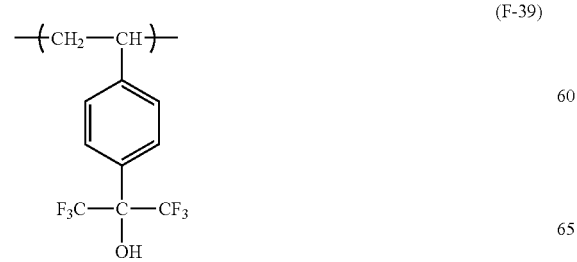 (F-39)
-continued
 (F-40)
 (F-41)
 (F-42)
 (F-43)
 (F-44)

-continued
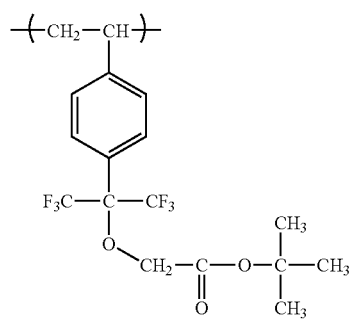 (F-45)
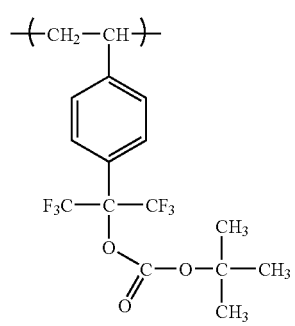 (F-46)
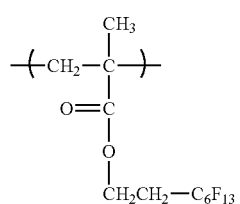 (F-47)
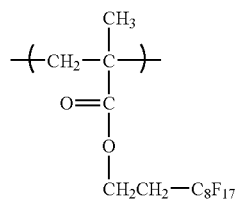 (F-48)
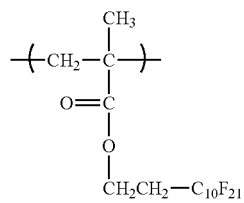 (F-49)
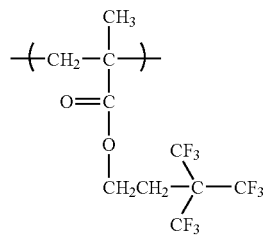 (F-50)
-continued
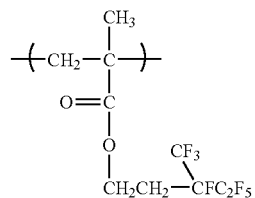 (F-51)
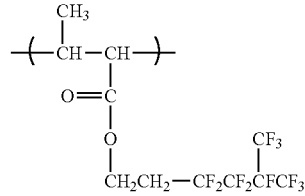 (F-52)
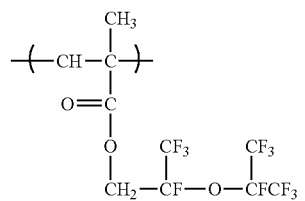 (F-53)
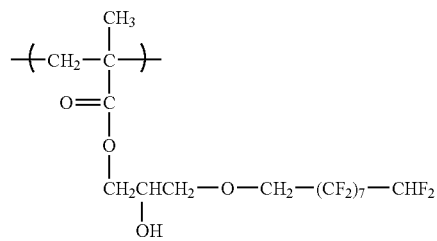 (F-54)
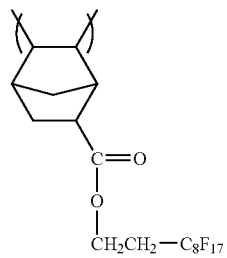 (F-55)
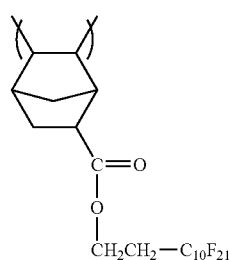 (F-56)

-continued (F-57) 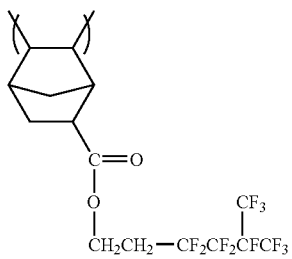

(F-58) 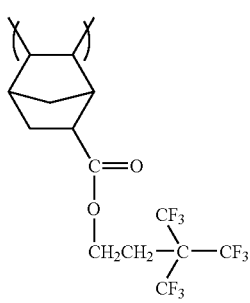

(F-59) 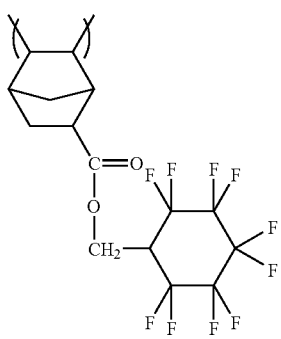

(F-60) 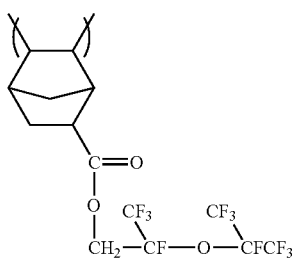

(F-61) 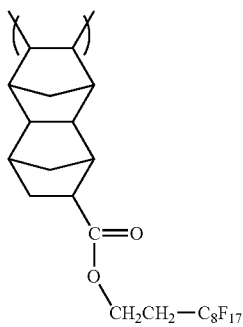

-continued (F-62) 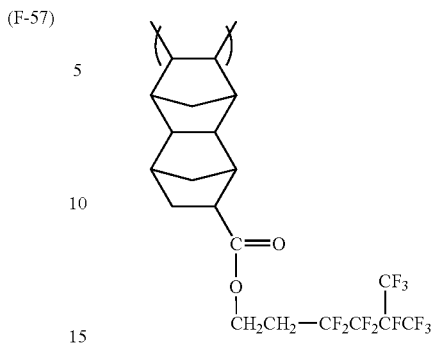

(F-63) 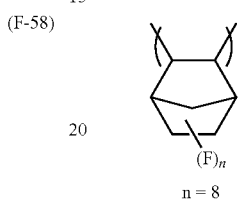

$(F)_n$
n = 8

(F-64) 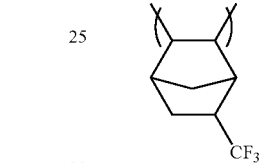

(F-65) 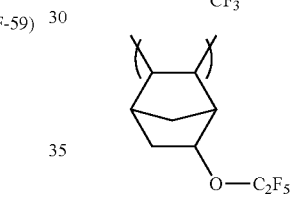

The total content of the repeating units represented by formulae (FA) to (FG) is generally from 10 to 80 mol %, preferably from 30 to 70 mol %, more preferably from 35 to 65 mol %, based on all repeating units constituting the resin.

In the fluorine-containing resin, in addition to these repeating structural units, other polymerizable monomers may be copolymerized for enhancing the performance of the resist of the present invention.

Examples of the copolymerization monomer which can be used include a compound having one addition-polymerizable unsaturated bond, selected from acrylic acid esters other than those described above, acrylamides, methacrylic acid esters, methacrylamides, allyl compounds, vinyl ethers, vinyl esters, styrenes and crotonic acid esters.

From the standpoint of enhancing the dry etching resistance, controlling the alkali solubility and increasing the adhesion to substrate, the fluorine-containing resin preferably contains another repeating unit as a copolymerization component in addition to the above-described fluorine atom-containing repeating unit. Preferred examples of the another repeating unit include:

1) a repeating unit having an alicyclic hydrocarbon structure represented by any one of formulae (pI) to (pVI) or formula (II-AB), specifically, repeating units 1 to 23 and repeating units [II-1] to [II-32], preferably repeating units 1 to 23 where Rx is $CF_3$;

2) a repeating unit having a lactone structure represented by formula (Lc) or by any one of formulae (V-1) to (V-5), specifically, repeating units shown above, particularly, repeating units having a group represented by any one of formulae (Lc) and (V-1) to (V-4); and 3) a repeating unit derived from a maleic anhydride, a vinyl ether or a vinyl compound having a cyano group, represented by the following formula (XV), (XVI) or (XVII), specifically repeating units (C-1) to (C-15).

In these repeating units, a fluorine atom may or may not be contained.

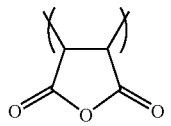
(XV)

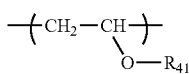
(XVI)

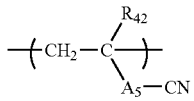
(XVII)

In these formulae, $R_{41}$ represents an alkyl group, a cycloalkyl group, an aralkyl group or an aryl group, and the alkyl group of $R_{41}$ may be substituted by an aryl group.

$R_{42}$ represents a hydrogen atom, a halogen atom, a cyano group or an alkyl group.

$A_5$ represents a single bond, a divalent alkylene, alkenylene, cycloalkylene or arylene group, —O—CO—$R_{22}$, —CO—O—$R_{23}$— or —CO—N($R_{24}$)—$R_{25}$—.

$R_{22}$, $R_{23}$ and $R_{25}$, which may be the same or different, each represents a single bond or a divalent alkylene, alkenylene, cycloalkylene or arylene group which may have an ether group, an ester group, an amide group, a urethane group or a ureido group.

$R_{24}$ represents a hydrogen atom, an alkyl group, a cycloalkyl group, an aralkyl group or an aryl group.

Examples of each substituent include the same as those described above for the substituents of formulae (FA) to (FG).

Specific examples of the repeating structural units represented by formulae (XV) to (XVII) are set forth below, but the present invention is not limited thereto.

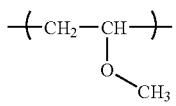
(C-1)

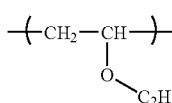
(C-2)

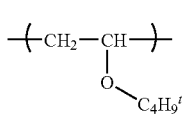
(C-3)

-continued

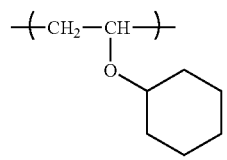
(C-4)

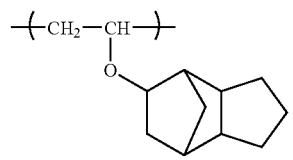
(C-5)

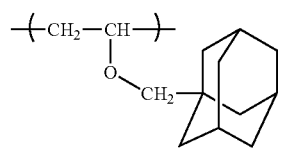
(C-6)

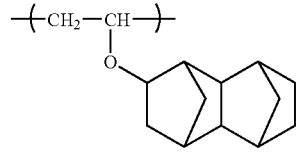
(C-7)

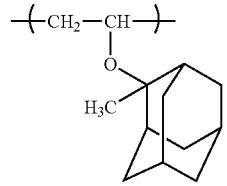
(C-8)

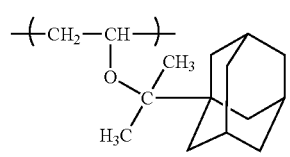
(C-9)

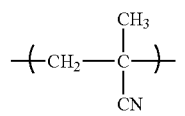
(C-10)

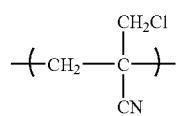
(C-11)

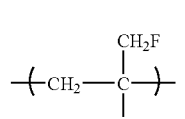
(C-12)

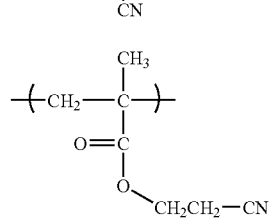
(C-13)

-continued

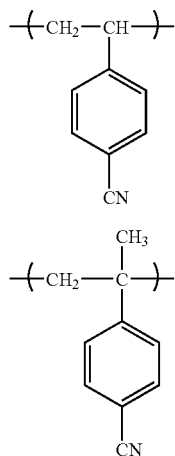

(C-14)

(C-15)

The total amount of the repeating unit represented by any one of formulae (XV) to (XVII) and the another repeating unit is generally from 0 to 70 mol %, preferably from 10 to 60 mol %, more preferably from 20 to 50 mol %, based on all repeating units constituting the resin.

The fluorine group-containing resin may contain an acid-decomposable group in any repeating unit.

The content of the repeating unit having an acid-decomposable group is preferably from 10 to 70 mol %, more preferably from 20 to 60 mol %, still more preferably from 30 to 60 mol %, based on all repeating units.

The fluorine group-containing resin can be synthesized by radical polymerization almost in the same manner as the alicyclic hydrocarbon-based acid-decomposable resin.

The weight average molecular weight of the resin as the component (B) is preferably from 2,000 to 200,000 in terms of polystyrene by the GPC method. With a weight average molecular weight of 2,000 or more, heat resistance and dry etching resistance can be increased and with a weight average molecular weight of 200,000 or less, developability can be enhanced and at the same time, by virtue of decrease in the viscosity, the film-forming property can be improved. The molecular weight is more preferably from 5,000 to 50,000, still more preferably from 7,000 to 30,000. By controlling the molecular weight, the composition can be satisfied in all of heat resistance, resolving power, development defect and the like. The dispersity (Mw/Mn) of the resin as the component (B) is preferably from 1.0 to 3.0, more preferably from 1.2 to 2.5, still more preferably from 1.2 to 1.6. By controlling the dispersity to an appropriate range, the line edge roughness performance can be enhanced.

In the positive photosensitive composition of the present invention, the amount of the resin as the component (B) blended in the entire composition is preferably from 40 to 99.99 mass %, more preferably from 50 to 99 mass %, still more preferably from 80 to 96 mass %, based on the entire solid content.

[3] (C) Dissolution Inhibiting Compound Capable of Decomposing Under the Action of an Acid to Increase the Solubility in an Alkali Developer and Having a Molecular Weight of 3,000 or Less (Hereinafter Sometimes Referred to as a "Component (C)" or "Dissolution Inhibiting Compound")

In order to prevent reduction in the transmittance at 220 nm or less, the dissolution inhibiting compound (C) capable of decomposing under the action of an acid to increase the solubility in an alkali developer and having a molecular weight of 3,000 or less is preferably an alicyclic or aliphatic compound containing an acid-decomposable group, such as acid-decomposable group-containing cholic acid derivative described in *Proceeding of SPIE*, 2724, 355 (1996). Examples of the acid-decomposable group and the alicyclic structure include the same as those described above for the alicyclic hydrocarbon-based acid-decomposable resin.

In the case where the photosensitive composition of the present invention is exposed with a KrF excimer laser or irradiated with electron beams, the dissolution inhibiting compound preferably contains a structure in which the phenolic hydroxyl group of a phenol compound is replaced by an acid-decomposable group. The phenol compound preferably contains from, 1 to 9 phenol skeletons, more preferably from 2 to 6 phenol skeletons.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 mass %, more preferably from 5 to 40 mass %, based on the solid content of the photosensitive composition.

Specific examples of the dissolution inhibiting compound are set forth below, but the present invention is not limited thereto.

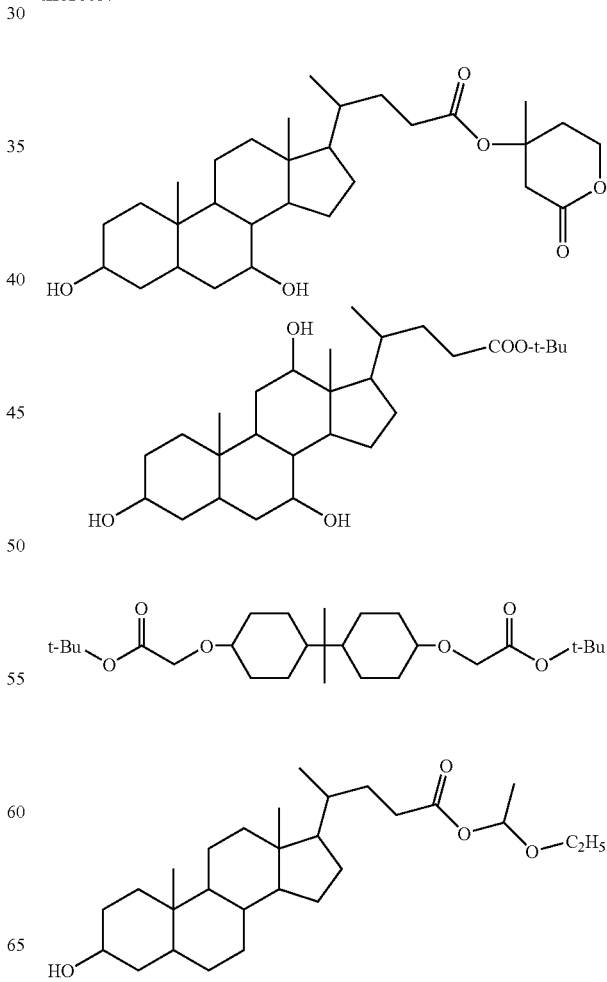

-continued

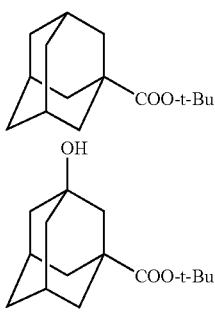

[4] (D) Resin Soluble in an Alkali Developer (Hereinafter Sometimes Referred to as a "Component (D)" or "Alkali-Soluble Resin")

The alkali dissolution rate of the alkali-soluble resin is preferably 20 Å/sec or more, more preferably 200 Å/sec or more (Å is angstrom), as measured (at 23° C.) in 0.261N tetramethylammonium hydroxide (TMAH).

Examples of the alkali-soluble resin for use in the present invention include, but are not limited to, novolak resin, hydrogenated novolak resin, acetone-pyrogallol resin, o-polyhydroxystyrene, m-polyhydroxystyrene, p-polyhydroxystyrene, hydrogenated polyhydroxystyrene, halogen- or alkyl-substituted polyhydroxystyrene, a hydroxystyrene-N-substituted maleimide copolymer, an o/p- or m/p-hydroxystyrene copolymer, polyhydroxystyrene with the hydroxyl group being partially O-alkylated (for example, 5 to 30 mol % being O-methylated, O-(1-methoxy)ethylated, O-(1-ethoxy)ethylated, O-2-tetrahydropyranylated or O-(tert-butoxycarbonyl)methylated) or O-acylated (for example, 5 to 30 mol % being o-acylated or O-(tert-butoxy) carbonylated), a styrene-maleic anhydride copolymer, a styrene-hydroxystyrene copolymer, an x-methylstyrene-hydroxystyrene copolymer, a carboxyl group-containing methacrylic resin and a derivative thereof, and a polyvinyl alcohol derivative.

Among these alkali-soluble resins, preferred are novolak resin, o-polyhydroxystyrene, m-polyhydroxystyrene, p-polyhydroxystyrene, a copolymer thereof, alkyl-substituted polyhydroxystyrene, partially O-alkylated or O-acylated polyhydroxystyrene, a styrene-hydroxystyrene copolymer and an α-methylstyrene-hydroxystyrene copolymer.

The novolak resin can be obtained by subjecting a predetermined monomer as the main component to addition condensation with an aldehyde in the presence of an acidic catalyst.

The weight average molecular weight of the alkali-soluble resin is 2,000 or more, preferably from 5,000 to 200,000, more preferably from 5,000 to 100,000.

The weight average molecular weight used herein is defined as a polystyrene-reduced value measured by gel permeation chromatography.

In the present invention, two or more of these alkali-soluble resins (D) may be used in combination.

The amount of the alkali-soluble resin used is from 40 to 97 mass %, preferably from 60 to 90 mass %, based on the entire solid content of the photosensitive composition.

[5] (E) Acid Crosslinking Agent Capable of Crosslinking with the Alkali-Soluble Resin Under the Action of an Acid (Hereinafter Sometimes Referred to as a "Component (E)" or "Crosslinking Agent")

In the negative photosensitive composition of the present invention, a crosslinking agent is used.

The crosslinking agent may be any compound as long as it causes crosslinking of the resin soluble in an alkali developer under the action of an acid, but the following compounds (1) to (3) are preferred:

(1) a hydroxymethyl, alkoxymethyl or acyloxymethyl form of phenol derivative, (2) a compound having an N-hydroxymethyl group, an N-alkoxymethyl group or an N-acyloxymethyl group, and (3) a compound having an epoxy group.

The alkoxymethyl group is preferably an alkoxymethyl group having a carbon number of 6 or less, and the acyloxymethyl group is preferably an acyloxymethyl group having a carbon number of 6 or less.

Among these crosslinking agents, particularly preferred are set forth below.

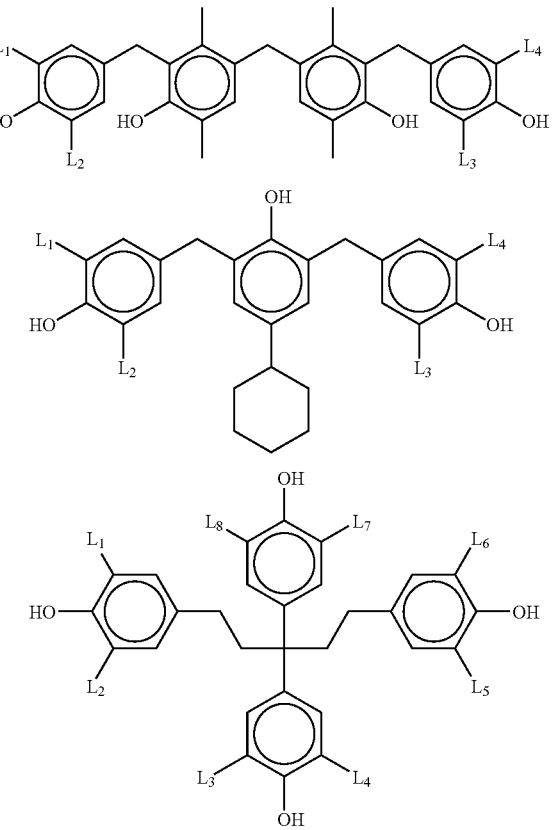

-continued

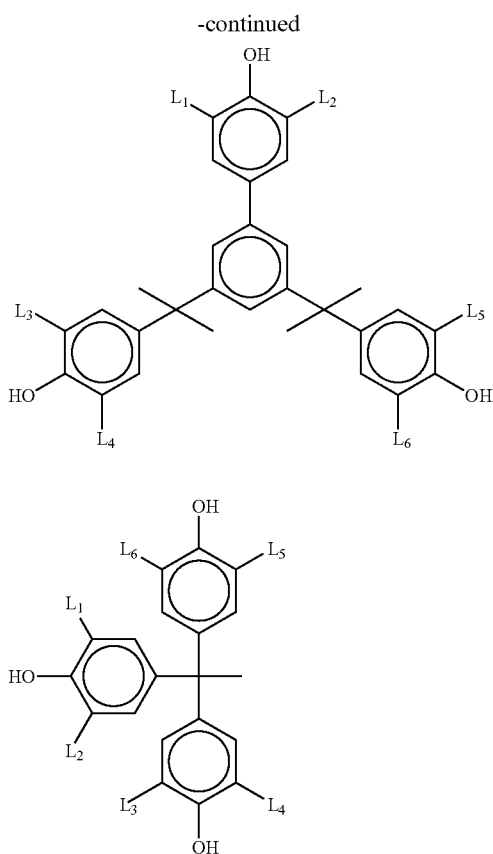

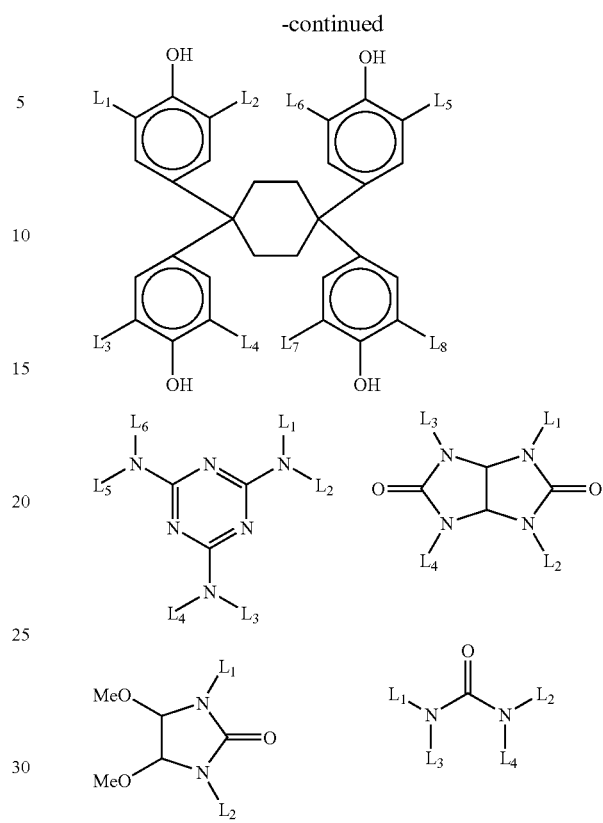

In these formulae, $L^1$ to $L^8$, which may be the same or different, each represents a hydrogen atom, a hydroxymethyl group, a methoxymethyl group, an ethoxymethyl group or an alkyl group having a carbon number of 1 to 6.

The crosslinking agent is usually added in an amount of 3 to 70 mass %, preferably from 5 to 50 mass %, based on the solid content of the photosensitive composition.

<Other Components>

[6] (F) Basic Compound

The photosensitive composition of the present invention preferably contains (F) a basic compound so as to reduce the change of performance in aging from exposure to heating.

Preferred structures of the basic compound include structures represented by the following formulae (A) to E).

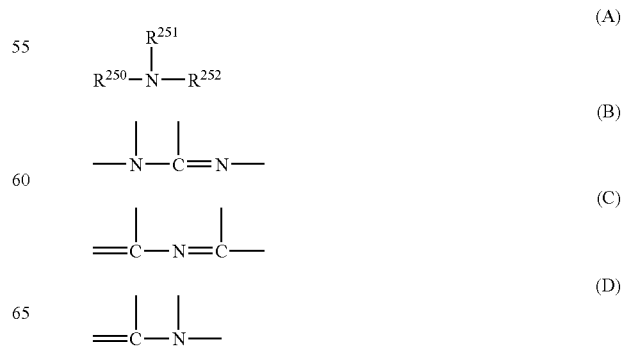

-continued

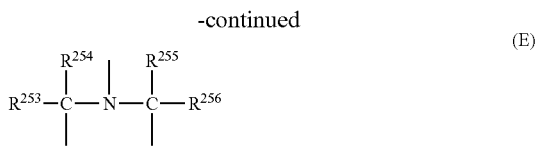

(E)

In these formulae, $R^{250}$, $R^{251}$ and $R^{252}$ each independently represents a hydrogen atom, an alkyl group having a carbon number of 1 to 20, a cycloalkyl group having a carbon number of 3 to 20, or an aryl group having a carbon number of 6 to 20, and $R^{250}$ and $R^{251}$ may combine with each other to form a ring. These groups each may have a substituent. The alkyl group or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

These groups each may contain an oxygen atom, a sulfur atom or a nitrogen atom in the alkyl chain.

$R^{253}$, $R^{254}$, $R^{255}$ and $R^{256}$ each independently represents an alkyl group having a carbon number of 1 to 6 or a cycloalkyl group having a carbon number of 3 to 6.

Preferred examples of the compound include guanidine, aminopyrrolidine, pyrazole, pyrazoline, piperazine, aminomorpholine, aminoalkylmorpholine and piperidine, which each may have a substituent. More preferred examples include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound having an onium hydroxide structure where the anion moiety is converted into a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

These basic compounds are used individually or in combination of two or more thereof. However, when the amount of the component (A) used is 0.05 mass % or more, the basic substance may or may not be used. In the case of using the basic compound, the amount used thereof is usually from 0.001 to 10 mass %, preferably from 0.01 to 5 mass %, based on the solid content of the photosensitive composition. The amount used is preferably 0.001 mass % or more for obtaining a sufficiently high addition effect and preferably 10 mass % or less in view of sensitivity and developability of unexposed part.

[7] (G) Fluorine- and/or Silicon-containing Surfactant

The photosensitive composition of the present invention preferably further contains any one fluorine- and/or silicon-containing surfactant (a fluorine-containing surfactant, a silicon-containing surfactant or a surfactant containing both a fluorine atom and a silicon atom), or two or more thereof.

When the photosensitive composition of the present invention contains a fluorine- and/or silicon-containing surfactant, a resist pattern with good sensitivity, resolution and adhesion and less development defects can be obtained when an exposure light source of 250 nm or less, particularly 220 nm or less, is used.

Examples of the fluorine- and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical). In addition, polysiloxane polymer KP-341 (produced by Shin-Etsu Chemical Co., Ltd.) may also be used as the silicon-containing surfactant.

Other than those known surfactants, a surfactant using a polymer having a fluoro-aliphatic group, which is derived from a fluoro-aliphatic compound produced by telomerization process (also called telomer process) or oligomerization process (also called oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with (poly(oxyalkylene))acrylate and/or (poly(oxyalkylene))methacrylate, and the polymer may have an irregular distribution or may be a block copolymer. Examples of the poly(oxyalkylene) group include a poly(oxyethylene) group, a poly(oxypropylene) group and a poly(oxybutylene) group). This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene))acrylate (or methacrylate) may be not only a binary copolymer but also a ternary or greater copolymer obtained by simultaneously copolymerizing two or more different fluoro-aliphatic group-containing monomers or two or more different (poly(oxyalkylene))acrylates (or methacrylates).

Examples thereof include commercially available surfactants such as Megafac F178, F-470, F-473, F-475, F-476 and F-472 (produced by Dainippon Ink & Chemicals, Inc.). Other examples include a copolymer of an acrylate (or methacrylate) having a $C_6F_{13}$ group with a (poly(oxyalkylene))acrylate (or methacrylate), a copolymer of an acrylate (or methacrylate) having a $C_6F_{13}$ group with a (poly(oxyethylene))

acrylate (or methacrylate) and a (poly(oxypropylene)) acrylate (or methacrylate), a copolymer of an acrylate (or methacrylate) having a $C_8F_{17}$ group with a (poly(oxyalkylene))acrylate (or methacrylate), and a copolymer of an acrylate (or methacrylate) having a $C_8F_{17}$ group with a (poly(oxyethylene))acrylate (or methacrylate) and a (poly(oxypropylene)) acrylate (or methacrylate).

The amount of the fluorine- and/or silicon-containing surfactant used is preferably from 0.0001 to 2 mass %, more preferably from 0.001 to 1 mass %, based on the entire amount of the photosensitive composition (excluding the solvent).

[8] (H) Organic Solvent

In the photosensitive composition of the present invention, the above-described components are used by dissolving these in a predetermined organic solvent.

Examples of the organic solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethylsulfoxide, N-methylpyrrolidone and tetrahydrofuran.

(Ha) Ketone-based Solvent

The solvent for use in the present invention is preferably a solvent having at least one ketone structure.

The solvent having a ketone structure includes a chain ketone solvent and a cyclic ketone solvent. A compound having a total carbon number of 5 to 8 is preferred, because good coatability is obtained.

Examples of the chain ketone solvent include 2-heptanone, methyl ethyl ketone and methyl isobutyl ketone, with 2-heptanone being preferred.

Examples of the cyclic ketone solvent include cyclopentanone, 3-methyl-2-cyclopentanone, cyclohexanone, 2-methylcyclohexanone, 2,6-dimethylcyclohexanone, cycloheptanone, cyclooctanone and isophorone, with cyclohexanone and cycloheptanone being preferred.

A solvent having a ketone structure may be used alone as the solvent or may be used as a mixed solvent with another solvent. Examples of the solvent mixed (solvent used in combination) include a propylene glycol monoalkyl ether carboxylate, an alkyl lactate, a propylene glycol monoalkyl ether, an alkyl alkoxypropionate and a lactone compound.

Examples of the propylene glycol monoalkyl ether carboxylate include propylene glycol monomethyl ether acetate, propylene glycol monomethyl ether propionate and propylene glycol monoethyl ether acetate.

Examples of the alkyl lactate include methyl lactate and ethyl lactate.

Examples of the propylene glycol monoalkyl ether include propylene glycol monomethyl ether and propylene glycol monoethyl ether.

Examples of the alkyl alkoxypropionate include methyl methoxypropionate, ethyl methoxypropionate, methyl ethoxypropionate and ethyl ethoxypropionate.

Examples of the lactone compound include γ-butyrolactone.

The solvent used in combination is preferably propylene glycol monoalkyl ether carboxylate, alkyl lactate or propylene glycol monoalkyl ether, more preferably propylene glycol monomethyl ether acetate.

By mixing the ketone-based solvent and the solvent used in combination, for example, adhesion to substrate, developability and DOF are improved.

The ratio (by mass) of the ketone-based solvent and the solvent used in combination is preferably from 10/90 to 95/5, more preferably from 20/80 to 80/20, still more preferably from 30/70 to 70/30.

From the standpoint of enhancing the film thickness uniformity or development defect performance, a high boiling point solvent having a boiling point of 200° C. or more, such as ethylene carbonate and propylene carbonate, may be mixed.

The amount added of the high boiling point solvent is usually from 0.1 to 15 mass %, preferably from 0.5 to 10 mass %, more preferably from 1 to 5 mass %, based on the entire solvent.

By using such a ketone-based solvent alone or using a mixed solvent with another solvent, a photosensitive composition having a solid content concentration of usually from 3 to 25 mass %, preferably from 5 to 22 mass %, more preferably from 5 to 15 mass %, is prepared.

<Other Additives>

The photosensitive composition of the present invention may further contain, for example, a dye, a plasticizer, a surfactant other than the component (G), a photosensitizer and a compound capable of accelerating the solubility in a developer, if desired.

The compound capable of accelerating the dissolution in a developer, which can be used in the present invention, is a low molecular compound containing two or more phenolic OH groups or one or more carboxy group and having a molecular weight of 1,000 or less. In the case of containing a carboxyl group, an alicyclic or aliphatic compound is preferred.

The amount added of the dissolution accelerating compound is preferably from 2 to 50 mass %, more preferably from 5 to 30 mass %, based on the resin of component (B) or the resin of component (D). The amount added is preferably 50 mass % or less from the standpoint of preventing the development residue or deformation of pattern at the development.

The phenol compound having a molecular weight of 1,000 or less can be easily synthesized by one skilled in the art by referring to the method described, for example, in JP-A-4-122938, JP-A-2-28531, U.S. Pat. No. 4,916,210 and European Patent 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

In the present invention, a surfactant other than (G) the fluorine- and/or silicon-containing surfactant can also be added. Specific examples thereof include a nonionic surfactant such as polyoxyethylene alkyl ethers, polyoxyethylene alkylallyl ethers, polyoxyethylene-polyoxypropylene block copolymers, sorbitan fatty acid esters and polyoxyethylene sorbitan fatty acid esters.

One of these surfactants may be used alone or some of these surfactants may be used in combination.

(Pattern Forming Method)

The photosensitive composition of the present invention is used by dissolving the above-described components in a predetermined organic solvent, preferably a mixed solvent described above, and coating the obtained solution on a predetermined support as follows.

For example, the photosensitive composition is coated on a substrate (e.g., silicon/silicon dioxide-coated substrate) as used in the production of a precision integrated circuit device, by an appropriate coating method such as spinner or coater, and dried to form a photosensitive film.

This photosensitive film is irradiated with actinic rays or radiation through a predetermined mask and preferably after baking (heating), developed, whereby a good pattern can be obtained.

At the irradiation with actinic rays or radiation, the exposure may be performed by filling a liquid having a refractive index higher than that of air between the photosensitive film and the lens (immersion exposure). By this exposure, resolution can be elevated.

Examples of the actinic ray or radiation include infrared light, visible light, ultraviolet light, far ultraviolet light, X-ray and electron beam. Among these, preferred is far ultraviolet light at a wavelength of 250 nm or less, more preferably 220 nm or less. Specific examples thereof include a KrF excimer laser (248 nm), an ArF excimer laser (193 nm), an $F_2$ excimer laser (157 nm), an X-ray and an electron beam, with ArF excimer laser, $F_2$ excimer laser, EUV (13 nm) and electron beam being preferred.

In the development step, an alkali developer is used as follows. The alkali developer which can be used for the resist composition is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, a quaternary ammonium salt such as tetramethylammonium hydroxide and tetraethylammonium hydroxide, or cyclic amines such as pyrrole and piperidine.

In the alkali developer, alcohols and a surfactant may also be added in an appropriate amount.

The alkali concentration of the alkali developer is usually from 0.1 to 20 mass %.

The pH of the alkali developer is usually from 10.0 to 15.0.

EXAMPLES

The present invention is described in greater detail below by referring to Examples, but the present invention should not be construed as being limited thereto.

Synthesis Example of Compound (A)

Synthesis of Compound A-1:

In a 300 mL-volume three-neck flask equipped with a 100-mL dropping funnel and a nitrogen inlet tube, 10.0 g (31.6 mmol) of 1,1,2,2,3,3-hexafluoropropane-1,3-disulfonyl difluoride was charged, then dissolved in 60 mL of THF in a nitrogen atmosphere and then stirred under ice cooling. Subsequently, 80 mL of a THF solution containing 5.89 g (31.6 mmol) of 1-BOC-piperazine and 3.20 g (31.6 mmol) of triethylamine was added dropwise through the dropping funnel over 1 hour. Following the dropwise addition, the mixed solution was stirred under ice cooling for 1 hour and after removing the ice bath, stirred at room temperature for 8 hours. Thereafter, 300 mL of ethyl acetate was added to the reaction solution, and the organic layer was washed with water several times, concentrated and then exsiccated to obtain a white solid having the following structure.

Furthermore, 150 mL of methanol and 80 mL of an aqueous 1M-sodium hydroxide solution were added to the white solid and stirred at room temperature for 4 hours, and thereto, 9.22 g (27 mmol) of triphenylsulfonium bromide was added and stirred at room temperature for 3 hours. Subsequently, 300 mL of chloroform was added, and the organic layer was washed with water several times, concentrated and then vacuum-dried to obtain 20.0 g of a transparent oil.

$^1$H-NMR (400 MHz, CDCl$_3$): δ1.47 (s, 9H), 3.50 (bs, 8H), 7.71 (m, 15H). $^{19}$F-NMR (400 MHz, CDCl$_3$): δ−110.5 (t, 2F), −114.0 (m, 2F), −119.0 (t, 2F).

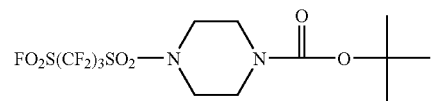

Various compounds (A) were synthesized in the same manner.

<Resin (B)>

The structure, molecular weight and dispersity of the resin (B) used in Examples are shown below.

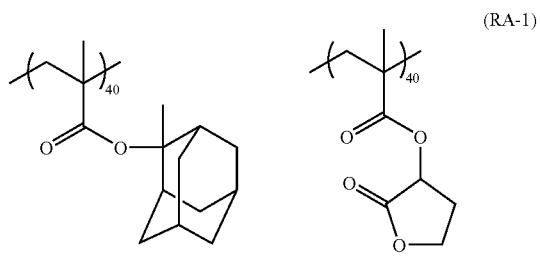

(RA-1)

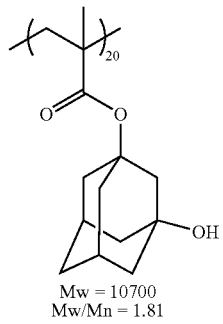

Mw = 10700
Mw/Mn = 1.81

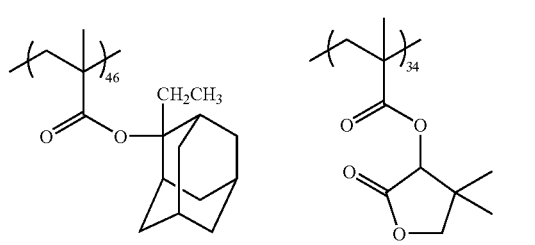

(RA-2)

-continued
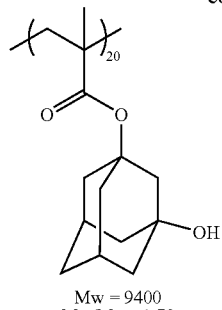
Mw = 9400
Mw/Mn = 1.78
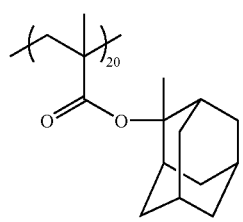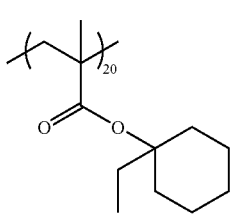
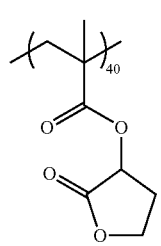
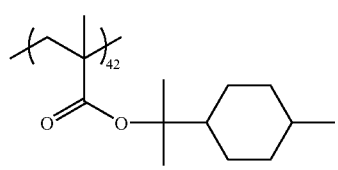
Mw = 13700
Mw/Mn = 1.89
(RA-4)
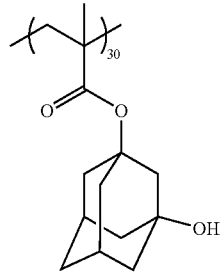
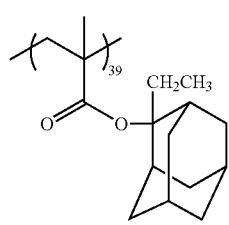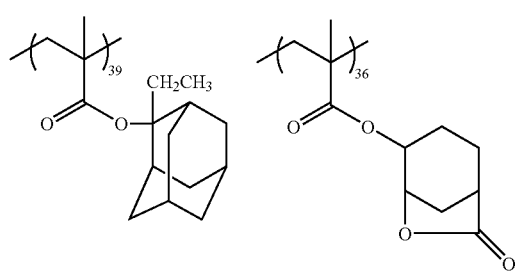
Mw = 10300
Mw/Mn = 1.90
(RA-5)
-continued
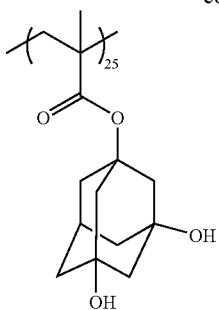
Mw = 8900
Mw/Mn = 1.80
(RA-6)
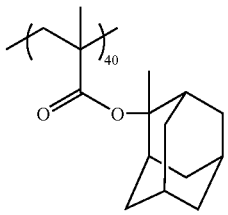
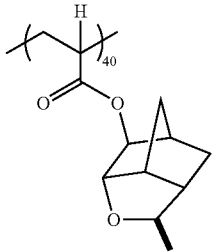
Mw = 7900
Mw/Mn = 1.73
(RA-7)
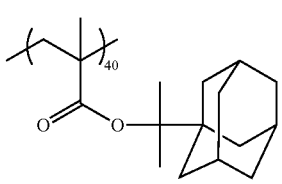
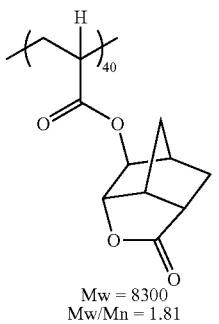
Mw = 8300
Mw/Mn = 1.81

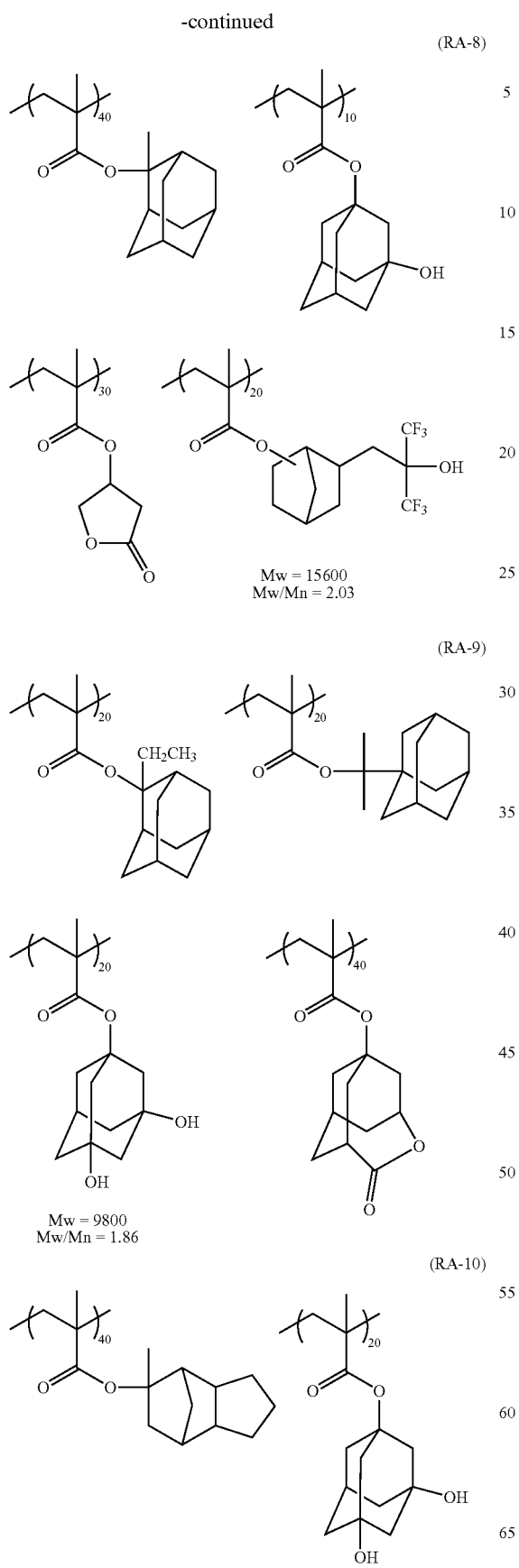
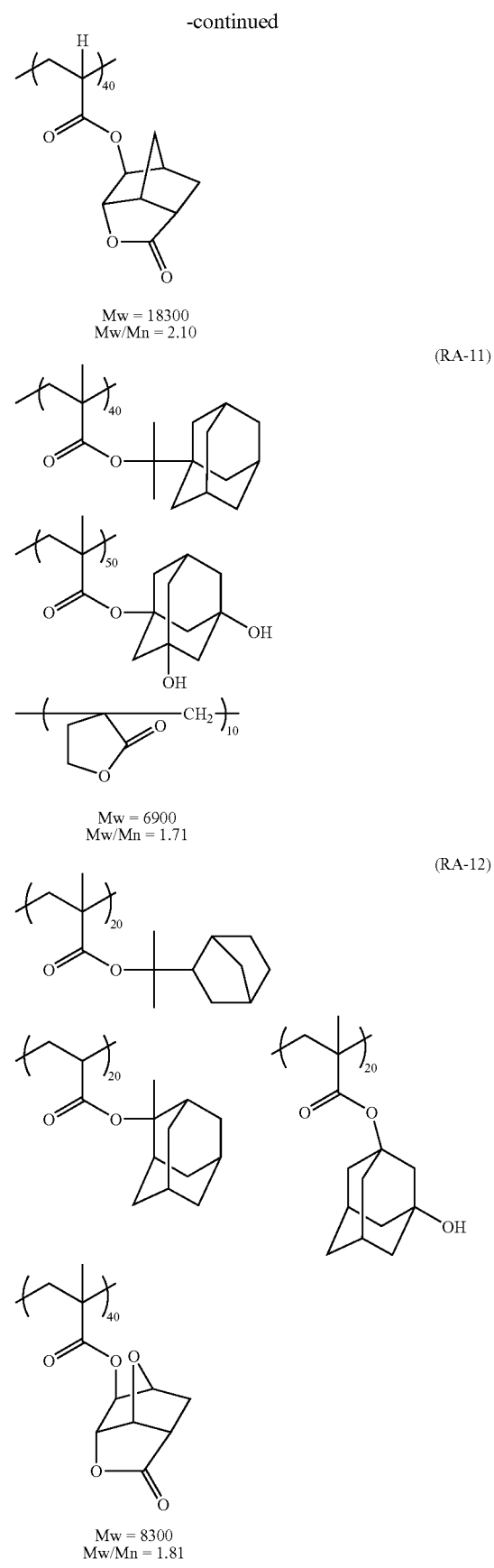

(RA-13)
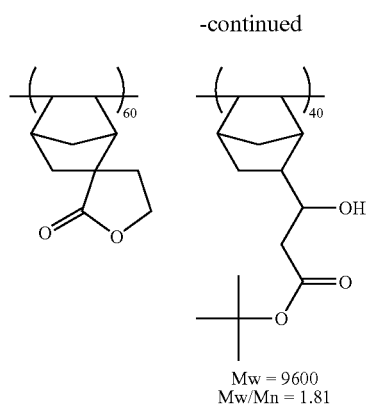
Mw = 9600
Mw/Mn = 1.81
(RA-14)
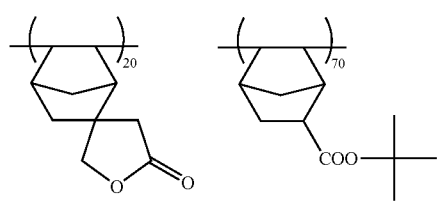
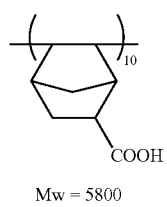
Mw = 5800
Mw/Mn = 1.69
(RA-15)
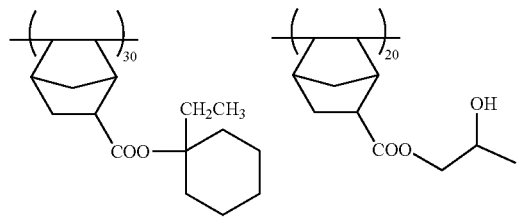
Mw = 4700
Mw/Mn = 1.70
(RA-16)
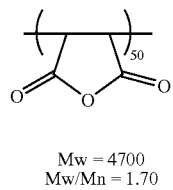
(RA-17)
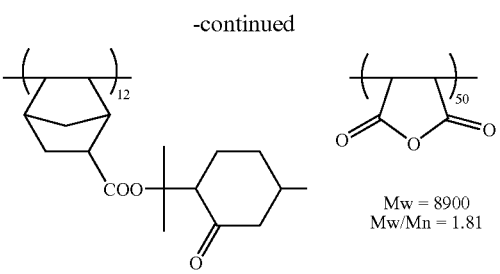
Mw = 8900
Mw/Mn = 1.81
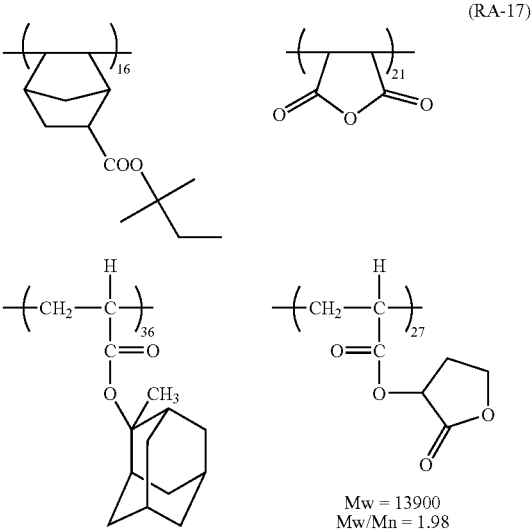
Mw = 13900
Mw/Mn = 1.98
(RA-18)
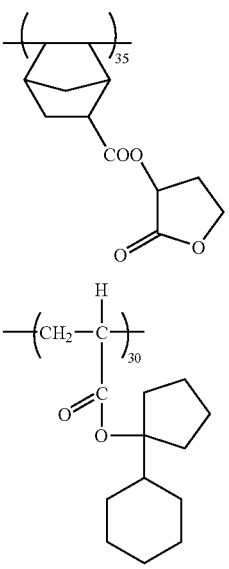
Mw = 12700
Mw/Mn = 1.99
(RA-19)
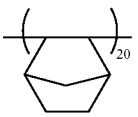 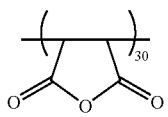 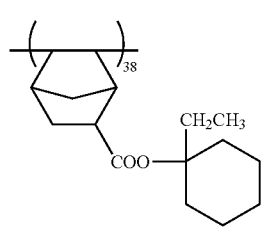

-continued
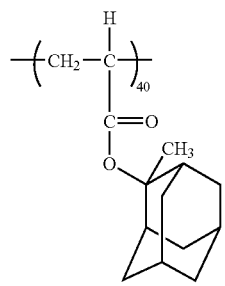
Mw = 9300
Mw/Mn = 1.81
(RA-20)
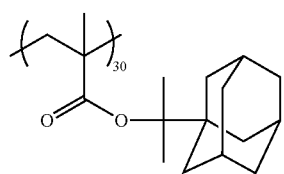
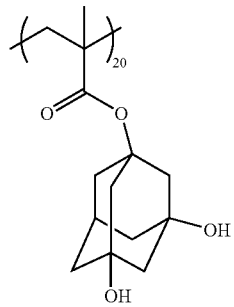
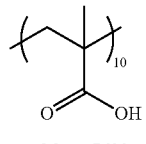
Mw = 7600
Mw/Mn = 1.76
(RA-21)
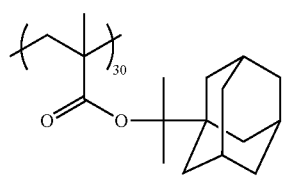
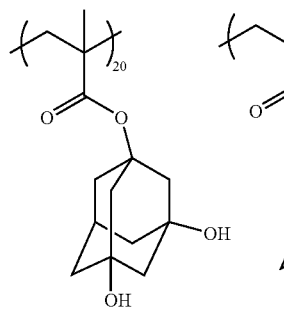
-continued
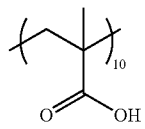
Mw = 12700
Mw/Mn = 1.86
(RA-22)
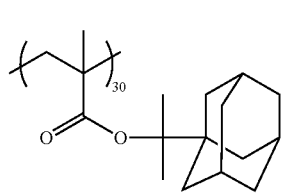
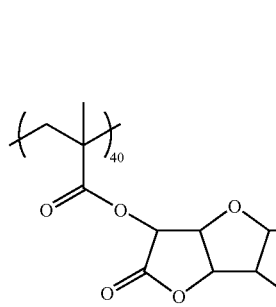
Mw = 8200
Mw/Mn = 1.75
(RA-23)
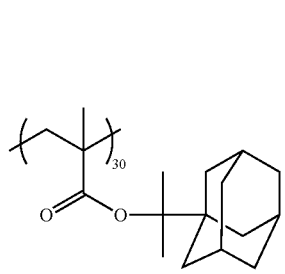
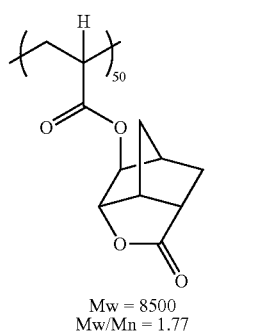
Mw = 8500
Mw/Mn = 1.77
(RA-24)
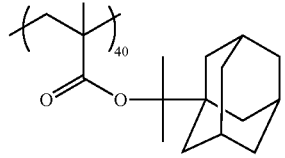

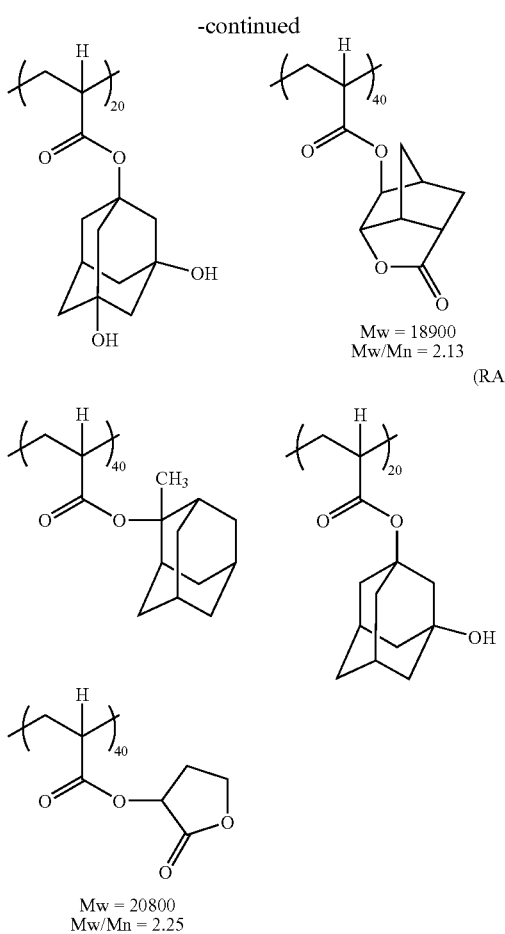

Examples 1 to 17 and Comparative Examples 1 to 3

<Preparation of Resist>

The components shown in Table 1 below were dissolved in a solvent to prepared a solution having a solid content concentration of 12 mass %; and this solution was filtered through a 0.1-μm polytetrafluoroethylene filter or polyethylene filter to prepare a positive resist solution. The positive resist solution prepared was evaluated by the following methods. The results obtained are shown in Table 1.

<Evaluation of Resist>

On a silicon substrate treated with hexamethyldisilazane, an antireflection film DUV-42 produced by Brewer Science Co., Ltd. was uniformly coated by a spin coater to a thickness of 600 Å, dried on a hot plate at 100° C. for 90 seconds and then dried under heating at 190° C. for 240 seconds. Thereafter, each positive resist solution was coated by a spin coater and dried at 120° C. for 90 seconds to form a resist film of 0.25 μm.

The formed resist film was exposed by an ArF excimer laser stepper (manufactured by ISI, NA=0.6) through a mask and immediately after the exposure, heated on a hot plate at 120° C. for 90 seconds. Thereafter, the resist film was developed with an aqueous 2.38 mass % tetramethylammonium hydroxide solution at 23° C. for 60 seconds, rinsed with pure water for 30 seconds and dried to obtain a line pattern.

The sensitivity was defined as the minimum irradiation energy necessary for resolving a 0.13-μm line (line:space=1:1).

Exposure Latitude:

Defining the optimal exposure amount as the exposure amount for reproducing a line-and-space mask pattern with a line width of 90 nm, the exposure amount width allowing for a pattern size of 90 nm±10% on varying the exposure amount was determined, and this value was divided by the optimal exposure amount and expressed in percentage. As the value is larger, the fluctuation in performance due to change of exposure amount is smaller and the exposure latitude is better.

Pattern Profile:

The profile at the optimal exposure amount was observed by a scanning electron microscope (SEM).

Pitch Dependency

The line width of an isolated pattern (line/space=1/10) at the exposure amount for reproducing a mask pattern of a 130-nm dense pattern (line/space=1/1) was evaluated and expressed by the difference (nm) from 130 nm. As the value is smaller, the difference in performance between the dense pattern and the isolated pattern is smaller and the pitch dependency is better.

TABLE 1

(ArF, positive)

| | Acid Generator | g | Acid Generator Used in Combination | g | Resin, 10 g | Basic Compound | g | Surfactant, 0.03 g |
|---|---|---|---|---|---|---|---|---|
| Example 1 | A-1 | 0.2 | z38 | 0.3 | RA-20 | PEA/TPA | 0.01/0.02 | W-4 |
| Example 2 | A-2 | 0.2 | z60 | 0.3 | RA-20 | PEA/DIA | 0.01/0.02 | W-4 |
| Example 3 | A-4 | 0.2 | z14 | 0.3 | RA-22 | DIA | 0.03 | W-1 |
| Example 4 | A-10 | 0.2 | z59 | 0.3 | RA-7 | PEA | 0.03 | W-2 |
| Example 5 | A-12 | 0.3 | z59 | 0.4 | RA-19 | PEA/DIA | 0.02/0.02 | W-4 |
| Example 6 | A-15 | 0.2 | z58 | 0.2 | RA-7 | TMEA | 0.02 | W-2 |
| Example 7 | A-21 | 0.2 | z61 | 0.4 | RA-4 | PEA | 0.03 | W-4 |
| Example 8 | A-23 | 0.2 | z63 | 0.4 | RA-6 | PEA | 0.02 | W-4 |
| Example 9 | A-1 | 0.2 | z58 | 0.3 | RA-22 | PEA | 0.02 | W-4 |
| Example 10 | A-28 | 0.2 | z60 | 0.3 | RA-1 | PEA/DIA | 0.01/0.02 | W-4 |
| Example 11 | A-29 | 0.3 | z38 | 0.3 | RA-22 | DIA | 0.02 | W-2 |
| Example 12 | A-31 | 0.3 | z38 | 0.3 | RA-21 | DIA | 0.02 | W-4 |
| Example 13 | A-39 | 0.2 | z61 | 0.3 | RA-25 | TMEA | 0.02 | W-4 |
| Example 14 | A-48 | 0.2 | z14 | 0.3 | RA-8 | PEA | 0.02 | W-2 |
| Example 15 | A-35 | 0.2 | z58 | 0.3 | RA-23 | DIA | 0.02 | W-4 |
| Example 16 | A-36 | 0.2 | z50 | 0.3 | RA-24 | PEA/DIA | 0.01/0.02 | W-1 |

TABLE 1-continued (ArF, positive)

| | | | | | | | |
|---|---|---|---|---|---|---|---|
| Example 17 | A-40 | 0.3 | z38 | 0.3 RA-21 | DIA | 0.02 | W-4 |
| Comparative Example 1 | TPSB | 0.3 | z38 | 0.2 RA-1 | PEA/DIA | 0.01/0.02 | W-1 |
| Comparative Example 2 | TPSPB | 0.3 | z14 | 0.3 RA-4 | DAI | 0.02 | W-4 |
| Comparative Example 3 | TPSPFBSI | 0.4 | z38 | 0.3 RA-6 | PEA | 0.02 | W-4 |

| | Solvent | Ratio by Mass | Exposure Latitude (%) | Pitch dependency (nm) | Pattern Profile | Sensitivity (mJ/cm$^2$) |
|---|---|---|---|---|---|---|
| Example 1 | A1/B1 | 60/40 | 17.6 | 19.9 | rectangular | 12.1 |
| Example 2 | A1/B1 | 70/30 | 18.2 | 18.3 | rectangular | 10.5 |
| Example 3 | A1/B1 | 60/40 | 16.9 | 18.6 | rectangular | 9.8 |
| Example 4 | A1/B1 | 60/40 | 18.4 | 26.1 | rectangular | 11.4 |
| Example 5 | A1/B1 | 80/20 | 17.5 | 20.7 | rectangular | 8.2 |
| Example 6 | A1/A4 | 80/20 | 14.8 | 21.5 | rectangular | 7.6 |
| Example 7 | A1/B1 | 60/40 | 17.7 | 24.2 | rectangular | 9.1 |
| Example 8 | A1/A3 | 80/20 | 16.0 | 18.3 | rectangular | 8.4 |
| Example 9 | A1/B1 | 60/40 | 16.5 | 21.9 | rectangular | 7.6 |
| Example 10 | A1/A4 | 80/20 | 15.3 | 24.9 | rectangular | 6.9 |
| Example 11 | A1/B1 | 60/40 | 16.7 | 21.2 | rectangular | 7.7 |
| Example 12 | A1/B2 | 70/30 | 14.6 | 20.1 | rectangular | 9.0 |
| Example 13 | A1/A3 | 60./40 | 18.2 | 23.1 | rectangular | 15.1 |
| Example 14 | A1/B1 | 60/40 | 15.1 | 18.7 | rectangular | 15.9 |
| Example 15 | A1/A3 | 80/20 | 18.1 | 22.5 | rectangular | 17.2 |
| Example 16 | A1/B1 | 80/20 | 18.9 | 21.0 | rectangular | 16.8 |
| Example 17 | A1/B1 | 60/40 | 16.2 | 23.0 | rectangular | 16.6 |
| Comparative Example 1 | A1/B1 | 60/40 | 7.3 | 40.1 | tapered | 10.2 |
| Comparative Example 2 | A1/A3 | 60/40 | 7.0 | 35.2 | tapered | 11.1 |
| Comparative Example 3 | A1/B1 | 60/40 | 8.9 | 44.4 | tapered | 12.6 |

Abbreviations common in respective Tables are shown together below.

[Acid Generator]
Abbreviations of the acid generators used in Comparative Examples are as follows.
TPSH: triphenylsulfonium hexadecanesulfonate

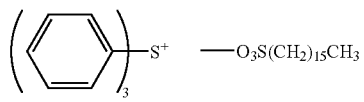

TPSB: triphenylsulfonium pentafluorobenzenesulfonate

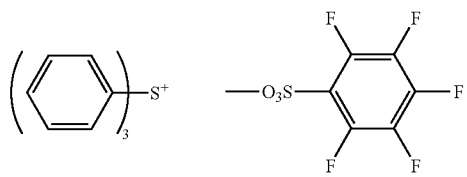

TPSPB: triphenylsulfonium perfluorobutanesulfonate

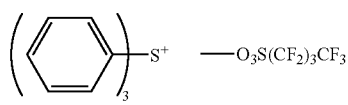

[Basic Compound]
TPI: 2,4,5-triphenylimidazole
TPSA: triphenylsulfonium acetate
HEP: N-hydroxyethylpiperidine
DIA: 2,6-diisopropylaniline
DCMA: dicyclohexylmethylamine
TPA: tripentylamine
HAP: hydroxyantipyrine
TBAH: tetrabutylammonium hydroxide
TMEA: tris(methoxyethoxyethyl)amine
PEN: N-phenyldiethanolamine
TOA: trioctylamine
DBN: 1,5-diazabicyclo[4.3.0]non-5-ene

[Surfactant]
W-1: Megafac F176 (produced by Dainipnon Ink & Chemicals, Inc.) (fluorine-containing)
W-2: Megafac R08 (produced by Dainippon Ink & Chemicals, Inc.) (fluorine- and silicon-containing)
W-3: polysiloxane polymer KP-341 (produced by Shin-Etsu Chemical Co., Ltd.) (silicon-containing)
W-4: Troysol S-366 (produced by Troy Chemical)

[Solvent]
A1: propylene glycol monomethyl ether acetate
A2: 2-heptanone
A3: cyclohexanone
A4: γ-butyrolactone
B1: propylene glycol methyl ether
B2: ethyl lactate
[Dissolution Inhibiting Compound]
LCB: tert-butyl lithocholate As apparent from the results in Table 1, the photosensitive composition of the present invention exhibits excellent property in exposure latitude, pattern profile and pitch dependency at the ArF exposure.

In Examples 1' and 2', the acid generator of Examples 1 and 2 was changed to A-32 (0.2 g). The resolution of these compositions and the compositions of Examples 1 and 2 was verified. The resolution was defined as the minimum dimension (nm) of a resist pattern resolved with the minimum irradiation energy in the evaluation of sensitivity above.

As a result, the resolutions of Examples 1, 2, 1' and 2' were 95 nm, 100 nm, 126 nm and 135 nm, respectively.

[Evaluation of Immersion Exposure]

<Preparation of Resist>

The components of each of Examples 1 to 17 shown in Table 1 were dissolved in a solvent to prepare a solution having a solid content concentration of 8 mass %, and this solution was filtered through a 0.1-μm polyethylene filter to prepare a positive resist solution. The prepared positive resist solutions were evaluated by the following methods.

<Evaluation of Resolution>

An organic antireflection film ARC29A (produced by Nissan Chemical Industries, Ltd.) was coated on a silicon wafer and baked at 205° C. for 60 seconds to form a 78-nm antireflection film. On this film, the resist composition prepared was coated and baked at 115° C. for 60 seconds to form a 150-nm resist film. The thus-obtained wafer was subjected to two-beam interference exposure (wet exposure) by using pure water as the immersion solution. In the two-beam interference exposure (wet exposure), as shown in FIG. 1, the wafer 10 with an antireflection film and a resist film was exposed through a prism 8 and an immersion solution (pure water) 9 by using a laser 1, a diaphragm 2, a shutter 3, three reflecting mirrors 4, 5 and 6, and a condenser lens 7. The wavelength of the laser 1 used was 193 nm, and a prism of forming a 65-nm line-and-space pattern 8 was used. Immediately after the exposure, the resist film was heated at 120° C. for 60 seconds, then developed with an aqueous tetramethylammonium hydroxide solution (2.38%) for 60 seconds and after rinsing with pure water, spin-dried. The obtained resist pattern was observed by a scanning electron microscope (S-9260, manufactured by Hitachi Ltd.), as a result, a 65-nm line-and-space pattern was resolved.

The compositions of Examples 1 to 17 were found to exhibit good image-forming capability even in the exposure method through an immersion solution.

Examples 18 to 23 and Comparative Examples 4 to 7

(1) Formation of Lower Resist Layer

FHi-028DD Resist (resist for i-line, produced by Fujifilm Olin Co., Ltd.) was coated on a 6-inch silicon wafer by using a spin coater, Mark 8, manufactured by Tokyo Electron Ltd. and then baked at 90° C. for 90 seconds to obtain a uniform film having a thickness of 0.55 μm.

This film was further heated at 200° C. for 3 minutes to form a lower resist layer having a thickness of 0.40 μm.

(2) Formation of Upper Resist Layer

The components shown in Table 2 below were dissolved in a solvent to prepare a solution having a solid content concentration of 11 mass %, and this solution was microfiltered through a membrane filter having a pore size of 0.1 μm to prepare an upper resist composition.

The prepared upper resist composition was coated on the lower resist layer in the same manner and heated at 130° C. for 90 seconds to form an upper resist layer having a thickness of 0.20 μm.

Resins (SI-1) to (SI-5) in Table 2 are shown below.

-continued

| | | Molecular Weight |
|---|---|---|
| (SI-4) | [chemical structure] | 8,900 |
| (SI-5) | [chemical structure] | 10,800 |

(3) Evaluation of Resist

The wafer obtained above was exposed by an ArF excimer stepper 9300 (manufactured by ISI) having mounted thereon a resolution mask, while changing the exposure amount.

Subsequently, the wafer was heated at 120° C. for 90 seconds, developed with a tetrahydroammonium hydroxide developer (2.38 mass %) for 60 seconds, rinsed with distilled water and dried to obtain an upper layer pattern. The exposure latitude, pattern profile and pitch dependency were evaluated in the same manner as in Example 1.

The results obtained are shown in Table 2.

TABLE 2

(silicon-containing positive)

| | Acid Generator | G | Acid Generator Used in Combination | g | Resin, 10 g | Basic Compound | g | Surfactant, 0.03 g |
|---|---|---|---|---|---|---|---|---|
| Example 18 | A-1 | 0.2 | z38 | 0.3 | SI-1 | PEA | 0.02 | W-4 |
| Example 19 | A-35 | 0.15 | z14 | 0.2 | SI-2 | TMEA | 0.02 | W-3 |
| Example 20 | A-36 | 0.2 | z61 | 0.3 | SI-4 | PEA | 0.02 | W-1 |
| Example 21 | A-4 | 0.3 | z60 | 0.3 | SI-3 | TPA | 0.02 | W-4 |
| Example 22 | A-15 | 0.3 | z59 | 0.2 | SI-1 | DIA | 0.025 | W-2 |
| Example 23 | A-21 | 0.15 | z64 | 0.3 | SI-5 | PEA | 0.02 | W-4 |
| Comparative Example 4 | TPSB | 0.3 | z61 | 0.2 | SI-1 | PEA/DIA | 0.01/0.02 | W-4 |
| Comparative Example 5 | TPSPB | 0.3 | z36 | 0.3 | SI-2 | TPA | 0.02 | W-2 |
| Comparative Example 6 | TPSPP | 0.3 | z38 | 0.3 | SI-1 | PEA | 0.02 | W-4 |
| Comparative Example 7 | TPSPFBSI | 0.4 | z38 | 0.3 | SI-5 | DIA | 0.02 | W-4 |

| | Solvent | Ratio by Mass | Exposure Latitude (%) | Pitch dependency (nm) | Pattern Profile | Sensitivity (mJ/cm$^2$) |
|---|---|---|---|---|---|---|
| Example 18 | A1/A3 | 60/40 | 18.0 | 22.5 | rectangular | 9.1 |
| Example 19 | A1 | 80/20 | 17.1 | 22.3 | rectangular | 16.1 |
| Example 20 | A1/A3 | 90/10 | 16.1 | 22.1 | rectangular | 16.3 |
| Example 21 | A1/A3 | 100 | 15.6 | 25.9 | rectangular | 7.8 |
| Example 22 | A1/A3 | 80/20 | 16.8 | 23.6 | rectangular | 8.4 |

TABLE 2-continued (silicon-containing positive)

| | | | | | | |
|---|---|---|---|---|---|---|
| Example 23 | A1/A3 | 60/40 | 16.5 | 26.8 | rectangular | 8.6 |
| Comparative Example 4 | A1/A3 | 60/40 | 9.5 | 43.5 | tapered | 10.6 |
| Comparative Example 5 | A1/A3 | 60/40 | 8.9 | 36.5 | tapered | 11.7 |
| Comparative Example 6 | A1/A3 | 60/40 | 7.7 | 34.5 | rectangular | 9.9 |
| Comparative Example 7 | A1/A4 | 60/40 | 10.1 | 35.5 | tapered | 10.8 |

As apparent from the results in Table 2, the photosensitive composition of the present invention exhibits excellent property in exposure latitude, pattern profile and pitch dependency even when used as a two-layer resist.

Examples 24 to 29 and Comparative Examples 8 to 11

<Preparation of Resist>

The components shown in Table 3 below were dissolved in a solvent, and the resulting solution was filtered through a 0.1-μm polytetrafluoroethylene filter to prepare a positive resist solution having a solid content concentration of 14 mass %.

<Evaluation of Resist>

On a silicon substrate treated with hexamethyldisilazane, the prepared positive resist solution was uniformly coated by a spin coater and dried under heating on a hot plate at 120° C. for 90 seconds to form a resist film having a thickness of 0.4 μm.

The obtained resist film was exposed through a mask for a line-and-space pattern by using a KrF excimer laser stepper (NA=0.63) and immediately after the exposure, heated on a hot plate at 110° C. for 90 seconds. Thereafter, the resist film was developed with an aqueous 2.38 mass % tetramethylammonium hydroxide solution at 23° C. for 60 seconds, rinsed with pure water for 30 seconds and then dried to form a line pattern. Thee exposure latitude, pattern profile and pitch dependency were evaluated in the same manner as in Example 1.

The evaluation results are shown in Table 3.

TABLE 3

(KrF, positive)

| | Acid Generator | g | Acid Generator Used in Combination | g | Resin, 10 g | Basic Compound | g | Surfactant, 0.03 g |
|---|---|---|---|---|---|---|---|---|
| Example 24 | A-1 | 0.18 | z38 | 0.3 | SI-1 | DIA | 0.02 | W-4 |
| Example 25 | A-35 | 0.15 | z14 | 0.3 | SI-2 | TMEA | 0.03 | W-4 |
| Example 26 | A-36 | 0.2 | z61 | 0.2 | SI-3 | DIA | 0.02 | W-1 |
| Example 27 | A-4 | 0.2 | z60 | 0.3 | SI-4 | PEA/DIA | 0.02 | W-2 |
| Example 28 | A-15 | 0.2 | z59 | 0.4 | SI-1 | TPA | 0.04 | W-1 |
| Example 29 | A-21 | 0.2 | z64 | 0.2 | SI-5 | PEA | 0.01/0.02 | W-4 |
| Comparative Example 8 | TPSB | 0.3 | z61 | 0.4 | SI-1 | PEA/DIA | 0.01/0.02 | W-4 |
| Comparative Example 9 | TPSPB | 0.2 | z14 | 0.3 | SI-1 | PEA | 0.02 | W-1 |
| Comparative Example 10 | TPSPP | 0.2 | z38 | 0.3 | SI-3 | PEA | 0.02 | W-4 |
| Comparative Example 11 | TPSPFBSI | 0.2 | z38 | 0.3 | SI-5 | DIA | 0.02 | W-4 |

| | Solvent | Ratio by Mass | Exposure Latitude (%) | Pitch dependency (nm) | Pattern Profile | Sensitivity (mJ/cm$^2$) |
|---|---|---|---|---|---|---|
| Example 24 | A1/B1 | 60/40 | 13.9 | 19.5 | rectangular | 12.3 |
| Example 25 | A1/A3 | 90/10 | 15.7 | 20.5 | rectangular | 15.3 |
| Example 26 | A1/B1 | 60/40 | 14.7 | 25.0 | rectangular | 17.3 |
| Example 27 | A1/B1 | 60/40 | 13.4 | 23.5 | rectangular | 11.5 |
| Example 28 | A1/A3 | 80/20 | 12.6 | 21.0 | rectangular | 10.6 |
| Example 29 | A1/B1 | 60/40 | 14.5 | 25.5 | rectangular | 9.8 |
| Comparative Example 8 | A1/A3 | 60/40 | 9.2 | 31.5 | tapered | 11.6 |
| Comparative Example 9 | A1/A4 | 70/30 | 8.8 | 38.0 | tapered | 10.1 |
| Comparative Example 10 | A1/B1 | 60/40 | 8.6 | 36.0 | tapered | 9.3 |
| Comparative Example 11 | A1/A4 | 60/40 | 9.9 | 39.0 | tapered | 10.2 |

The weight average molecular weight and dispersity of each of Resins (R-1) to (R-5) used in Table 3 are shown in Table 4 below.

The prepared negative resist solutions were evaluated in the same manner as in Example 24. The results obtained are shown in Table 5.

TABLE 5

(KrF, negative)

| | Acid Generator | g | Acid Generator Used in Combination | g | Resin, 10 g | Basic Compound | g | Surfactant, 0.03 g |
|---|---|---|---|---|---|---|---|---|
| Example 30 | A-1 | 0.18 | z38 | 0.3 | SI-1 | h | 0.02 | W-4 |
| Example 31 | A-35 | 0.15 | z14 | 0.3 | SI-2 | DIA | 0.02 | W-3 |
| Example 32 | A-36 | 0.2 | z61 | 0.2 | SI-2 | PEA/DIA | 0.01/0.02 | W-4 |
| Example 33 | A-4 | 0.2 | z60 | 0.3 | SI-3 | TPA | 0.02 | W-2 |
| Example 34 | A-15 | 0.2 | z28 | 0.4 | SI-1 | PEA | 0.02 | W-2 |
| Example 35 | A-21 | 0.2 | z64 | 0.2 | SI-1 | TMEA | 0.02 | W-4 |
| Comparative Example 12 | TPSB | 0.15 | z14 | 0.2 | SI-1 | PEA | 0.02 | W-1 |
| Comparative Example 13 | TPSPB | 0.3 | z38 | 0.4 | SI-1 | DIA | 0.02 | W-4 |
| Comparative Example 14 | TPSPP | 0.3 | z59 | 0.5 | SI-3 | PEA/DIA | 0.01/0.02 | W-4 |
| Comparative Example 15 | TPSPFBSI | 0.2 | z38 | 0.3 | SI-3 | DIA | 0.02 | W-4 |

| | Solvent | Ratio by Mass | Crosslinking Agent (g) | Exposure Latitude (%) | Pitch dependency (nm) | Pattern Profile | Sensitivity (mJ/cm$^2$) |
|---|---|---|---|---|---|---|---|
| Example 30 | A1/B1 | 60/40 | CL-1(3) | 14.8 | 21.5 | rectangular | 9.4 |
| Example 31 | A1/A3 | 60/40 | CL-1(2) | 16.9 | 25.5 | rectangular | 10.5 |
| Example 32 | A1/A3 | 80/20 | CL-1(2) | 18.0 | 26.5 | rectangular | 11.3 |
| Example 33 | A1/B1 | 60/40 | CL-4(4) | 13.4 | 20.5 | rectangular | 16.1 |
| Example 34 | A1/B1 | 75/25 | CL-2(4) | 17.1 | 19.5 | rectangular | 14.3 |
| Example 35 | A1/B1 | 60/40 | CL-3(2) | 16.4 | 23.5 | rectangular | 17.0 |
| Comparative Example 12 | A1/A3 | 60/40 | CL-5(2) | 9.4 | 40.5 | taper | 10.4 |
| Comparative Example 13 | A1/A4 | 80/20 | CL-1(2) | 10.9 | 46.5 | taper | 10.0 |
| Comparative Example 14 | A1/A4 | 60/40 | CL-5(2) | 10.1 | 44.0 | taper | 9.9 |
| Comparative Example 15 | A1/B1 | 70/30 | CL-1(2) | 11.2 | 34.5 | taper | 12.8 |

TABLE 4

| Resin | Weight Average Molecular Weight | Dispersity (Mw/Mn) |
|---|---|---|
| R-1 | 13000 | 1.2 |
| R-2 | 11000 | 1.7 |
| R-3 | 13000 | 1.2 |
| R-4 | 10000 | 1.8 |
| R-5 | 11000 | 1.8 |

As apparent from the results in Table 3, the photosensitive composition of the present invention exhibits excellent property in exposure latitude, pattern profile and pitch dependency even when used as a positive resist composition for exposure with a KrF excimer laser.

Examples 30 to 35 and Comparative Examples 12 to 15

<Preparation of Resist>

The components shown in Table 5 below were dissolved in a solvent, and the resulting solution was filtered through a 0.1-μm polytetrafluoroethylene filter to prepare a negative resist solution having a solid content concentration of 14 mass %.

The structure, molecular weight and molecular weight distribution of each alkali-soluble resin in Table 5 are shown below.

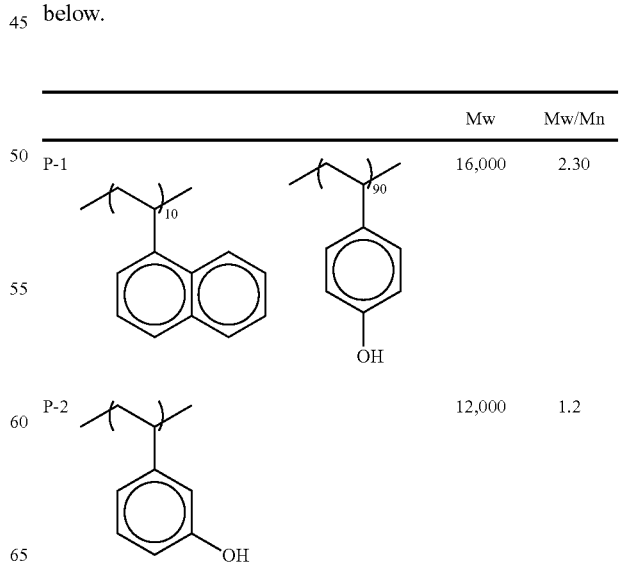

-continued

|  | Mw | Mw/Mn |
|---|---|---|
| P-3 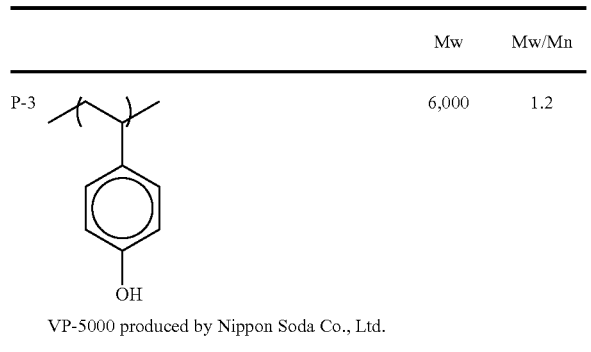 | 6,000 | 1.2 |
| VP-5000 produced by Nippon Soda Co., Ltd. | | |

CL-1

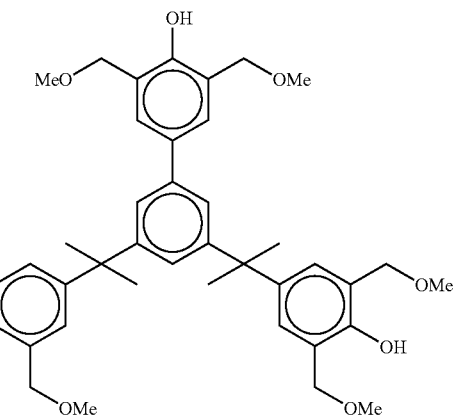

CL-2

CL-3

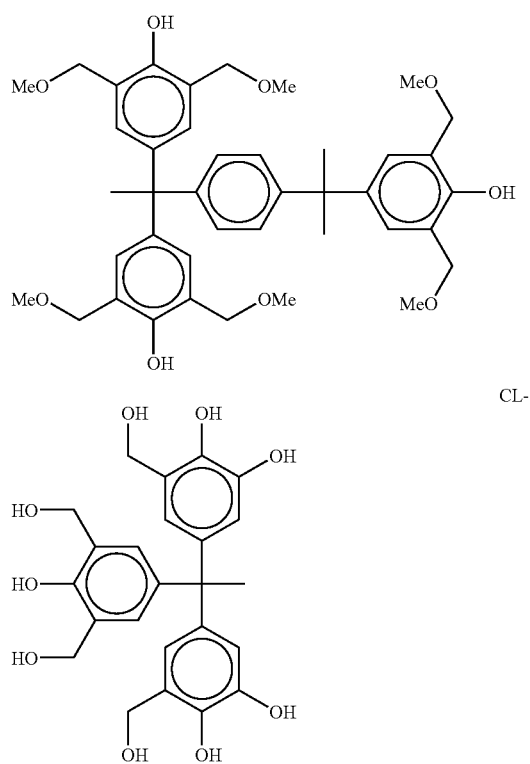

CL-4

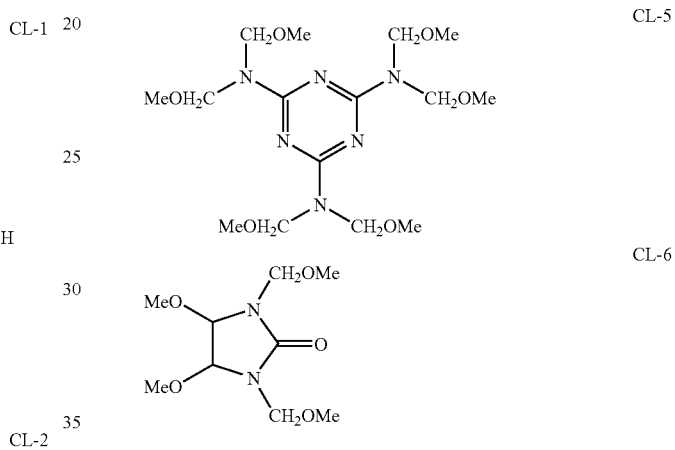

CL-5

CL-6

As apparent from the results in Table 5, the photosensitive composition of the present invention exhibits excellent property in exposure latitude, pattern profile and pitch dependency even when used as a negative resist composition for exposure with a KrF excimer laser.

Examples 36 to 41 and Comparative Examples 16 to 19

<Preparation of Resist>

The components shown in Table 3 were dissolved in a solvent, and the resulting solution was filtered through a 0.1-μm polytetrafluoroethylene filter to prepare a positive resist solution having a solid content concentration of 12 mass %.

<Evaluation of Resist>

On a silicon substrate treated with hexamethyldisilazane, the prepared positive resist solution was uniformly coated by a spin coater and dried under heating on a hot plate at 120° C. for 60 seconds to form a resist film having a thickness of 0.3 μm.

The obtained resist film was irradiated by an electron beam projection lithography apparatus manufactured by Nikon Corp. (accelerating voltage: 100 KeV) and immediately after the irradiation, heated on a hot plate at 110° C. for 90 seconds. Thereafter, the resist film was developed with an aqueous tetramethylammonium hydroxide solution having a concentration of 2.38 mass % at 23° C. for 60 seconds, rinsed with pure water for 30 seconds and then dried to form a line-andspace pattern. The exposure latitude, pattern profile and pitch dependency were evaluated in the same manner as in Example 1.

The evaluation results are shown in Table 6.

TABLE 6

| | (EB, positive) | | | |
|---|---|---|---|---|
| | Exposure Latitude (%) | Pitch dependency (nm) | Pattern Profile | Sensitivity (mJ/cm$^2$) |
| Example 36 | 14.4 | 21.5 | rectangular | 10.2 |
| Example 37 | 13.4 | 17.0 | rectangular | 17.3 |
| Example 38 | 14.7 | 22.5 | rectangular | 16.9 |
| Example 39 | 14.3 | 18.5 | rectangular | 10.3 |
| Example 40 | 14.5 | 20.0 | rectangular | 11.8 |
| Example 41 | 14.2 | 20.5 | rectangular | 12.5 |
| Comparative Example 16 | 8.9 | 42.5 | tapered | 10.2 |
| Comparative Example 17 | 9.5 | 33.5 | tapered | 9.7 |
| Comparative Example 18 | 8.7 | 37.0 | tapered | 11.8 |
| Comparative Example 19 | 9.4 | 34.5 | tapered | 10.8 |

As apparent from the results in Table 6, the photosensitive composition of the present invention exhibits excellent property in exposure latitude, pattern profile and pitch dependency even when used as a positive resist composition for electron beam irradiation.

Examples 42 to 47 and Comparative Examples 20 to 23

<Preparation of Resist>

The components shown in Table 5 were dissolved in a solvent, and the resulting solution was filtered through a 0.1-μm polytetrafluoroethylene filter to prepare a negative resist solution having a solid content concentration of 12 mass %.

<Evaluation of Resist>

On a silicon substrate treated with hexamethyldisilazane, the prepared negative resist solution was uniformly coated by a spin coater and dried under heating on a hot plate at 120° C. for 60 seconds to form a resist film having a thickness of 0.3 μm.

The obtained resist film was irradiated by an electron beam projection lithography apparatus manufactured by Nikon. Corp. (accelerating voltage: 100 KeV) and immediately after the irradiation, heated on a hot plate at 110° C. for 90 seconds. Thereafter, the resist film was developed with an aqueous tetramethylammonium hydroxide solution having a concentration of 2.38 mass % at 23° C. for 60 seconds, rinsed with pure water for 30 seconds and then dried to form a line-and-space pattern. The exposure latitude, pattern profile and pitch dependency were evaluated in the same manner as in Example 1.

The evaluation results are shown in Table 7.

TABLE 7

| | (EB, negative) | | | |
|---|---|---|---|---|
| | Exposure Latitude (%) | Pitch dependency (nm) | Pattern Profile | Sensitivity (mJ/cm$^2$) |
| Example 42 | 15.5 | 21.5 | rectangular | 10.9 |
| Example 43 | 13.4 | 18.0 | rectangular | 10.6 |
| Example 44 | 13.0 | 19.0 | rectangular | 11.8 |
| Example 45 | 14.4 | 20.0 | rectangular | 17.3 |
| Example 46 | 15.0 | 21.5 | rectangular | 16.9 |
| Example 47 | 15.3 | 24.0 | rectangular | 14.1 |
| Comparative Example 20 | 8.6 | 40.5 | tapered | 11.3 |
| Comparative Example 21 | 9.0 | 44.5 | tapered | 10.7 |
| Comparative Example 22 | 9.3 | 38.0 | tapered | 12.0 |
| Comparative Example 23 | 8.9 | 38.5 | tapered | 9.9 |

As apparent from the results in Table 7, the photosensitive composition of the present invention exhibits excellent property in exposure latitude, pattern profile and pitch dependency even when used as a negative resist composition for electron beam irradiation.

Examples 48 to 53 and Comparative Examples 24 to 27

The components shown in Table 4 were dissolved in a solvent, and the resulting solution was filtered through a 0.1 μm polytetrafluoroethylene filter to prepare a positive resist solution having a solid content concentration of 8 mass %. The evaluation was performed as follows.

<Evaluation of Resist>

On a silicon substrate treated with hexamethyldisilazane, the prepared positive resist solution was uniformly coated by a spin coater and dried under heating on a hot plate at 120° C. for 60 seconds to form a resist film having a thickness of 0.15 μm, The obtained resist film was planarly exposed with EUV light (wavelength: 13 nm) while changing the exposure amount in 0.5-mJ steps in the range from 0 to 10.0 mJ and baked at 110° C. for 90 seconds. Thereafter, the dissolution rate at each exposure amount was measured by using an aqueous 2.38% tetramethylammonium hydroxide (TMAH) solution, and a sensitivity curve was obtained from the measured values. The sensitivity was defined as the exposure amount when the dissolution rate of resist was saturated on the sensitivity curve. Also, the dissolution contrast (γ value) was calculated from the gradient in the straight line part of the sensitivity curve. As the γ value is larger, the dissolution contrast is better.

The evaluation results are shown in Table 8 below.

TABLE 8

| | (EUV) | |
|---|---|---|
| | Sensitivity (mJ/cm$^2$) | γ Value |
| Example 48 | 2.2 | 10.2 |
| Example 49 | 1.9 | 11.2 |
| Example 50 | 2.1 | 9.3 |
| Example 51 | 2.2 | 9.7 |
| Example 52 | 1.7 | 10.7 |
| Example 53 | 2.3 | 10.2 |
| Comparative Example 24 | 3.5 | 8.6 |

TABLE 8-continued (EUV)

| | Sensitivity (mJ/cm²) | γ Value |
|---|---|---|
| Comparative Example 25 | 3.3 | 7.6 |
| Comparative Example 26 | 3.6 | 9.1 |
| Comparative Example 27 | 3.8 | 8.1 |

It is seen from the results in Table 8 that the resist composition of the present invention is excellent by exhibiting high sensitivity and high contract in the characteristic evaluation by the irradiation of EUV light as compared with the compositions of Comparative Examples.

This application is based on Japanese patent application JP 2005-015965, filed on Jan. 24, 2005, the entire content of which is hereby incorporated by reference, the same as if set forth at length.

What is claimed is:

1. A photosensitive composition comprising (A) a compound capable of generating an organic acid having a bond which is cleaved by an acid, upon irradiation with actinic rays or radiation, said generated organic acid having an acid decomposable group, and the bond which is cleaved by an acid being selected from the group consisting of an acetal bond, a carbamoyl bond and a carbonate bond.

2. The photosensitive composition as claimed in claim 1, wherein the organic acid has a structure represented by the following formula (I) upon irradiation with actinic rays or radiation:

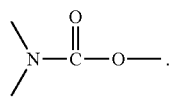
(I)

3. The photosensitive composition as claimed in claim 1, wherein the organic acid is represented by the following formula (II) upon irradiation with actinic rays or radiation:

HO₃S-A-X-B-R    (II)

wherein
A represents a divalent linking group,
X represents a single bond or —SO₂—,
B represents a single bond, an oxygen atom or —N(Rx)-,
Rx represents a hydrogen atom or a monovalent organic group,
R represents a monovalent organic group containing a nitrogen atom, said nitrogen atom being substituted by the following formula (III):

(III)

R' represents a monovalent organic group, and
when B is —N(Rx)-, R and Rx may combine to form a ring.

4. The photosensitive composition as claimed in claim 3, wherein the compound (A) capable of generating an organic acid represented by formula (II) upon irradiation with actinic rays or radiation is a sulfonium salt compound of the formula (A1) wherein X⁻ represents an anion of an organic acid represented by formula (II) or an iodonium salt compound of the formula (A2) wherein X⁻ represents an anion of an organic acid represented by formula (II),

(A1)

(A2)

wherein in formula (A1), R₂₀₁, R₂₀₂ and R₂₀₃ each independently represents an organic group and two of them may combine to form a ring structure which may contain an oxygen atom, a sulfur atom, an ester bond, an amide bond or a carbonyl group;
and wherein in formula (A2), R₂₀₄ and R₂₀₅ each independently represents an aryl group, an alkyl group or a cycloalkyl group.

5. The photosensitive composition as claimed in claim 1, which further comprises (A') a compound capable of generating an acid compound other than the organic acid, upon irradiation with actinic rays or radiation.

6. The photosensitive composition as claimed in claim 5, wherein the compound (A') is a sulfonium salt of fluorine-substituted alkanesulfonic acid, fluorine-substituted benzenesulfonic acid or a fluorine-substituted imide acid.

7. The photosensitive composition as claimed in claim 1, which further comprises (B) a resin capable of decomposing under the action of an acid to increase the solubility in an alkali developer.

8. The photosensitive composition as claimed in claim 7, wherein the resin (B) has a hexafluoroisopropanol structure.

9. The photosensitive composition as claimed in claim 7, wherein the resin (B) has a hydroxystyrene structural unit.

10. The photosensitive composition as claimed in claim 7, wherein the resin (B) has at least one repeating unit selected from 2-alkyl-2-adamantyl (meth)acrylate and dialkyl(1-adamantyl)methyl (meth)acrylate.

11. The photosensitive composition as claimed in claim 7, wherein the resin (B) has a monocyclic or polycyclic alicyclic hydrocarbon structure.

12. The photosensitive composition as claimed in claim 11, wherein the resin (B) further has a repeating unit having a carboxyl group.

13. The photosensitive composition as claimed in claim 7, wherein the resin (B) has a repeating unit having a lactone structure.

14. The photosensitive composition as claimed in claim 1, which further comprises (D) a resin soluble in an alkali developer, and (E) an acid crosslinking agent capable of crosslinking with the resin soluble in an alkali developer under the action of an acid.

15. The photosensitive composition as claimed in claim 1, which further comprises at least one of (F) a basic compound and (G) a fluorine-and/or silicon-containing surfacant.

16. The photosensitive composition as claimed in claim 15, wherein the basic compound (F) is a compound having a structure selected from an imidazole structure, a diazabicyclo structure, an onium hydroxide structure, an onium carboxylate structure, a trialkylamine structure, an aniline structure and a pyridine structure, an alkylamine derivative having a hydroxyl group and/or an ether bond, or an aniline derivative having a hydroxyl group and/or an ether bond.

17. A pattern forming method comprising: forming a resist film from the photosensitive composition claimed in claim 1; and exposing and developing said resist film.

18. An organic acid having a structure represented by the following formula (I) and a salt thereof:

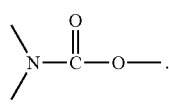
(I)

19. An organic acid represented by the following formula (II) and a salt thereof:

$HO_3S\text{-}A\text{-}X\text{-}B\text{-}R$ (II)

wherein
A represents a divalent linking group,
X represents a single bond or $-SO_2-$,
B represents a single bond, an oxygen atom or $-N(Rx)-$,
Rx represents a hydrogen atom or a monovalent organic group,
R represents a monovalent organic group containing a nitrogen atom, said nitrogen atom being substituted by the following formula (III):

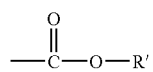
(III)

R' represents a monovalent organic group, and
when B is $-N(Rx)-$, R and Rx may combine to form a ring.

20. A sulfonium salt compound of the formula (A1) wherein $X^-$ represents an anion of an organic acid represented by the following formula (II) or an iodonium salt compound of the formula (A2) wherein $X^-$ represents an anion of an organic acid represented by the following formula (II):

$HO_3S\text{-}A\text{-}X\text{-}B\text{-}R$ (II)

wherein
A represents a divalent linking group,
X represents a single bond or $-SO_2-$,
B represents a single bond, an oxygen atom or $-N(Rx)-$,
Rx represents a hydrogen atom or a monovalent organic group,
R represents a monovalent organic group containing a nitrogen atom, said nitrogen atom being substituted by the following formula (III):

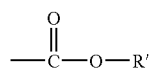
(III)

R' represents a monovalent organic group, and
when B is $-N(Rx)-$, R and Rx may combine to form a ring,

(A1)

(A2)

wherein in formula (A1), $R_{201}$, $R_{202}$ and $R_{203}$ each independently represents an organic group and two of them may combine to form a ring structure which may contain an oxygen atom, a sulfur atom, an ester bond, an amide bond or a carbonyl group;

and wherein in formula (A2), $R_{204}$ and $R_{205}$ each independently represents an aryl group, an alkyl group or a cycloalkyl group.

21. A photosensitive composition comprising:

(A) a compound capable of generating an organic acid having a bond which is cleaved by an acid, upon irradiation with actinic rays or radiation, said generated organic acid having an acid decomposable group, and the bond which is cleaved by an acid being selected from the group consisting of an amino bond, an amido bond, an ester bond, an acetal bond, a carbamoyl bond and a carbonate bond; and (B) a resin capable of decomposing under the action of an acid to increase its solubility in an alkali developer, which has a repeating unit represented by formula (AI):

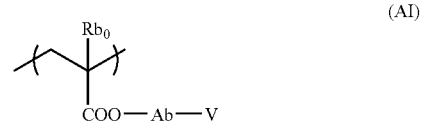
(AI)

wherein $Rb_0$ represents a hydrogen atom, a halogen atom or an alkyl group having a carbon number of 1 to 4; Ab represents an alkylene group, a divalent linking group having a monocyclic or polycyclic alicyclic hydrocarbon structure, a single bond, a linking group represented by $-Ab_1\text{-}CO_2-$, an ether group, an ester group, a carbonyl group, a carboxyl group, or a divalent group comprising a combination thereof;

$Ab_1$ is a linear or branched alkylene group or a monocyclic or polycyclic cycloalkylene group; and V represents a group represented by any one of formulae (LC1-1) to (LC1-16):

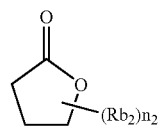
LC1-1

LC1-2 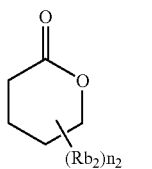

LC1-3 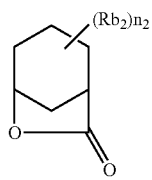

LC1-4 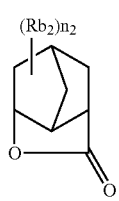

LC1-5 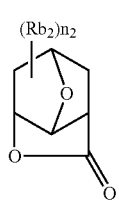

LC1-6 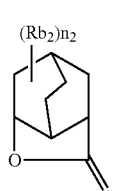

LC1-7 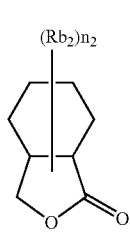

LC1-8 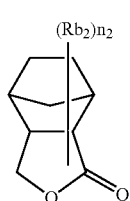

LC1-9 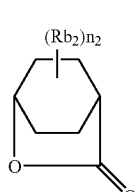

LC1-10 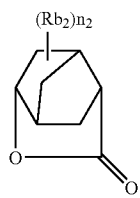

LC1-11 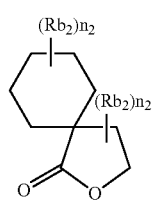

LC1-12 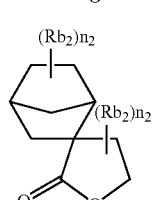

LC1-13 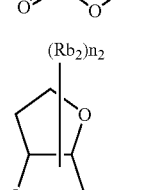

LC1-14 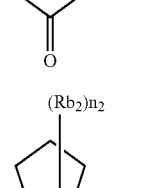

LC1-15 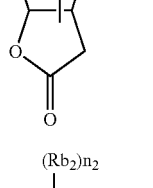

LC1-16 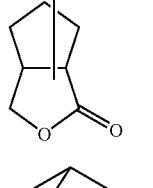

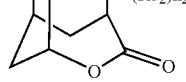

wherein $Rb_2$ represents a substituent selected from the group consisting of an alkyl group having a carbon number of 1 to 8, a cycloalkyl group having a carbon of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group; $n_2$ represents an integer of 0 to 4, and when $n_2$ is an integer of 2 or more, the plurality of $Rb_2$'s may be the same or different, and $Rb_2$'s may combine with each other to form a ring.
22. The photosensitive composition of claim 21, wherein the resin (B) has a repeating unit selected from the group consisting of the following repeating units 4 to 19:
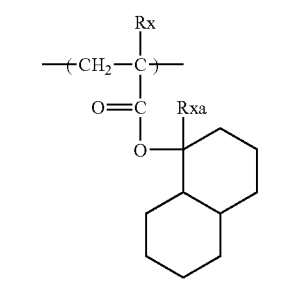
4
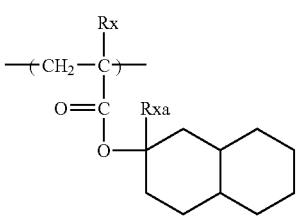
5
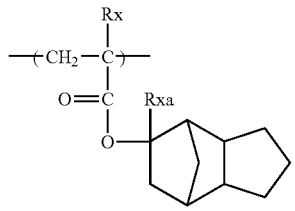
6
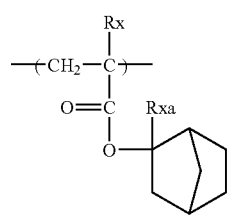
7
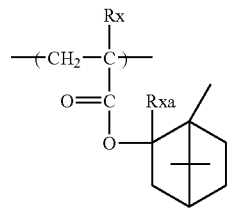
8
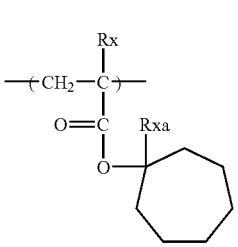
9
-continued
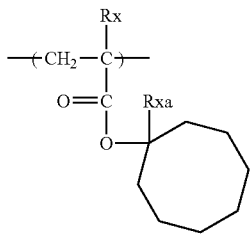
10
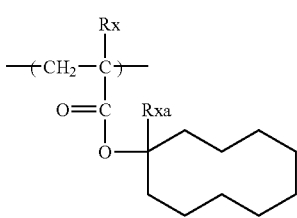
11
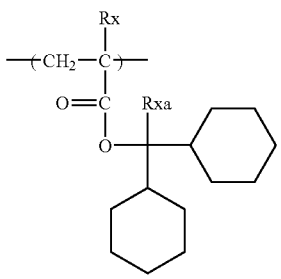
12
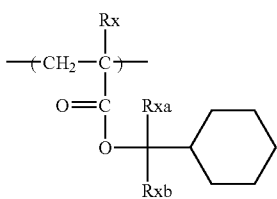
13
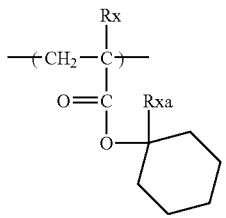
14
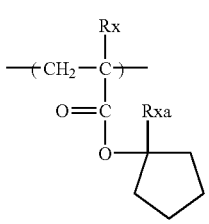
15

-continued

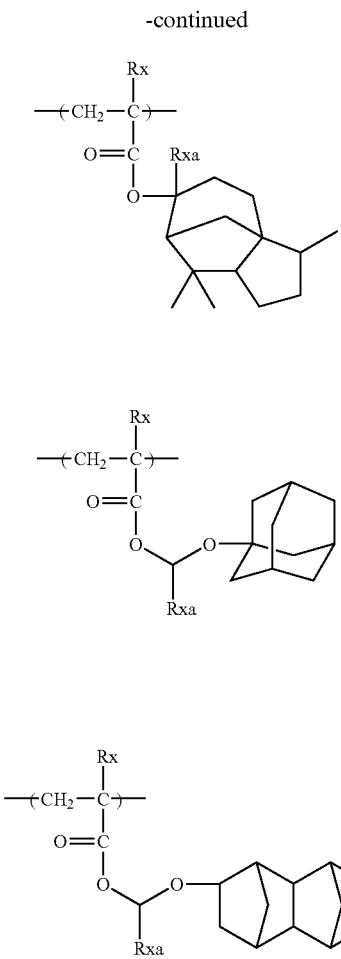

-continued

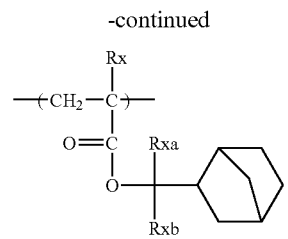

wherein Rx represents H, CH$_3$, or CH$_2$OH, and Rxa and Rxb each independently represents an alkyl group having a carbon number of 1 to 4.

23. The photosensitive composition as claimed in claim 21, which further comprises (A') a compound capable of generating an acid compound other than the organic acid, upon irradiation with actinic rays or radiation; and the compound (A') is a sulfonium salt of fluorine-substituted alkanesulfonic acid, fluorine-substituted benzenesulfonic acid or a fluorine-substituted imide acid.

24. The photosensitive composition as claimed in claim 21, wherein the resin (B) has a hexafluoroisopropanol structure.

25. The photosensitive composition as claimed in claim 21, which further comprises at least one of (F) a basic compound and (G) a fluorine- and/or silicon-containing surfactant.

26. The photosensitive composition as claimed in claim 25, wherein the basic compound (F) is a compound having a structure selected from an imidazole structure, a diazabicyclo structure, an onium hydroxide structure, an onium carboxylate structure, a trialkylamine structure, an aniline structure and a pyridine structure, an alkylamine derivative having a hydroxyl group and/or an ether bond, or an aniline derivative having a hydroxyl group and/or an ether bond.

27. A pattern forming method comprising: forming a resist film from the photosensitive composition claimed in claim 21; and exposing and developing said resist film.

\* \* \* \* \*